United States Patent [19]

Nakajima et al.

[11] Patent Number: 5,510,647
[45] Date of Patent: Apr. 23, 1996

[54] SEMICONDUCTOR DEVICE AND METHOD OF MANUFACTURING THE SAME

[75] Inventors: Hiroomi Nakajima, Urayasu; Yasuhiro Katsumata, Chigasaki; Hiroshi Iwai, Kawasaki; Toshihiko Iinuma, Kawasaki; Kazumi Inou, Yokohama; Mitsuhiko Kitagawa, Tokyo; Kouhei Morizuka, Yokohama; Akio Nakagawa, Hiratsuka; Ichiro Omura, Yokohama, all of Japan

[73] Assignee: Kabushiki Kaisha Toshiba, Kawasaki, Japan

[21] Appl. No.: 213,027

[22] Filed: Mar. 15, 1994

[30] Foreign Application Priority Data

Mar. 15, 1993 [JP] Japan .................................. 5-078628

[51] Int. Cl.⁶ ............................. H01L 29/72; H01L 21/82
[52] U.S. Cl. .......................... 257/559; 257/557; 257/588
[58] Field of Search .................................. 257/559, 557, 257/586, 592, 607, 628, 587, 588

[56] References Cited

U.S. PATENT DOCUMENTS 5,065,210  11/1991  Hirakawa ................................ 257/559

FOREIGN PATENT DOCUMENTS 0068073   1/1983   European Pat. Off. ............... 257/559
4-335534  11/1992  Japan ..................................... 257/559

OTHER PUBLICATIONS

IEDM Tech. Dig., pp. 663–666, 1991, G. G. Shahid, et al., "A Novel High–Performance Lateral Bipolar on SOI".

Primary Examiner—Donald L. Monin, Jr.
Attorney, Agent, or Firm—Oblon, Spivak, McClelland, Maier, & Neustadt

[57] ABSTRACT

A bipolar transistor is formed on a silicon substrate having a silicon oxide film. An n-silicon layer having a top surface of a (100) plane is formed on the silicon oxide film and is used as a collector layer. An end face constituted by a (111) plane is formed on the end portion of the collector layer by etching, using an aqueous KOH solution. A B-doped p-silicon layer is formed on the end face by epitaxial growth and is used as a base layer. Furthermore, an As-doped n-silicon layer is formed on the base layer and is used as an emitter layer. Electrodes are respectively connected to the collector, base, and emitter layers.

6 Claims, 49 Drawing Sheets

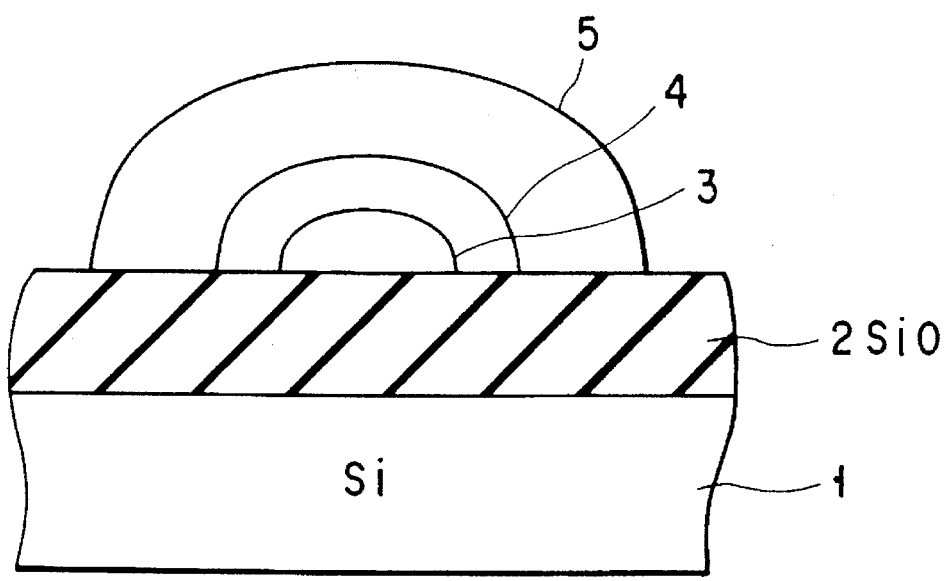
F I G. 2A
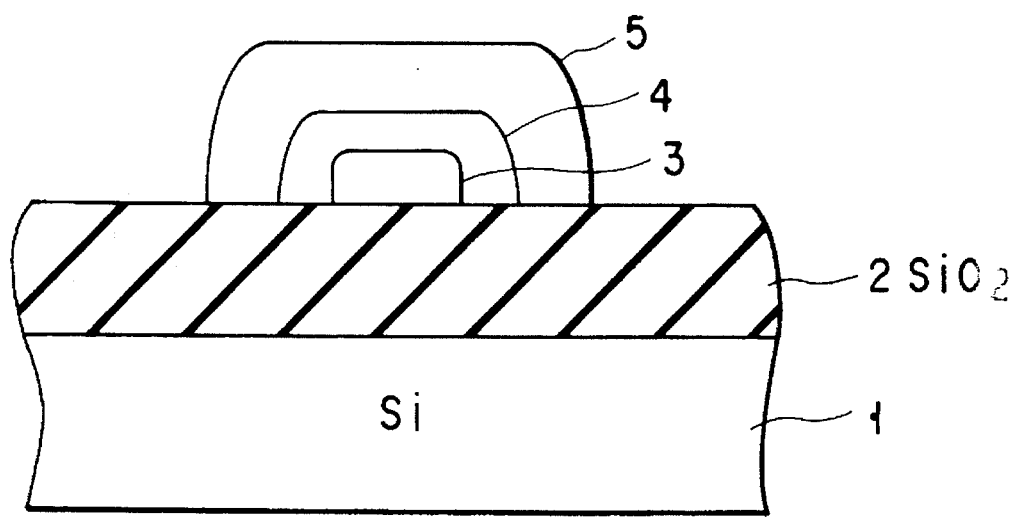
F I G. 2B

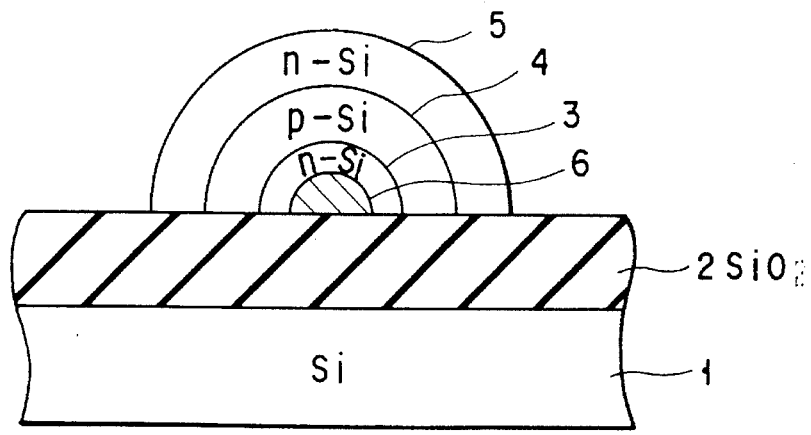
F I G. 3A
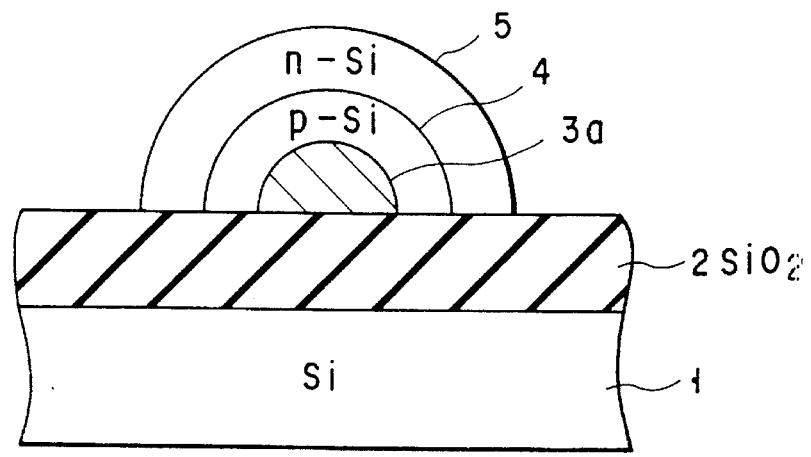
F I G. 3B
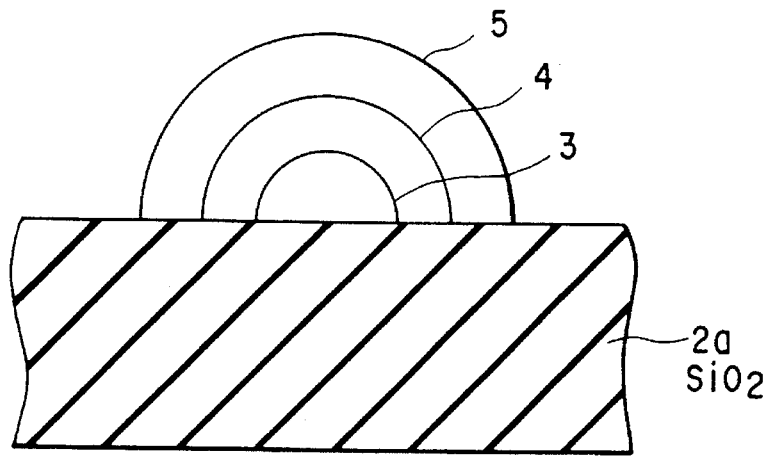
F I G. 3C

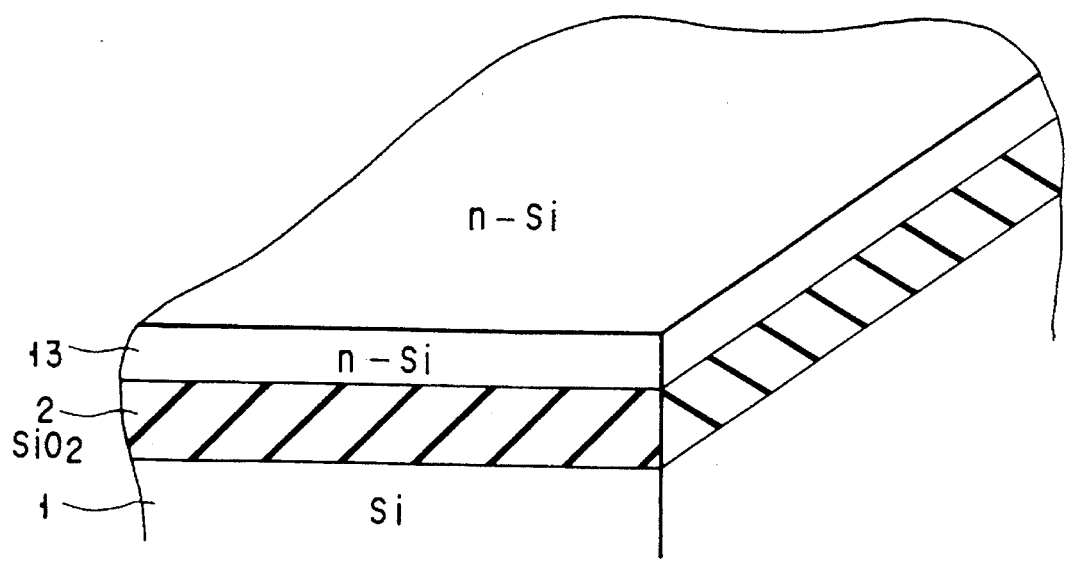
F I G. 4A
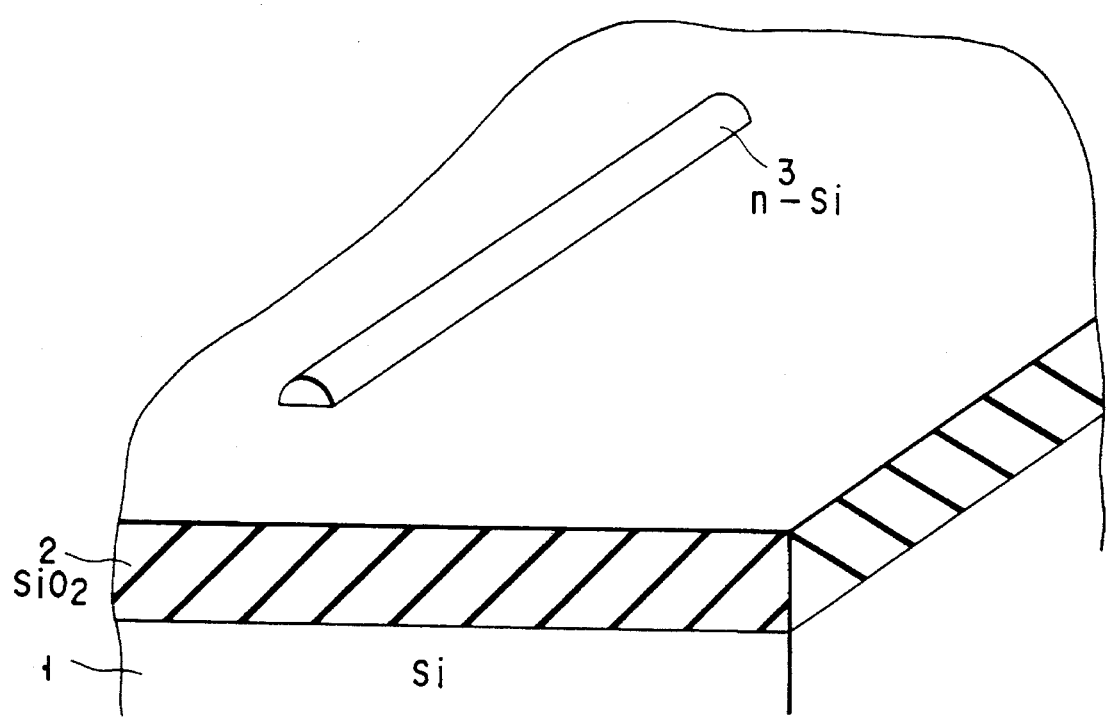
F I G. 4B

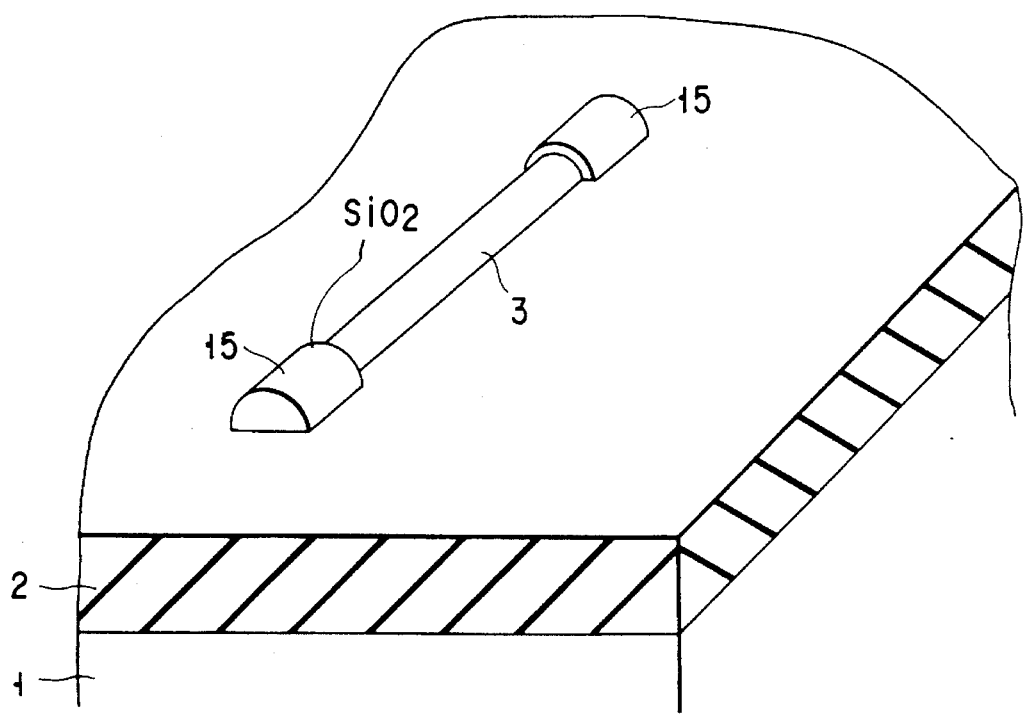
F I G. 4C
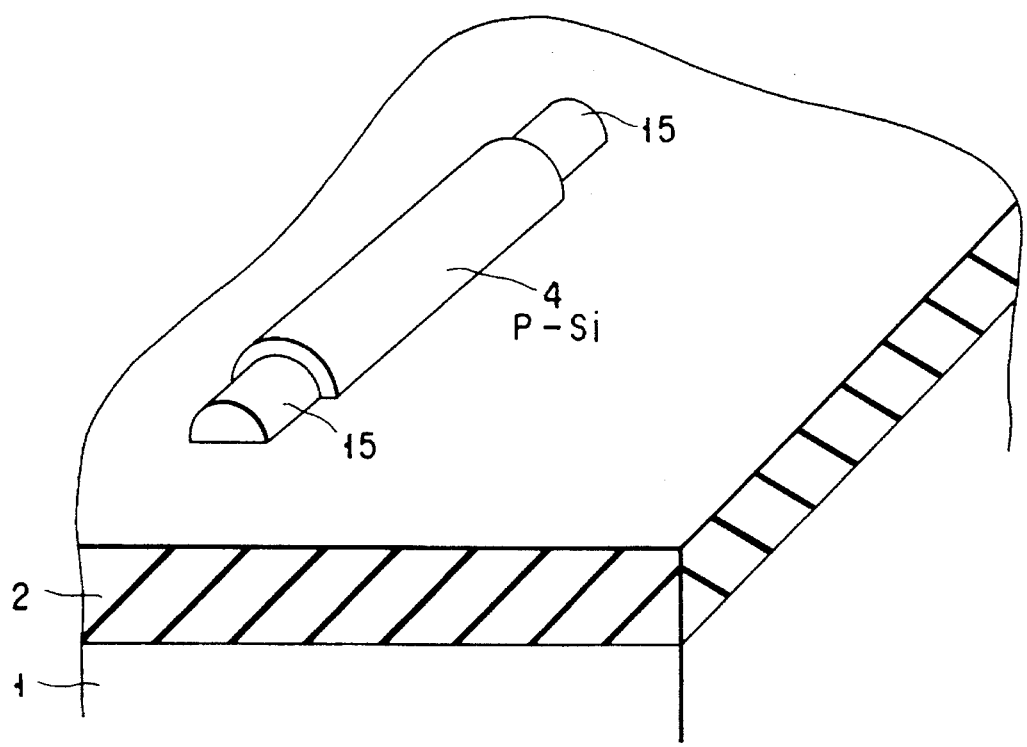
F I G. 4D

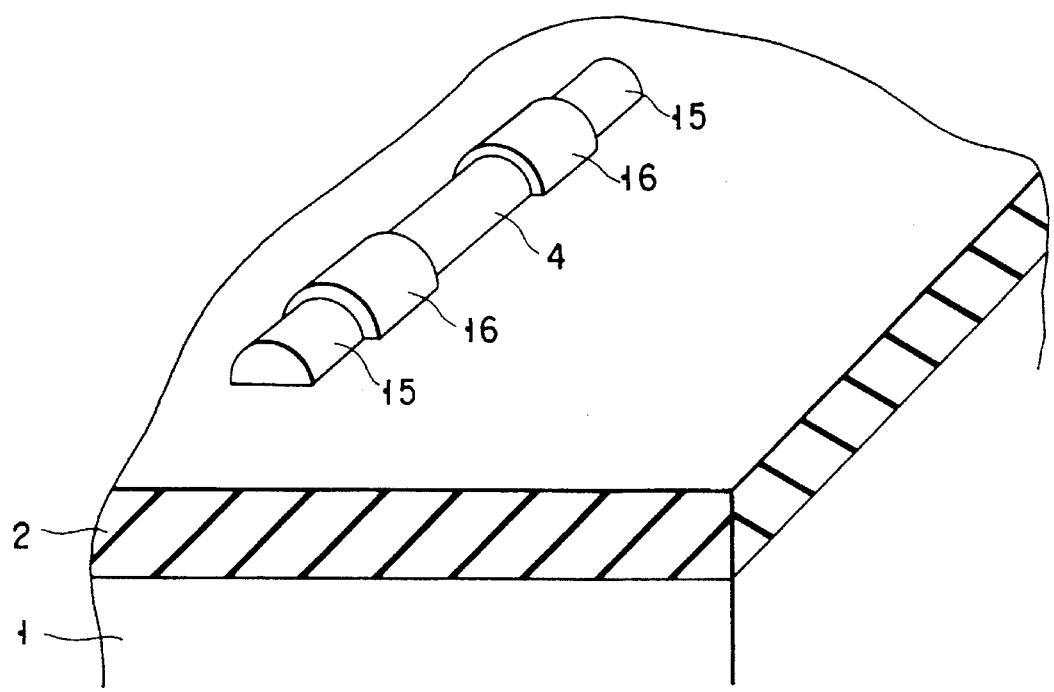
F I G. 4E
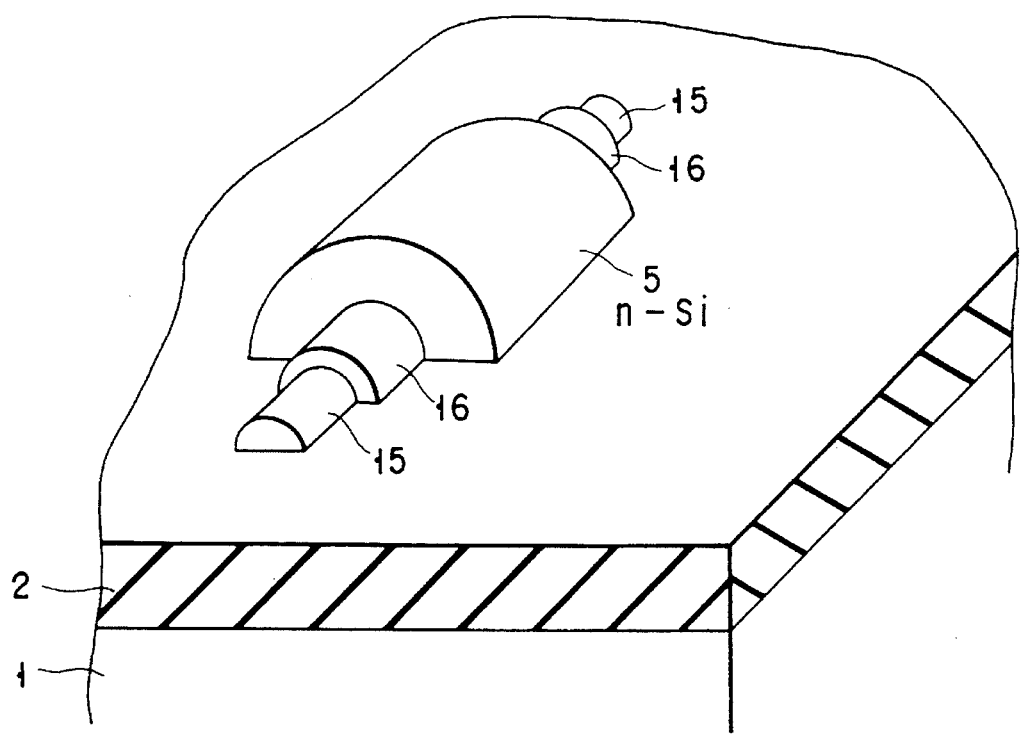
F I G. 4F

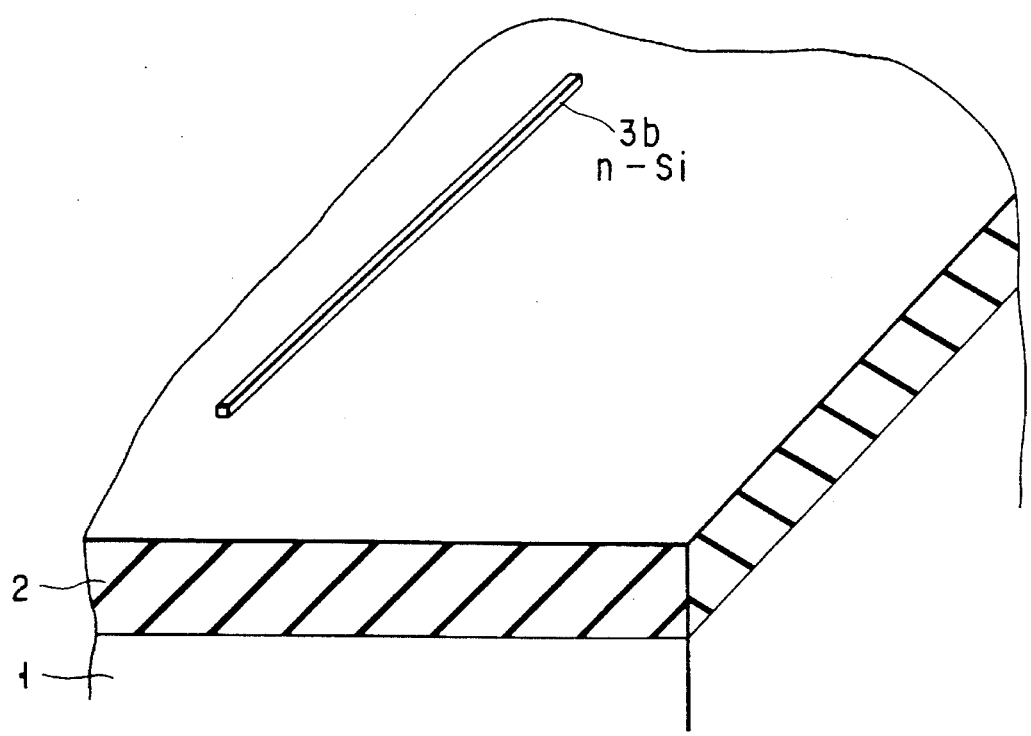
F I G. 5A
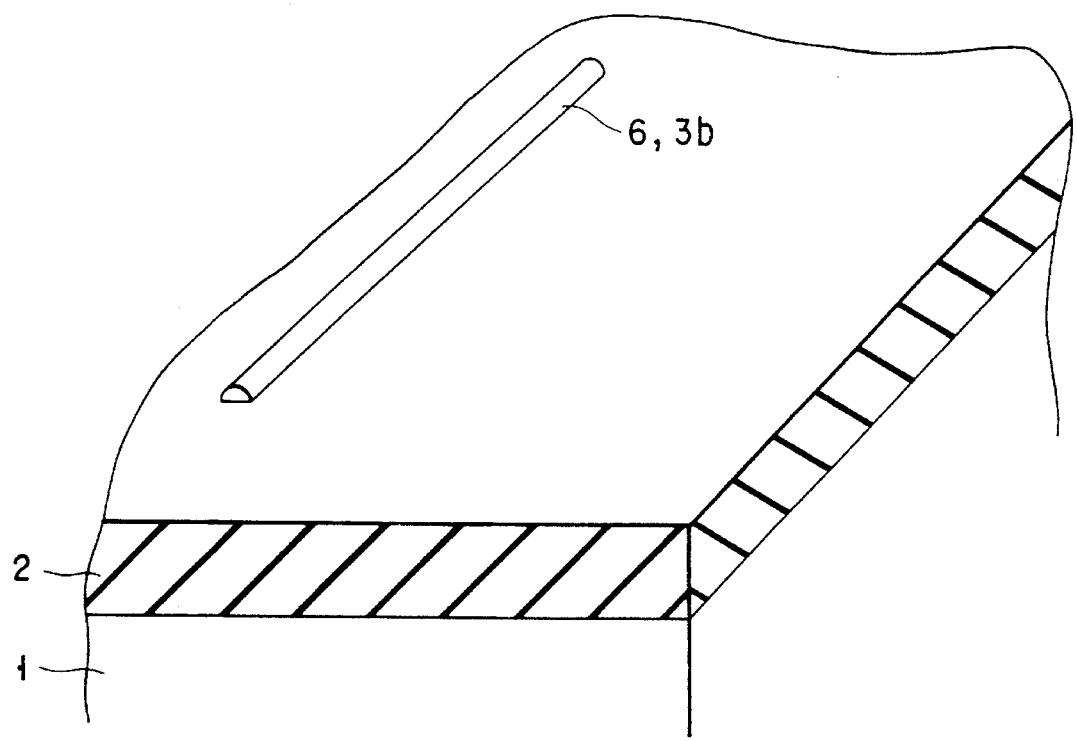
F I G. 5B

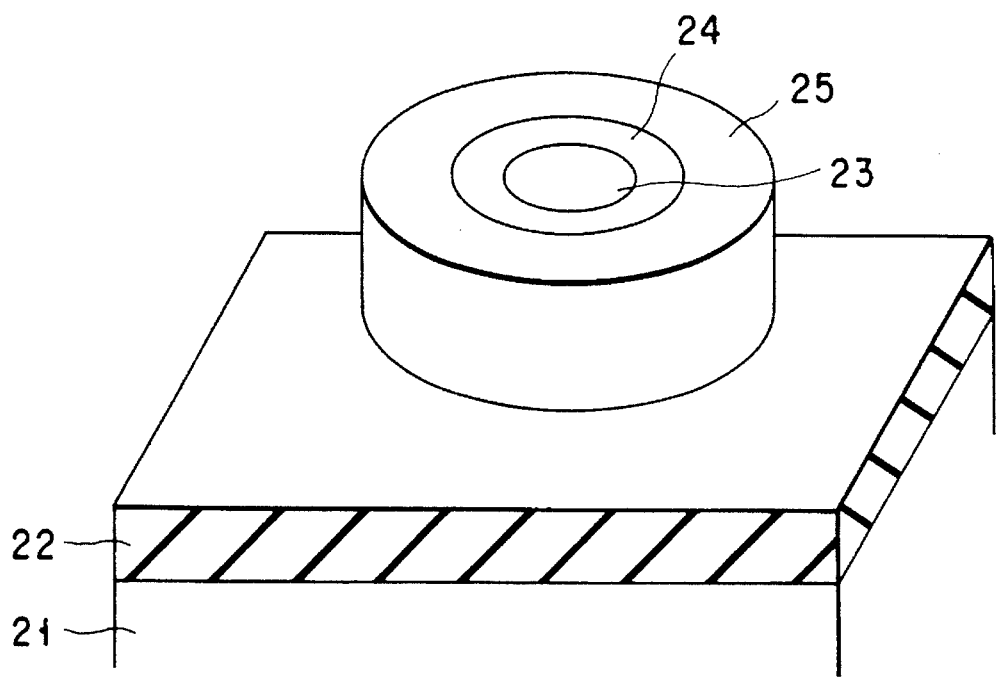
F I G. 8A
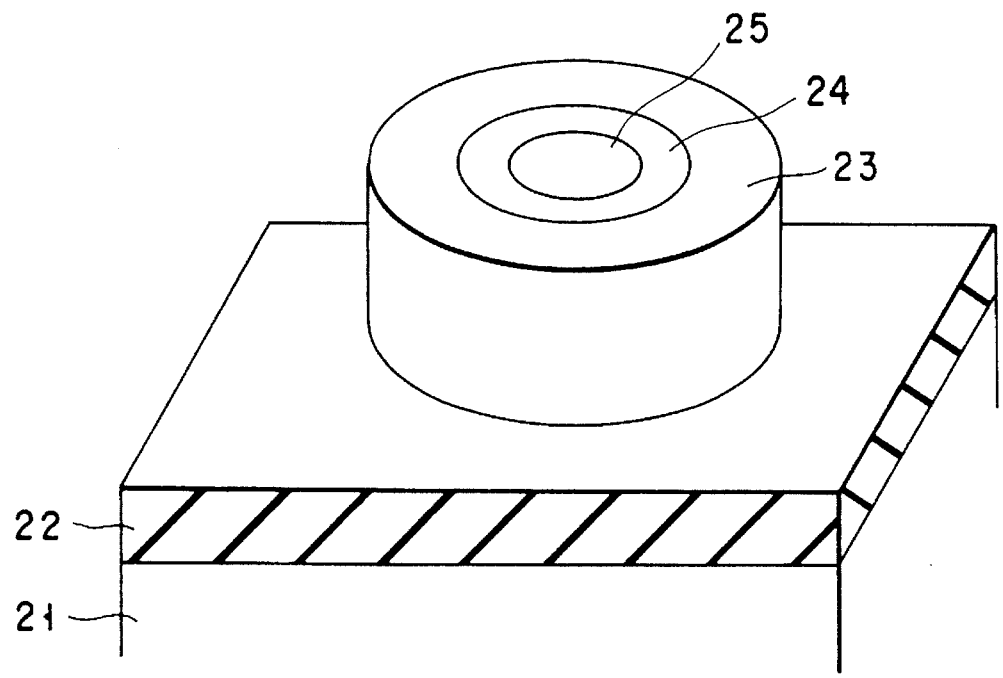
F I G. 8B

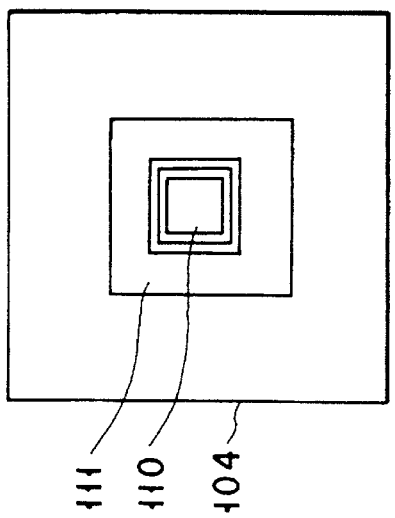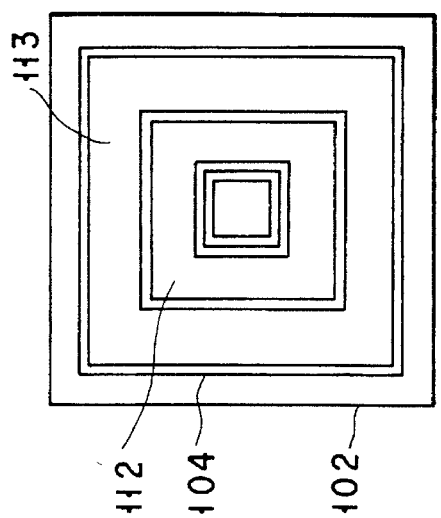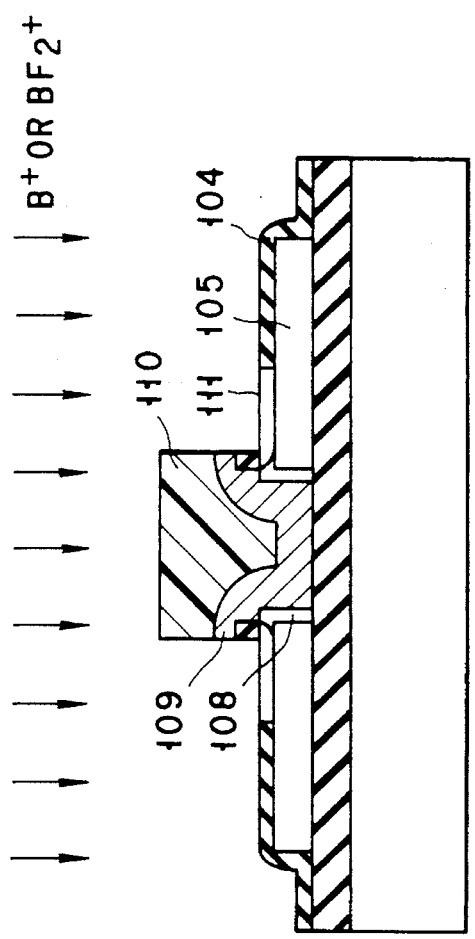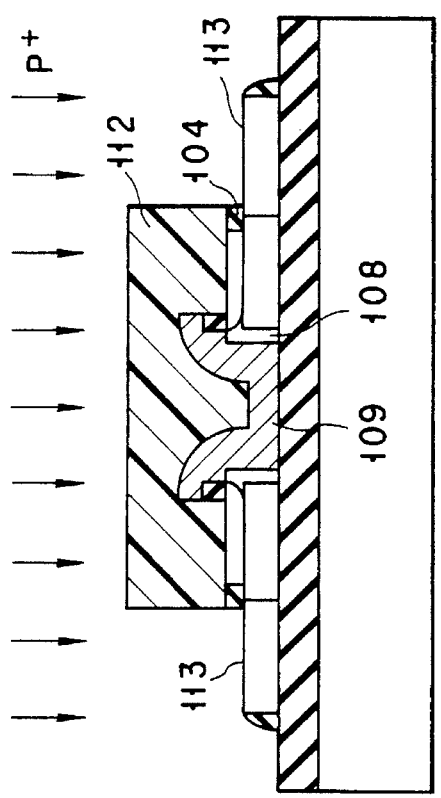

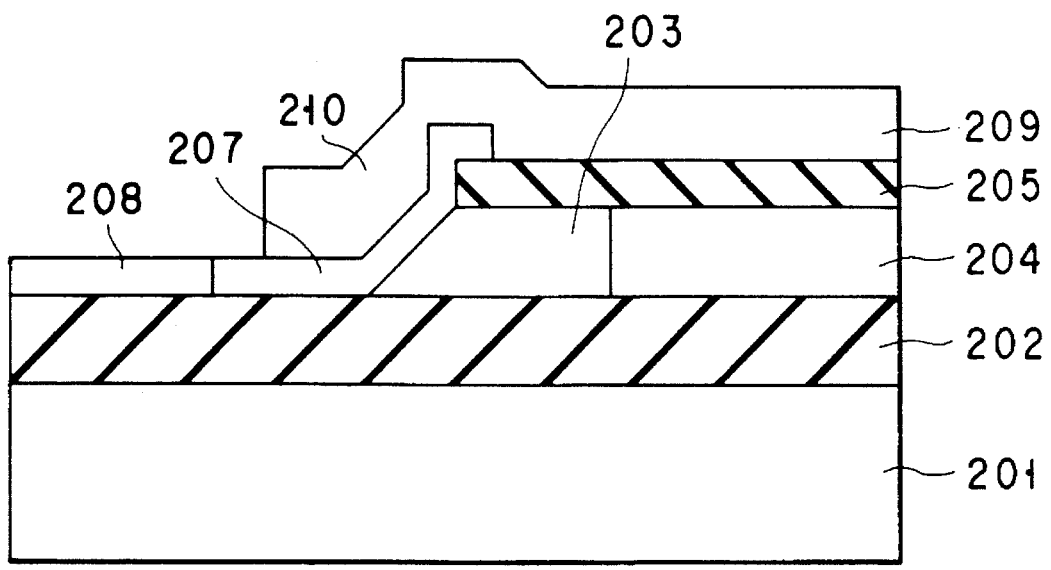
F I G. 17D
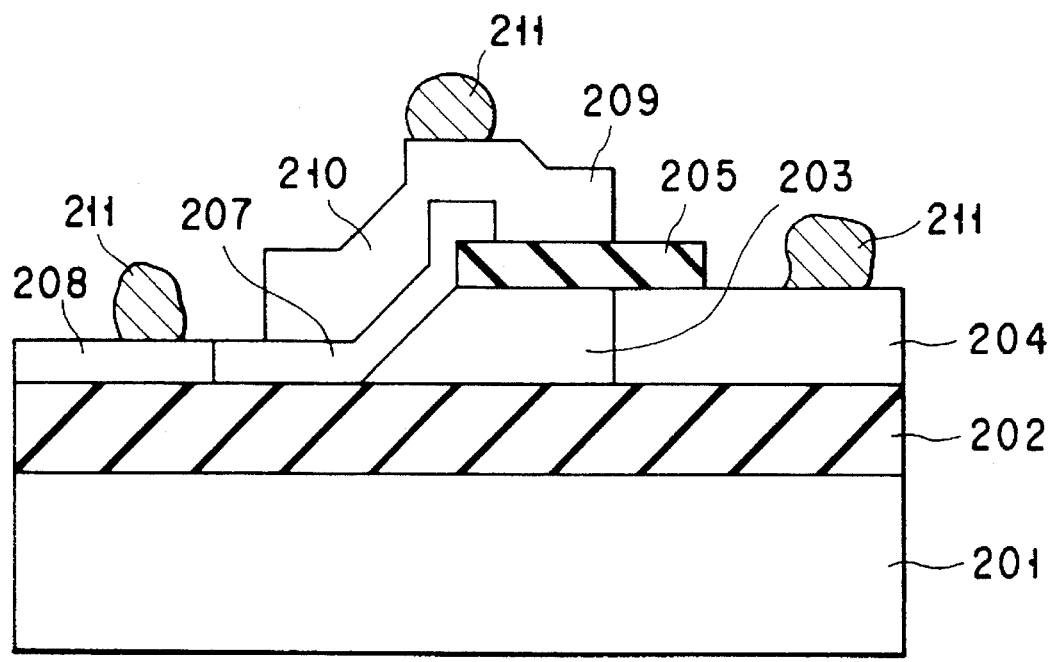
F I G. 17E

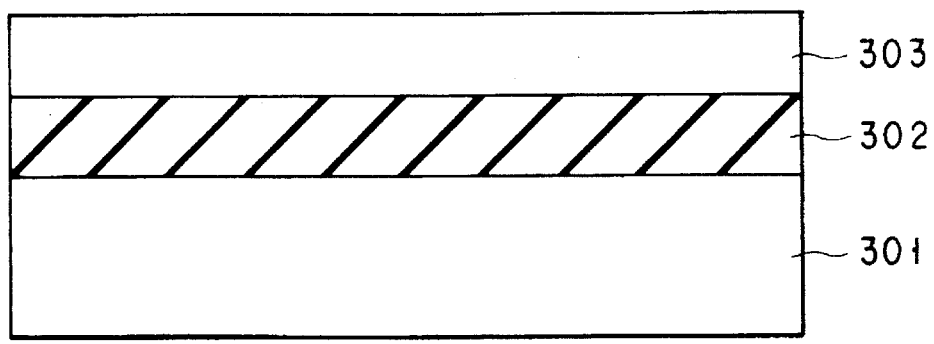
F I G. 18A
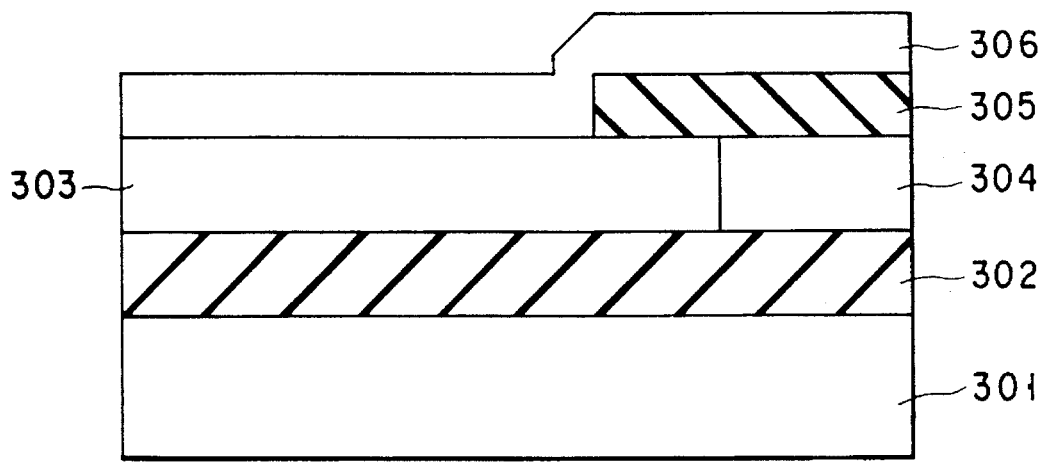
F I G. 18B
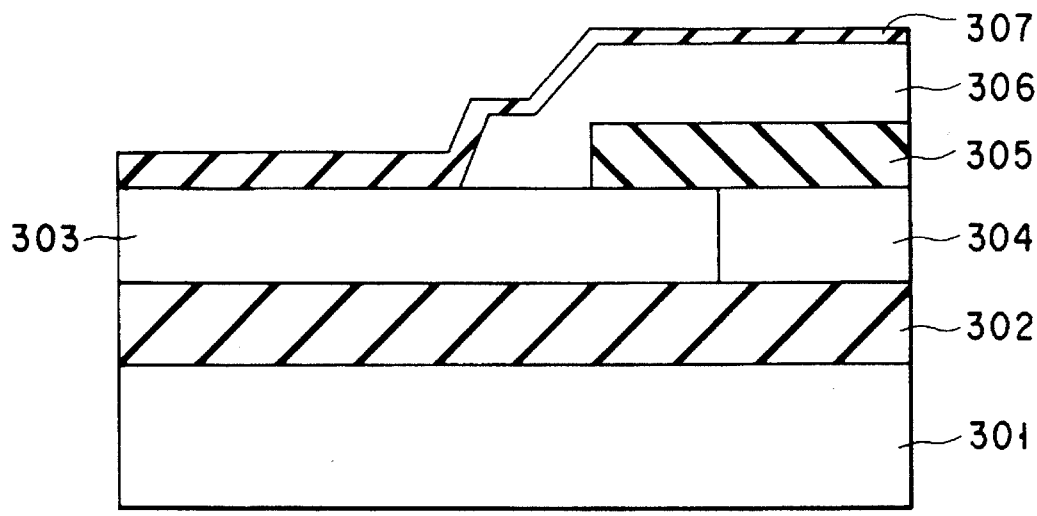
F I G. 18C

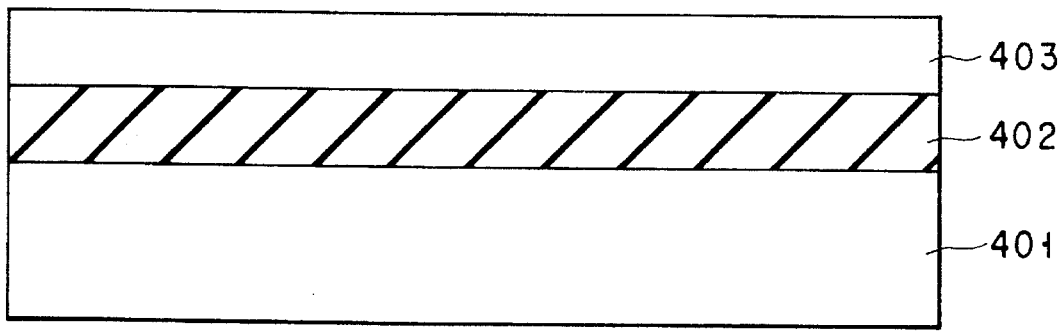
F I G. 19A
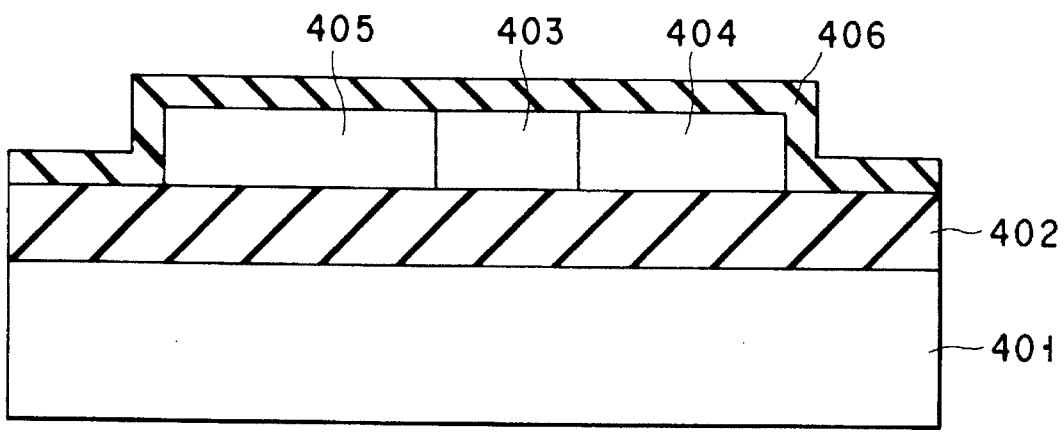
F I G. 19B
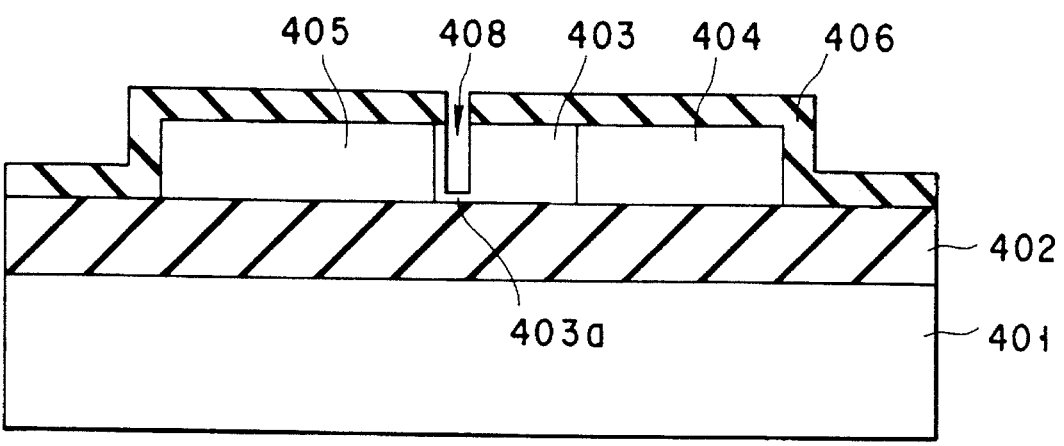
F I G. 19C

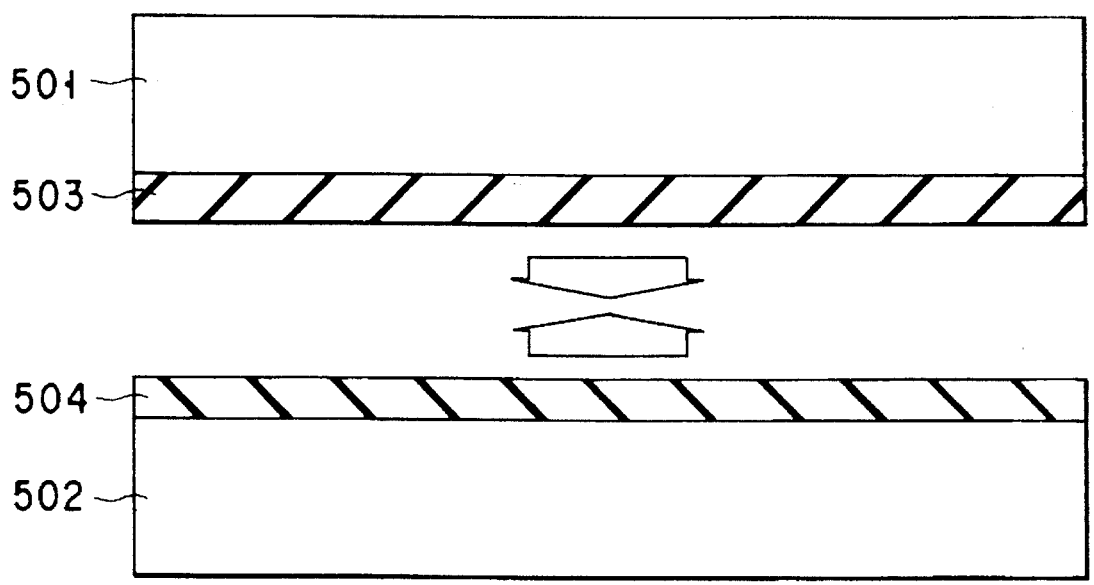
F I G. 21 A
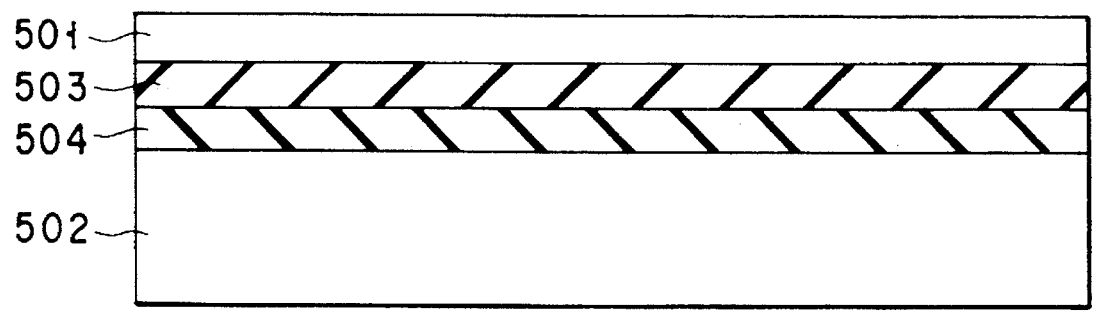
F I G. 21 B
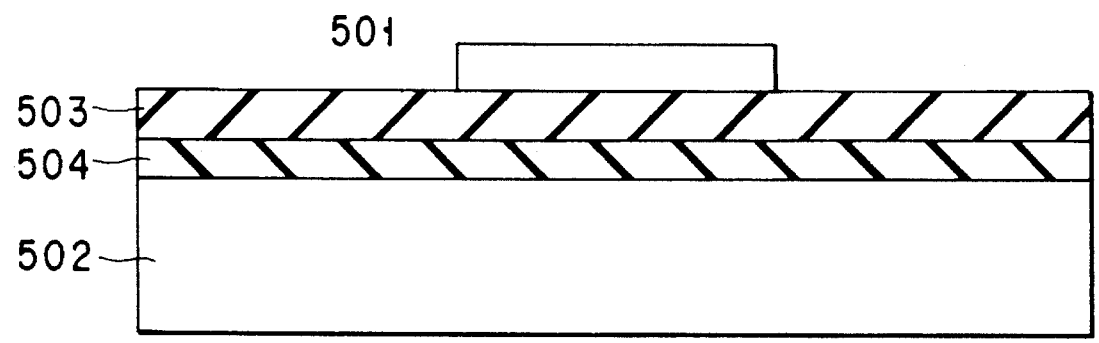
F I G. 21 C

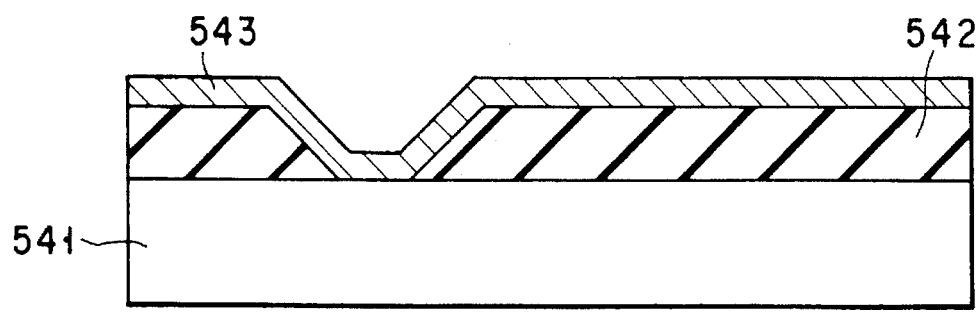
F I G. 24A
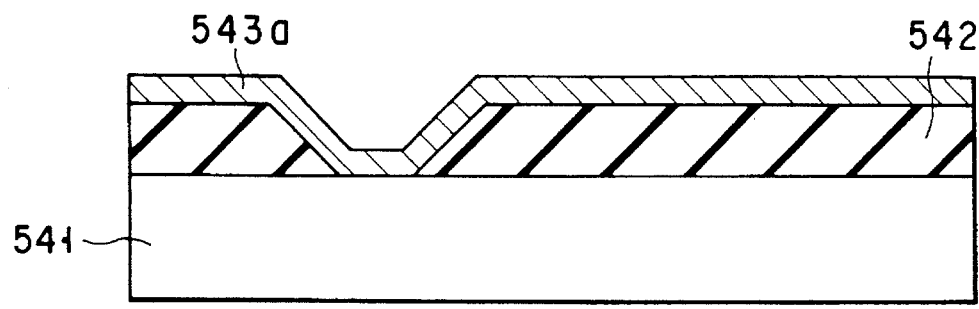
F I G. 24B
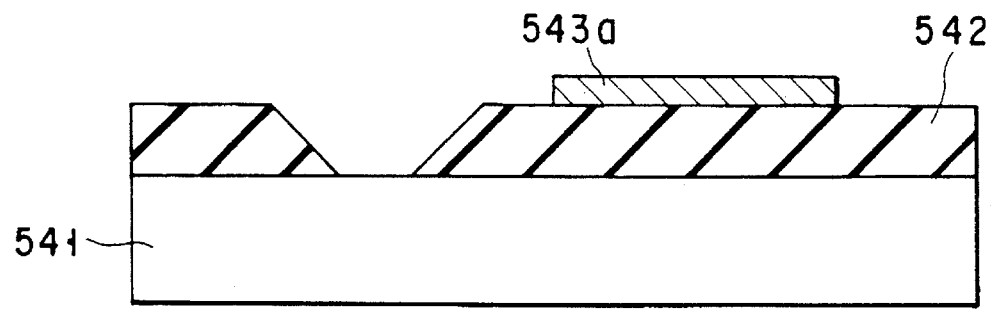
F I G. 24C
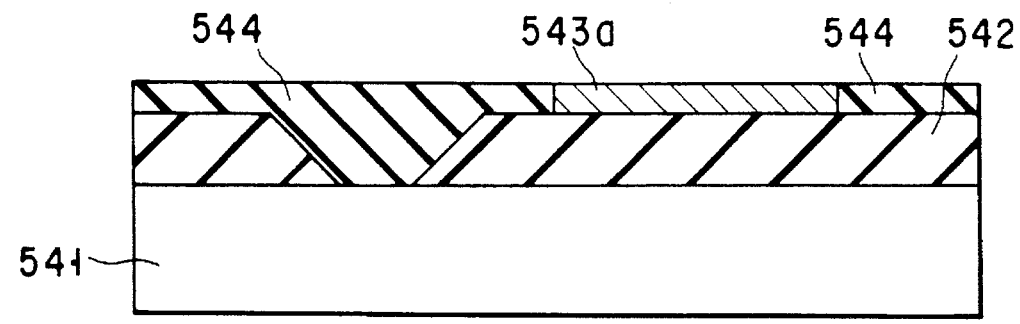
F I G. 24D

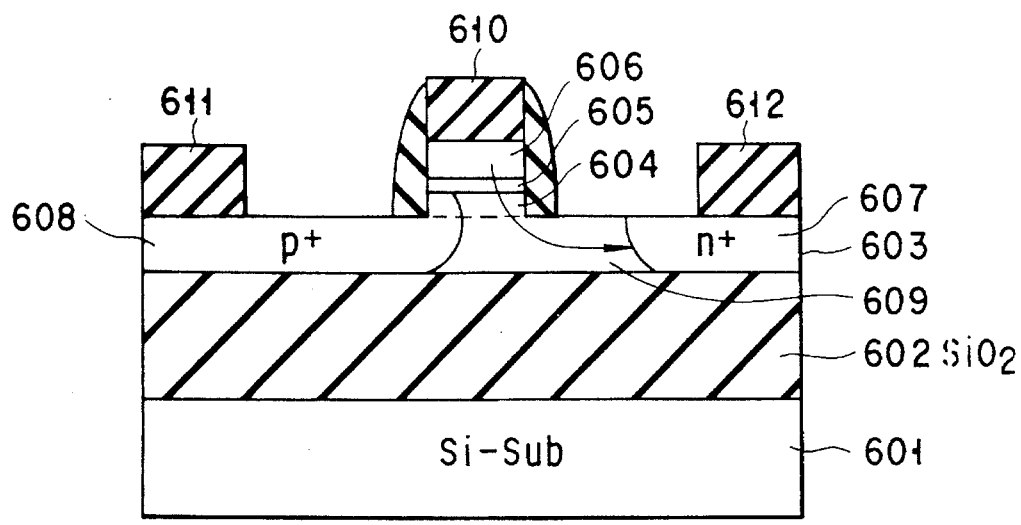
F I G. 25
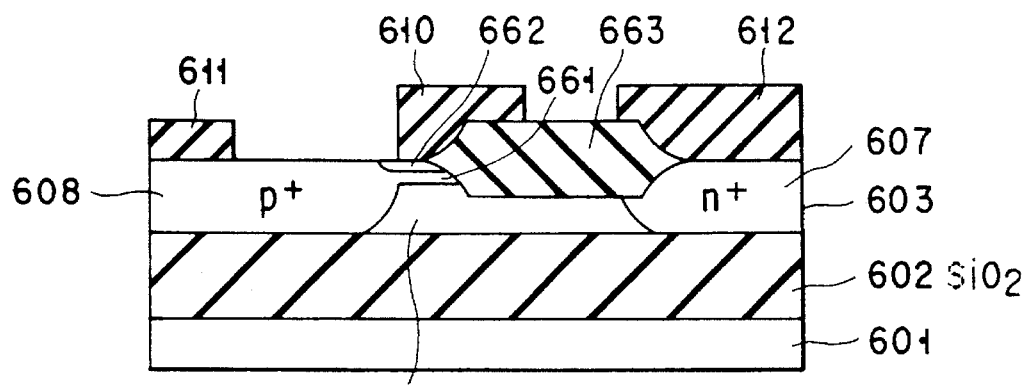
F I G. 26
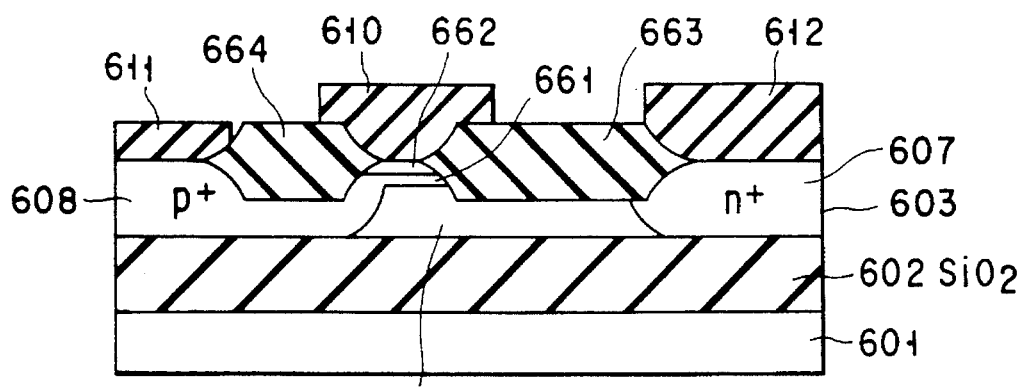
F I G. 27

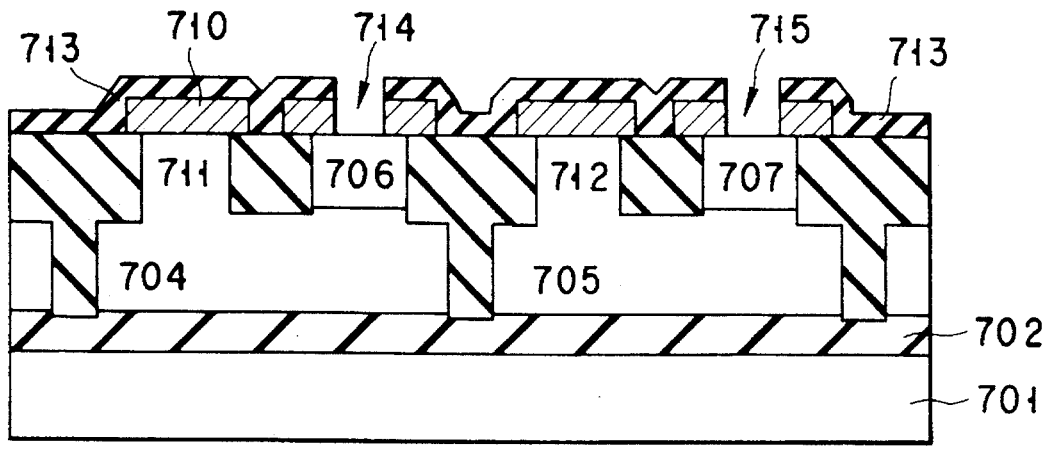
F I G. 28E
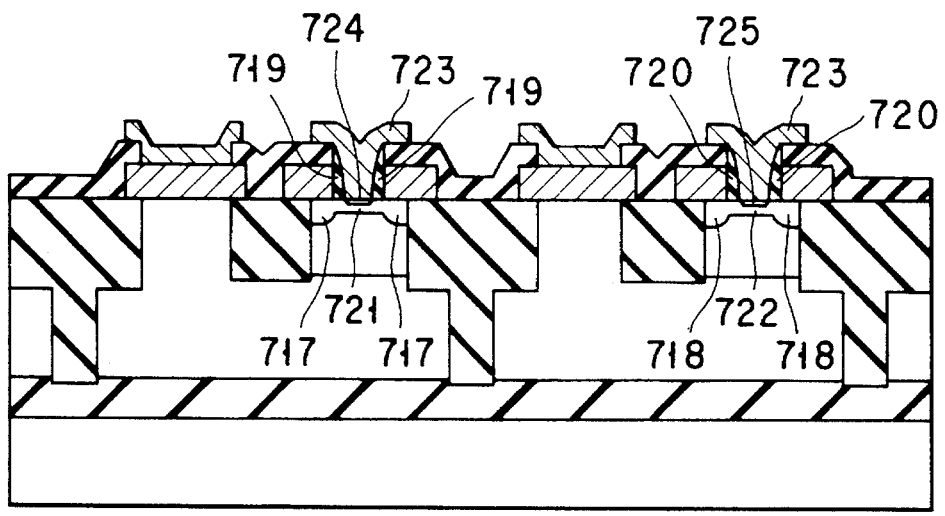
F I G. 28F

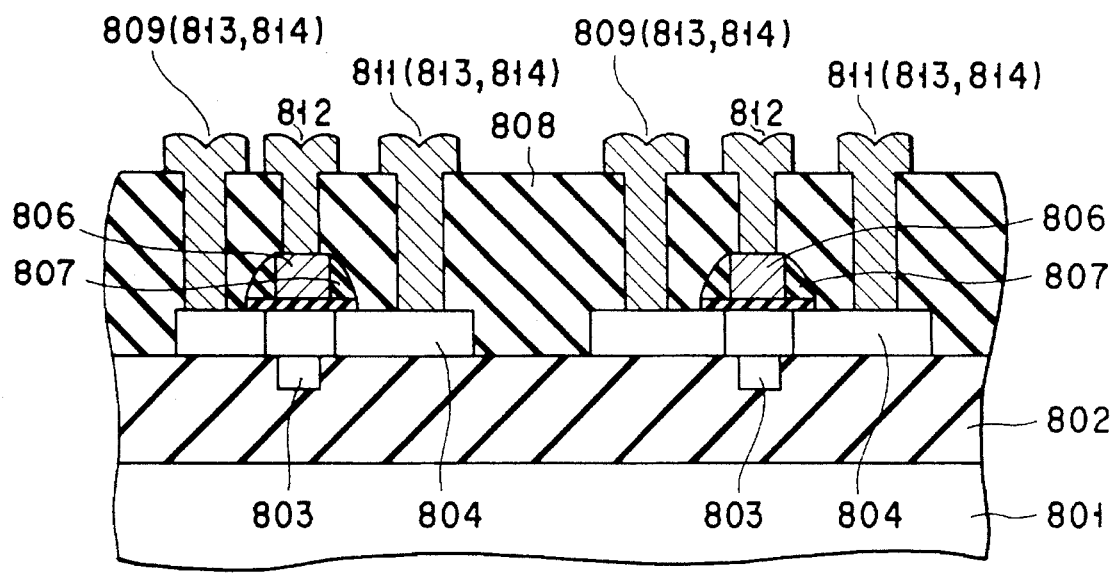
F I G. 29A
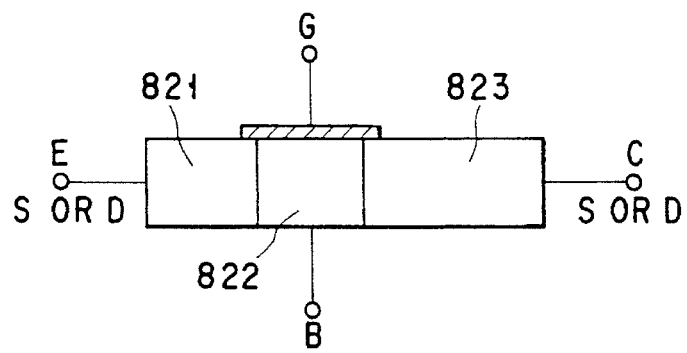
F I G. 29B

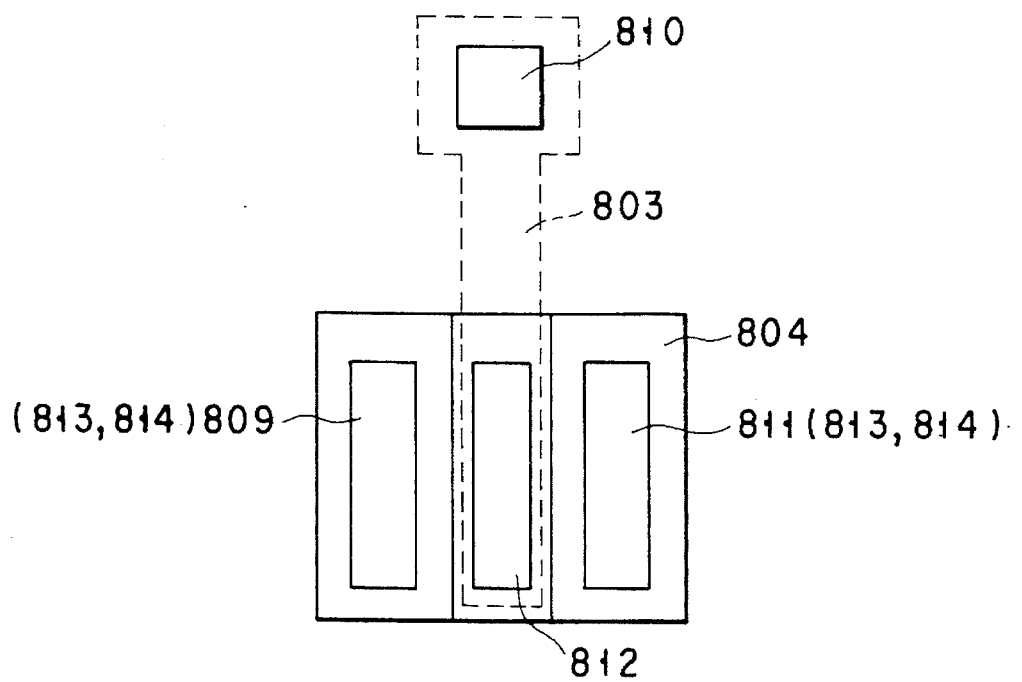
F I G. 31
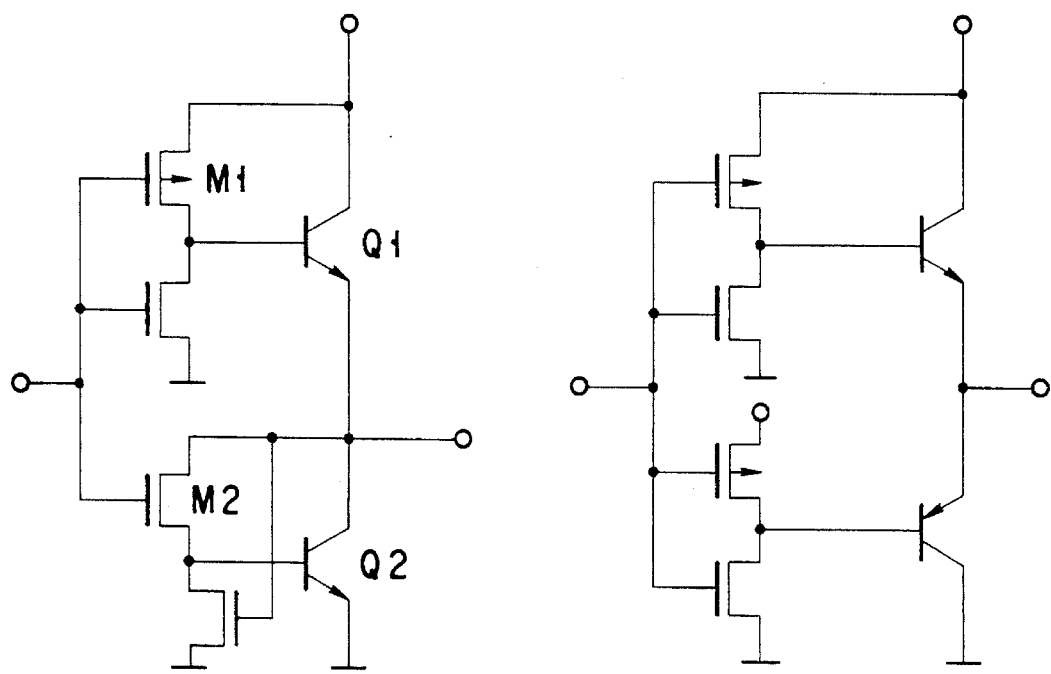
F I G. 32A    F I G. 32B

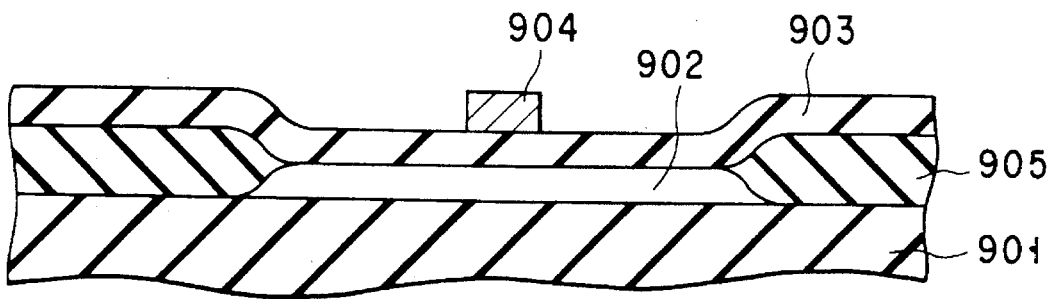
F I G. 33A
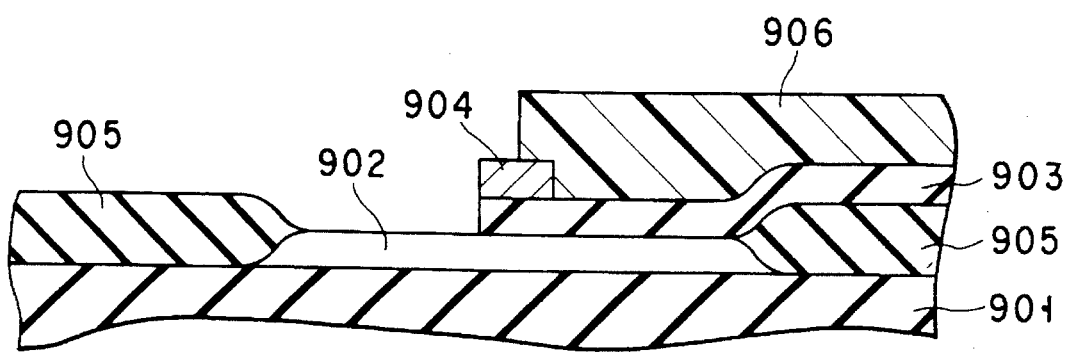
F I G. 33B
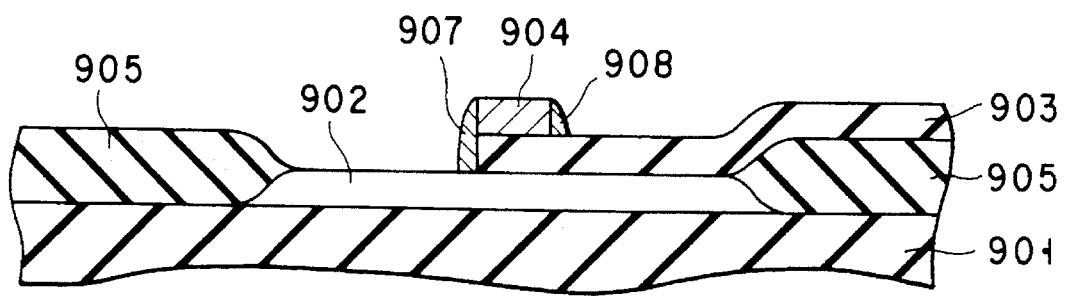
F I G. 33C
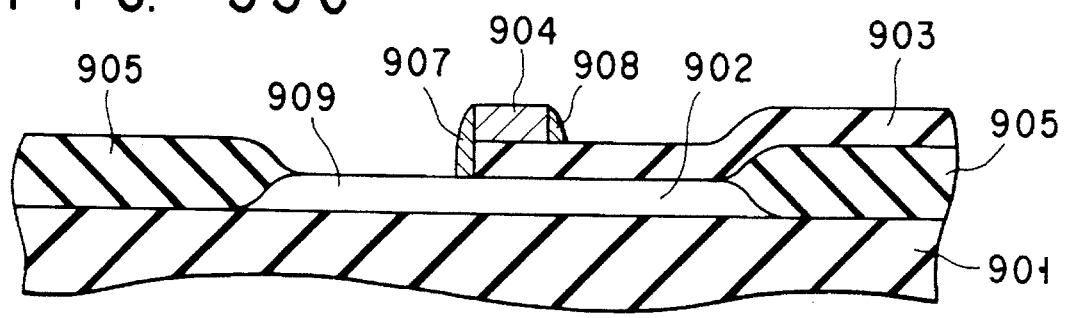
F I G. 33D

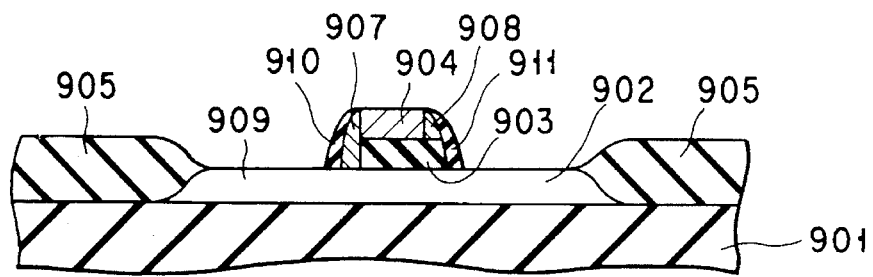
F I G. 33E
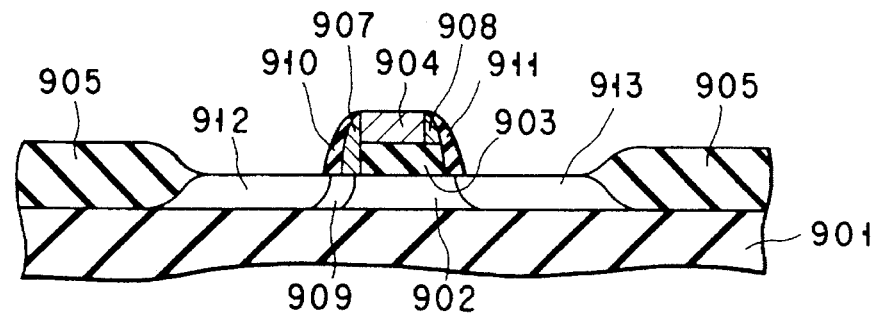
F I G. 33F
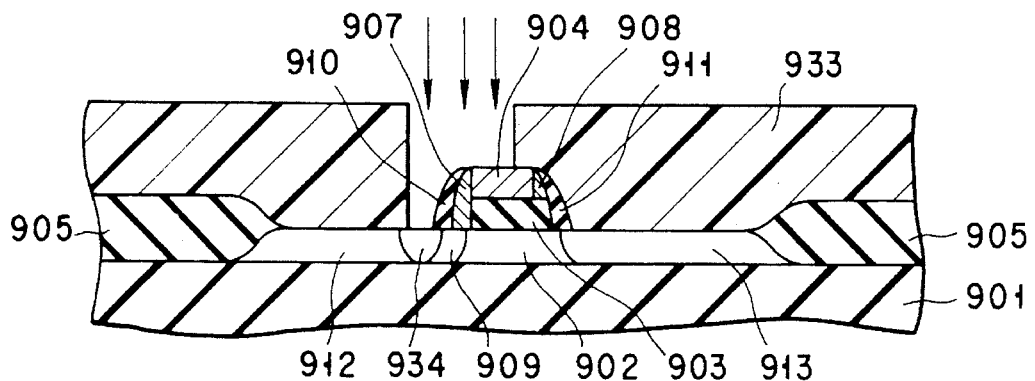
F I G. 33G
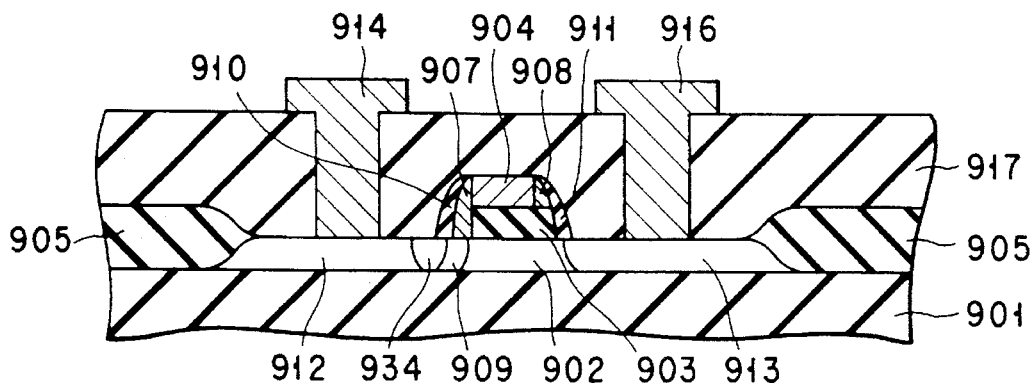
F I G. 33H

SEMICONDUCTOR DEVICE AND METHOD OF MANUFACTURING THE SAME

BACKGROUND OF THE INVENTION

1. Field of the Invention

The present invention relates to a semiconductor device including a bipolar transistor formed on insulating substrate.

2. Description of the Related Art

A so-called bipolar transistor formed on a wafer having an SOI (Silicon or Semiconductor On Insulator) structure is known as a bipolar transistor which has specific characteristics, e.g., a low parasitic capacitance and a low parasitic resistance and which is thus effective for realization of a low power consumption. Conventionally, in a lateral transistor of this type, a base layer is formed by implanting impurity ions in a semiconductor layer and annealing the resultant structure, or by thermally diffusing an impurity in a semiconductor layer. Also, a technique for forming a base layer by diffusing an impurity from a solid film containing the impurity into a semiconductor layer is also developed.

However, in any of the above methods, the formed base layer has a width larger than that of a vertical bipolar transistor. Also, in these base layers, the equi-concentration lines of the impurity concentrations form curves, as shown in FIG. 20B, due to the forming methods. In other words, the thickness of the base layer in a direction perpendicular to the pn junction becomes non-uniform, causing a difference in characteristics of the transistor, a decrease in breakdown voltage, and the like.

SUMMARY OF THE INVENTION

It is, therefore, an object of the present invention to provide a lateral bipolar transistor having a base layer as thin as that of the base layer of a vertical bipolar transistor.

It is another object of the present invention to provide a lateral bipolar transistor in which the base layer has a uniform thickness in a direction perpendicular to the pn junction.

According to a first aspect of the present invention, there is provided a bipolar transistor comprising:

an insulating substrate having a main surface;

a first layer consisting of a semiconductor of a first conductivity type which is formed on the main surface, the first layer having an end face having a (111) plane, the end face forming an angle with the main surface;

a second layer consisting of a semiconductor of a second conductivity type which is formed on the end face, the second layer being formed by epitaxial growth from the end face;

a third layer consisting of a semiconductor of the first conductivity type which is formed on the second layer; and first, second, and third electrodes respectively connected to the first, second, and third layers.

According to a second aspect of the present invention, there is provided a bipolar transistor comprising:

an insulating substrate having a main surface;

a semiconductor layer formed on the main surface and having an end face which forms an angle with respect to the main surface;

a first region of a first conductivity type which is formed in the semiconductor layer;

a second region of a second conductivity type which is formed by diffusing an impurity from the end face into the semiconductor layer, the second region contacting the first region, being unexposed to the end face, and having an impurity concentration which is substantially uniform in a direction parallel to the end face;

a third region of the first conductivity type which is formed by diffusing an impurity from the end face into the semiconductor layer, the third region being in contact with the second region, being exposed to the end face, and having an impurity concentration which is substantially uniform in a direction parallel to the end face; and first, second, and third electrodes respectively connected to the first, second, and third regions.

According to a third aspect of the present invention, there is provided a bipolar transistor comprising:

an insulating substrate having a main surface;

a semiconductor layer formed on the main surface, the semiconductor layer being formed with a trench extending from a surface thereof toward the main surface, a thin film which forms part of the semiconductor layer and has a thickness of not more than ¼ that of the semiconductor layer remaining between a bottom portion of the trench and the main surface;

a buried layer consisting of a semiconductor formed to fill the trench, the buried layer being formed by epitaxial growth from the thin film;

a first region of a first conductivity type which is formed in the semiconductor layer;

a second region of a second conductivity type which comprises the buried layer, the thin film, and portions of the semiconductor layer around the buried layer and the thin film, the second region being in contact with the first region and having an impurity concentration which is substantially uniform in a direction parallel to a depthwise direction of the trench;

a third region of the first conductivity type which is formed in the semiconductor layer, the third region being in contact with the second region; and first, second, and third electrodes respectively connected to the first, second, and third regions.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A and 2B are sectional views showing modifications of the first embodiment;

FIGS. 3A to 3C are sectional views showing modifications of the first embodiment;

FIGS. 4A to 4F are perspective views sequentially showing the manufacturing steps of the first embodiment;

FIGS. 5A and 5B are perspective views showing modifications of the manufacturing steps of the first embodiment;

FIGS. 8A and 8B are perspective views showing different arrangements of the emitter, base, and collector of the second embodiment;

FIGS. 15A to 15H are sectional views sequentially showing the manufacturing steps of a bipolar transistor according to the eighth embodiment of the present invention;

FIGS. 16A to 16D are plan views sequentially showing the manufacturing steps of the eighth embodiment;

FIGS. 17A to 17E are sectional views sequentially showing the manufacturing steps of a bipolar transistor according to the ninth embodiment of the present invention;

FIGS. 18A to 18F are sectional views sequentially showing the manufacturing steps of a bipolar transistor according to the tenth embodiment of the present invention;

FIGS. 19A to 19D are sectional views sequentially showing the manufacturing steps of a bipolar transistor according to the eleventh embodiment of the present invention.

FIGS. 24A to 24D are sectional views sequentially showing another modification of the manufacturing steps of the twelfth embodiment;

FIG. 25 is a sectional view showing a bipolar transistor according to the thirteenth embodiment of the present invention;

FIG. 26 is a sectional view showing a modification of the thirteenth embodiment;

FIG. 27 is a sectional view showing another modification of the thirteenth embodiment;

FIGS. 28A to 28F are sectional views sequentially showing the manufacturing steps of a bipolar transistor according to the fourteenth embodiment of the present invention;

FIGS. 29A and 29B are sectional and conceptional views, respectively, showing a semiconductor device according to the fifteenth embodiment of the present invention;

FIG. 31 is a plan view showing the last step of the manufacturing steps of the fifteenth embodiment;

FIGS. 32A and 32B are circuit diagrams showing different inverter circuits according to the fifteenth embodiment;

FIGS. 33A to 33H are sectional views sequentially showing the manufacturing steps of a bipolar transistor according to the sixteenth embodiment of the present invention.

DETAILED DESCRIPTION OF THE PREFERRED EMBODIMENTS

Embodiment 1

Figure 1A:
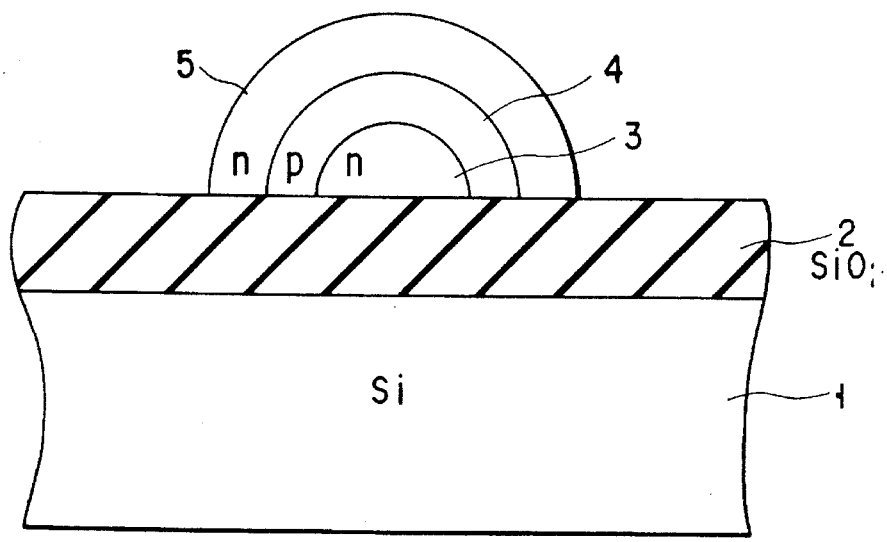
FIGS. 1A and 1B are sectional and perspective views, respectively, schematically showing a bipolar transistor according to the first embodiment of the present invention.
Figure 1B:
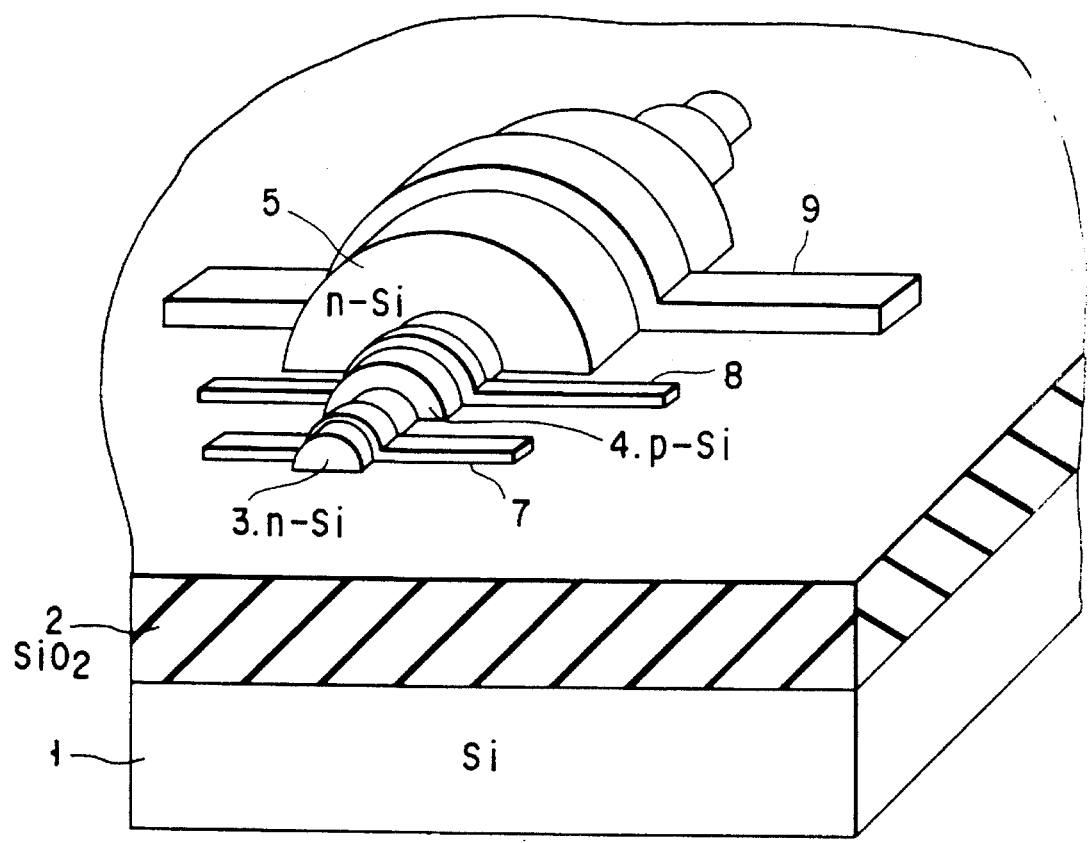

FIGS. 1A and 1B are sectional and perspective views, respectively, for explaining the schematic arrangement of a bipolar transistor according to the first embodiment of the present invention.

A 1 µm thick silicon oxide film 2 is formed on a silicon substrate 1, thereby forming an insulating substrate. A semicylindrical (with a radius of 0.5 µm) emitter region (first projecting semiconductor region) 3 of arsenic-doped n-type silicon is formed on this insulating substrate. A 5 nm thick base region (second projecting semiconductor region) 4 of boron-doped p-type silicon is formed to cover the emitter region 3. A 0.5 µm thick collector region (third projecting semiconductor region) 5 of phosphorus-doped n-type silicon is formed to cover the base region 4.

Electrodes 7, 8, and 9 (consisting of, e.g., aluminum) of the emitter, base, and collector, respectively, are formed as shown in FIG. 1B. The emitter region 3 is formed long like a pencil lead to obtain contact with the electrode 7. Similarly, the base region 4 is formed long, although shorter than the emitter region 3. The electrode 9 of the collector region 5 can be connected from immediately above the collector region 5. In each of the emitter, base, and collector, the portion which contacts the electrode is set to have a high impurity concentration in order to have ohmic contact with the electrode.

The emitter region 3 need not be completely semicylindrical but may be of U shape, as shown in FIG. 2A, or may be rectangular, as shown in FIG. 2B. The shapes of the base region 4 and the collector region 5 are changed in accordance with a change in shape of the emitter region 3, as a matter of course.

FIGS. 3A to 3C show modifications of this embodiment. To decrease the resistance of the core of the emitter, the core of an emitter region 3 is replaced with a metal or a metal silicide 6, as shown in FIG. 3A. As the metal, e.g., tungsten may be used, and as the metal silicide, e.g., NiSi$_2$ (nickel disilicide) may be used. The lattice constant of the crystal of NiSi$_2$ is very close to that of silicon and is thus convenient when, e.g., emitter silicon is formed by epitaxial growth by using NiSi$_2$ as a nucleus.

As shown in FIG. 3B, the entire area of the emitter may be made of a metal or a metal silicide 3a, depending on the case. As the substrate, one obtained by forming the silicon oxide film 2 on the silicon substrate 1 has been described so far. However, the present invention is not limited to this. As shown in FIG. 3C, a complete insulating substrate entirely made of a silicon oxide film 2a may be used.

The method of manufacturing the device according to the first embodiment will be described with reference to FIGS. 4A to 4F. First, as shown in FIG. 4A, e.g., a 0.5 μm thick arsenic-doped n-type silicon layer 13 is formed on an insulating substrate obtained by forming, e.g., 1 μm thick silicon oxide film 2 on a silicon substrate 1.

Subsequently, as shown in FIG. 4B, the silicon layer 13 is removed by etching in accordance with photolithography to form a rod-like emitter region 3. At this time, if etching is performed with tapering or under such a condition that the corners of the rod-like emitter region 3 are easily etched, the emitter region 3 has a semicircular section. Note that the shape of the emitter region 3 is not limited to a semicylindrical one, as is shown in FIGS. 2A and 2B.

As shown in FIG. 5A, an n-type silicon layer 13 may set to have a small thickness, a core 3b of a rod-like emitter having a small section may be formed to be rectangular or to have a shape close to a rectangle, and the emitter region may be formed by epitaxial growth using this core 3b as a nucleus, thereby forming a rod-like emitter region 3 having a semicylindrical shape or a shape close to it. Furthermore, as shown in FIG. 5B, a metal, e.g., tungsten, or a metal silicide 6, e.g., NiSi$_2$, may be used as the core 3b of the emitter. Since NiSi$_2$ has a lattice constant very close to that of silicon, it facilitates silicon epitaxial growth.

When the core is made of a metal or silicide and has a lattice constant quite different from that of silicon, amorphous or polycrystalline silicon may be deposited first and converted to monocrystalline silicon by annealing or the like. The entire rod-like emitter may be made of a metal or silicide.

As shown in FIG. 4C, a protection film 15 made of a silicon oxide film or the like is deposited on the surface of the rod-like emitter region 3, and the central portion of the protection film 15 is removed. Subsequently, as shown in FIG. 4D, e.g., a 50 nm thick boron-doped p-type silicon layer is formed by selective epitaxial growth, thereby forming a base region 4.

Similarly, as shown in FIG. 4E, the emitter region 3 and the base region 4 are covered with a protection film 16, and the central portion of the protection film 16 corresponding to the base region 4 is removed. Subsequently, as shown in FIG. 4F, e.g., a 0.5 μm thick phosphorus-doped n-type silicon layer is formed by selective epitaxial growth, thereby forming a collector region 5.

Thereafter, the protection films 15 and 16 are removed, aluminum wirings are formed, as shown in FIG. 1B, thereby forming electrodes 7, 8, and 9 of the emitter, base, and collector, respectively.

According to this embodiment, since the collector region 5 and the semiconductor substrate 1 are completely isolated from each other by the insulating film 2, the parasitic capacitance between the collector region 5 and the semiconductor substrate 1 can be decreased by appropriately selecting the thickness of the insulating film 2. Since the collector electrode 9 can be connected from above the collector, a long wiring need not be formed, unlike in the conventional technique. Then, the area at this portion can be sufficiently decreased, considerably decreasing the parasitic resistance and the parasitic capacitance. Since wires of the emitter, base, and collector can directly obtain contact not by using contact holes, the manufacturing steps and required areas can be decreased. Furthermore, since the emitter region 3, the base region 4, and the collector region 5 radially spread in this order, diffusion of the electrons, which are injected from the emitter, in the base toward the collector can be enhanced, thereby obtaining a large collector current. Accordingly, a conventional problem of a low switching speed of the bipolar transistor can be solved.

Embodiment 2

According to this embodiment, a base and a collector (or an emitter) are concentrically formed using an emitter (or a collector) as a core. This embodiment provides a lateral bipolar transistor characterized in that the emitter and collector regions are partly etched by selective etching to leave the base region as a projecting portion, and that contact between the projecting base region and the base electrode can be obtained.

Figure 6A:
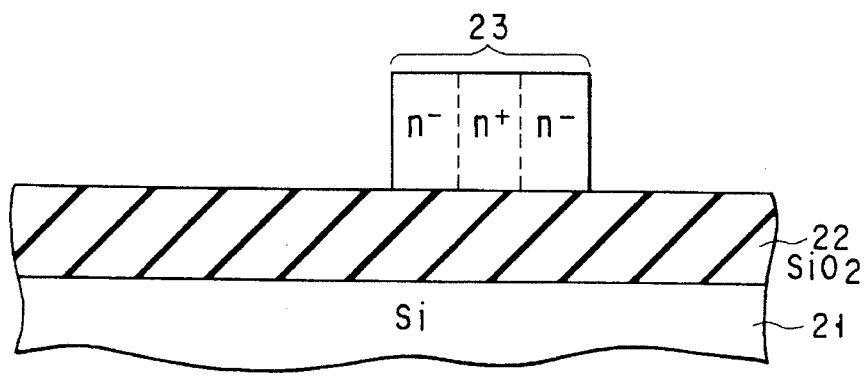
FIGS. 6A to 6F are sectional views sequentially showing the manufacturing steps of a bipolar transistor according to the second embodiment of the present invention.

FIGS. 6A to 6F are sectional views showing the manufacturing steps of a lateral bipolar transistor according to the second embodiment of the present invention. As shown in FIG. 6A, a silicon layer of an SOI substrate is patterned, and an impurity (phosphorus or the like) is added, thereby forming an island collector region 23. Reference numeral 21 denotes a silicon substrate; and 22, a silicon oxide film.

Figure 6B:
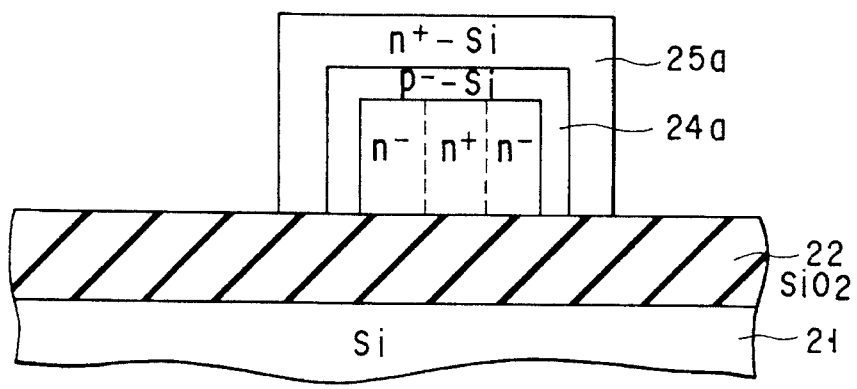

Silicon is deposited by epitaxial growth while doping boron. As shown in FIG. 6B, a base layer 24a is formed on the upper and side portions of the collector region 23 to have a thickness of 50 nm. Subsequently, silicon is deposited by epitaxial growth while doping arsenic, thereby forming a 0.5 μm thick emitter layer 25a.

Figure 6C:
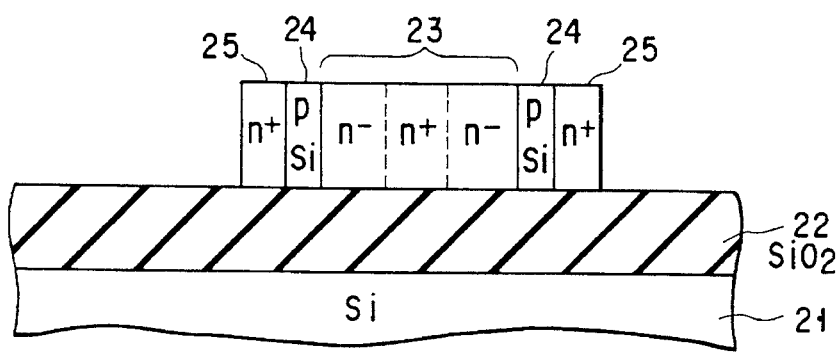

Subsequently, as shown in FIG. 6C, the extra upper film of the emitter layer 25a is removed by polishing or the like until an emitter region 25, a base region 24, and the collector region 23 are horizontally aligned in a row. Removal of the extra upper film is not limited to by polishing. For example, a smoothing film, e.g., a resist or a spin-on glass, may be deposited and removed by etch back.

Figure 6D:
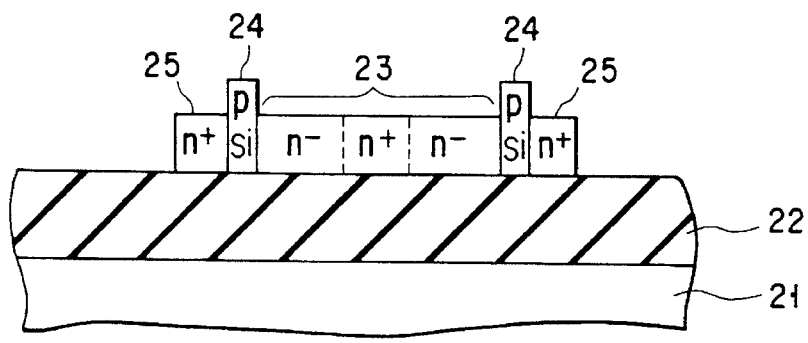

Subsequently, as shown in FIG. 6D, only the emitter region 25 and the collector region 23 as the n-type silicon layers are partly etched by using a selective etchant, e.g., KOH, to cause the upper portion of the base region 24 to project.

Figure 6E:
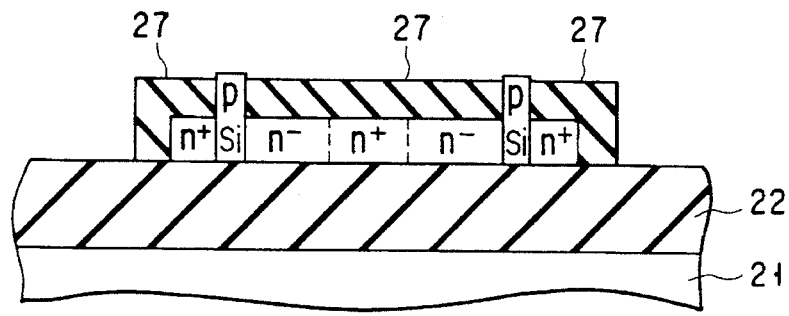

As shown in FIG. 6E, an insulating film 27, e.g., a silicon oxide film, is deposited and polished, or a smoothing film is deposited and etched back, thereby exposing the upper portion of the projecting base region 24.

Figure 6F:
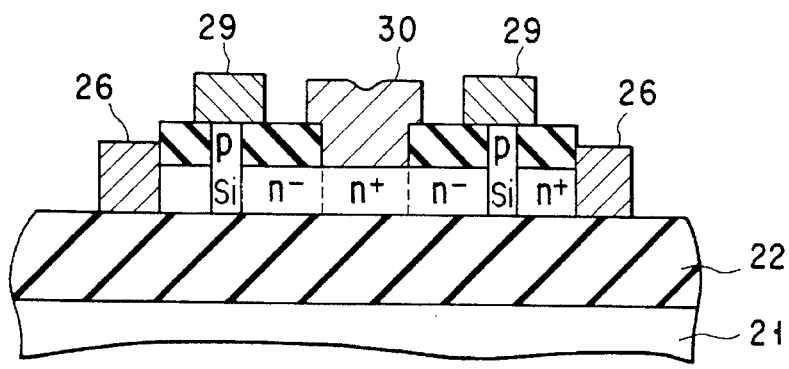

As shown in FIG. 6F, contact holes are formed, and aluminum electrodes are deposited, thereby forming an emitter electrode 26, a base electrode 29, and a collector electrode 30.

Figure 7A:
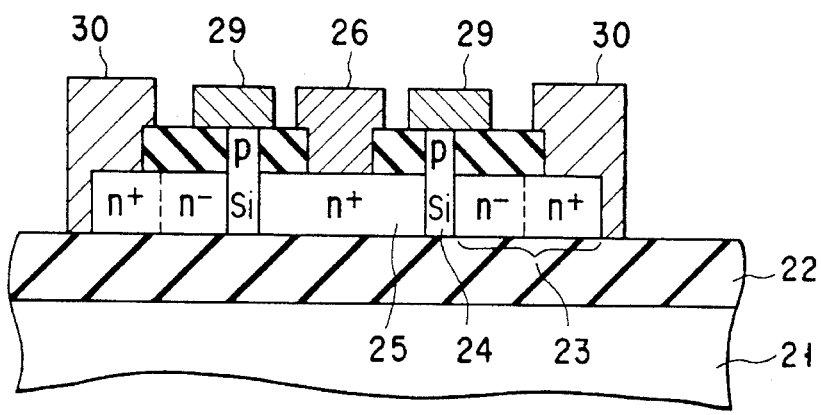
FIGS. 7A and 7B are sectional views showing modifications of the second embodiment.

A semiconductor device has been described wherein the collector region 23 is formed first and the base region 24 and the emitter region 25 are formed using the collector region 23 as a core. The present invention can also be applied to a semiconductor device which oppositely has an emitter region 25 as a core, as shown in FIG. 7A. When these semiconductor devices are drawn in birds-eye views, if the core is cylindrical, the cylinder stands upright, as shown in FIGS. 8A and 8B.

Figure 7B:
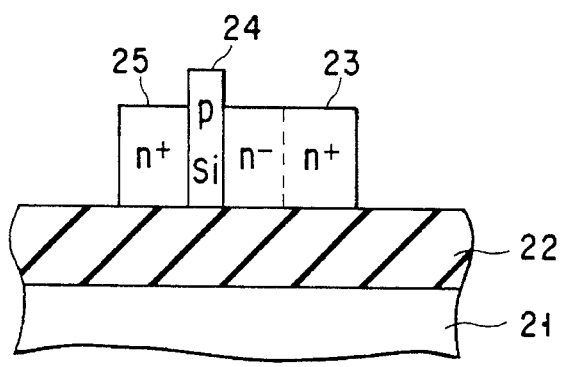

The above description has been given with reference to a semiconductor device wherein the base and emitter surround the collector like a cylinder, or a semiconductor device wherein the base and collector surround the emitter. However, the present invention is not limited to them. The first island collector region may be set to be rectangular, and a silicon oxide film or the like may be formed by epitaxial growth to cover three sides of the rectangle while leaving only one side, thereby obtaining a semiconductor device wherein the collector, base, and emitter extend in one direction, as shown in FIG. 7B.

In this manner, according to this embodiment, the emitter region 25 and the collector region 23 can be partly etched by selective etching to leave the collector region 23 as a projecting region, and contact between the projecting base region 24 and the base electrode 29 can be directly obtained. Then, conventional problems that contact with the base electrode is difficult to obtain and that the area of the external base is increased, thus increasing the base capacitance, can be solved. Especially, if the semiconductor device has a cylindrical bipolar structure having the emitter region 25 as a core, the emitter, base, and collector regions radially spread in the order named. Then, a large-current, high-speed operation can be obtained as compared to a conventional semiconductor device in which diffusion of the electrons injected into the base toward the collector is enhanced.

Embodiment 3

According to the third to fifth embodiments, the base and collector are radially formed around the emitter in the same manner as in the second embodiment, so that electron diffusion in the base can be enhanced to increase effective electron mobility, thereby obtaining a large-current, high-speed operation. When elements are formed on an SOI substrate, for example, element isolation required when a plurality of elements are integrally formed on the same substrate becomes easy, the manufacturing steps can be simplified, the element speed can be increased by thoroughly decreasing the parasitic capacitance.

Figure 9A:
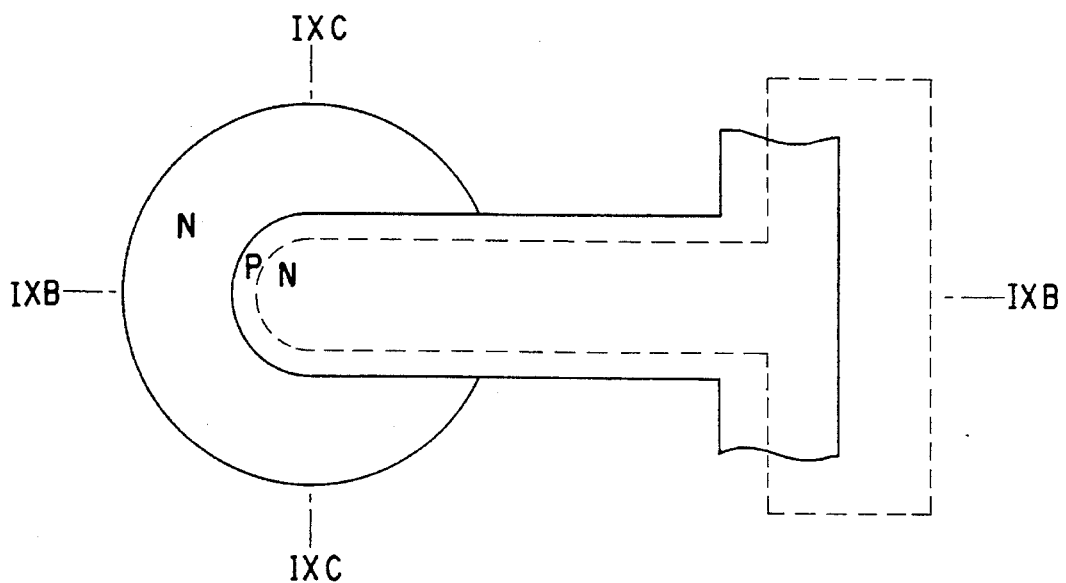
FIG. 9A is a plan view showing a bipolar transistor according to the third embodiment of the present invention.
Figure 9B:
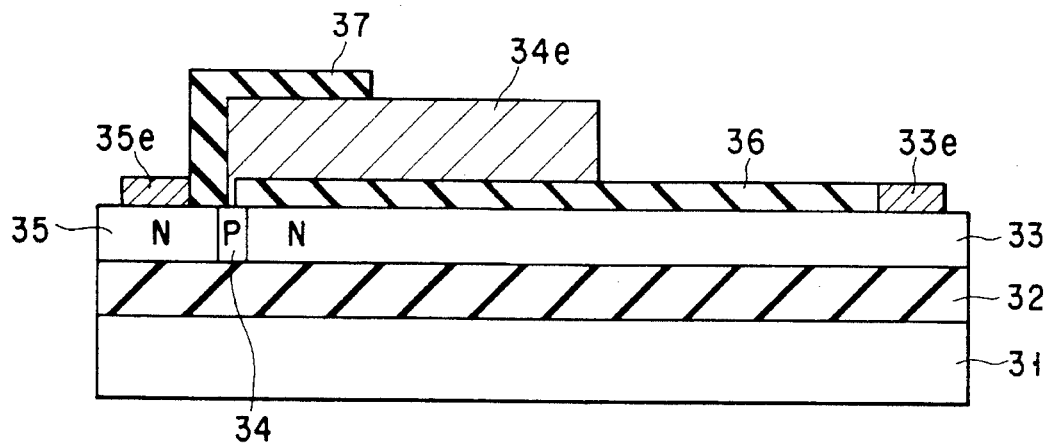
FIGS. 9B and 9C are sectional views taken along the lines IXB—IXB and IXC—IXC, respectively, of FIG. 9A.
Figure 9C:
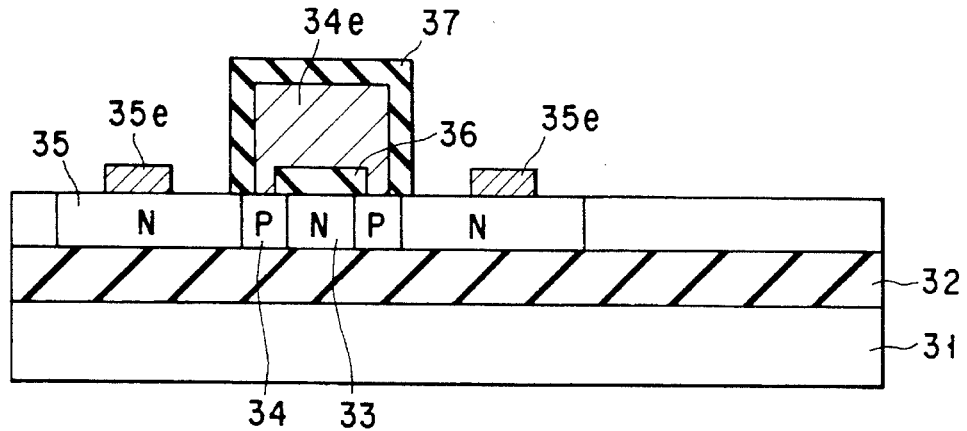

FIG. 9A is a plan view showing a semiconductor device according to the third embodiment of the present invention, and FIGS. 9B and 9C are sectional views taken along the lines IXB—IXB and IXC—IXC, respectively, of FIG. 9A. In this embodiment, an emitter, a base, and a collector are formed on an SOI substrate to be parallel to the SOI substrate.

A semiconductor or silicon layer is formed on an insulting film 32 on a silicon substrate 31, thus forming an SOI substrate. A base 34 and a collector 35 are concentrically formed on the major surface of the SOI substrate around an emitter 33. An electrode 33e of the emitter 33 is connected by forming a groove in the silicon layer on the oxide film 32 and burying an emitter electrode 33e in this groove.

An electrode 34e of the base 34 is connected by forming a contact hole in an insulating film 36 formed on the surface of the substrate and forming an electrode on the insulating of film 36 including the contact hole. An electrode 35e of the collector 35 is connected by directly forming an electrode on the collector 35. Reference numeral 37 denotes an insulating film covering the base 34.

Embodiment 4

Figure 10A:
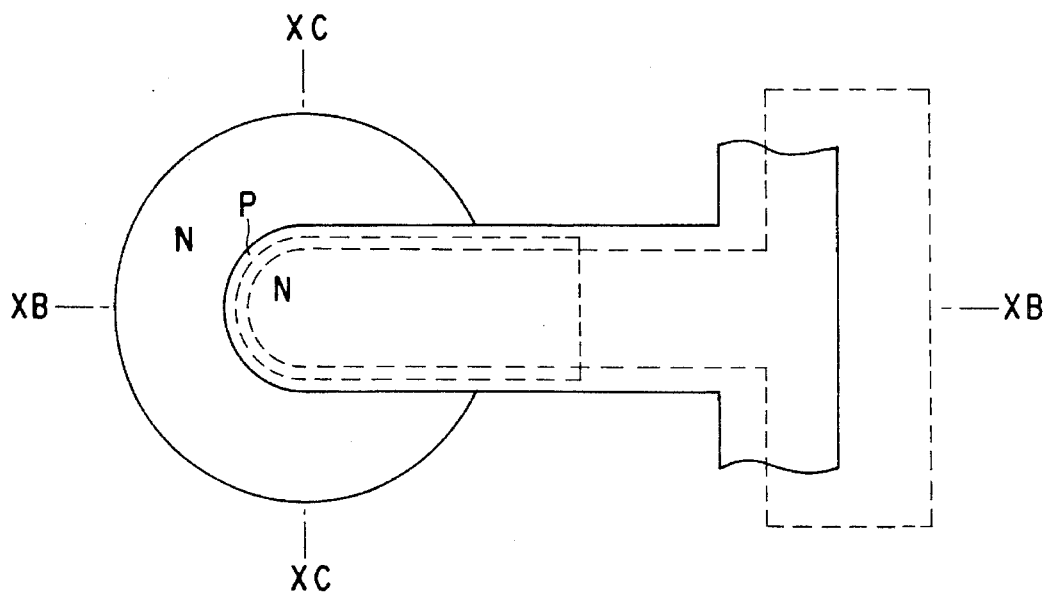
FIG. 10A is a plan view showing a bipolar transistor according to the fourth embodiment of the present invention.
Figure 10B:
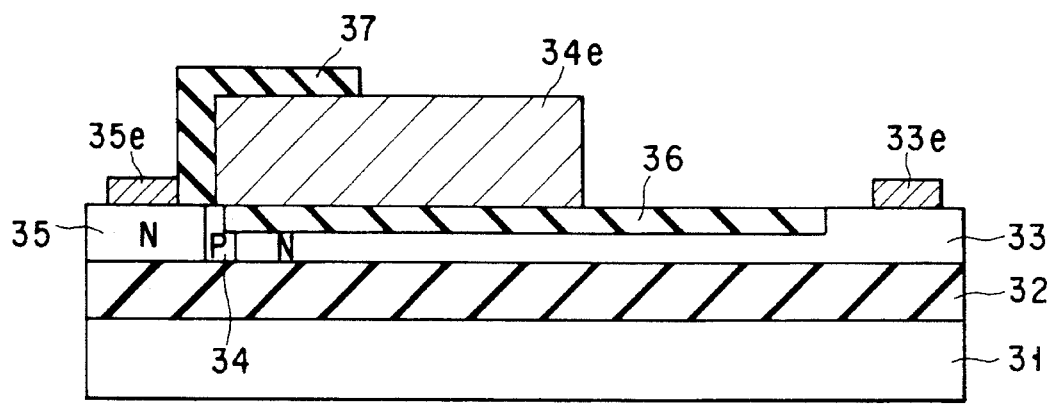
FIGS. 10B and 10C are sectional views taken along the lines XB—XB and XC—XC, respectively, of FIG. 10A.
Figure 10C:
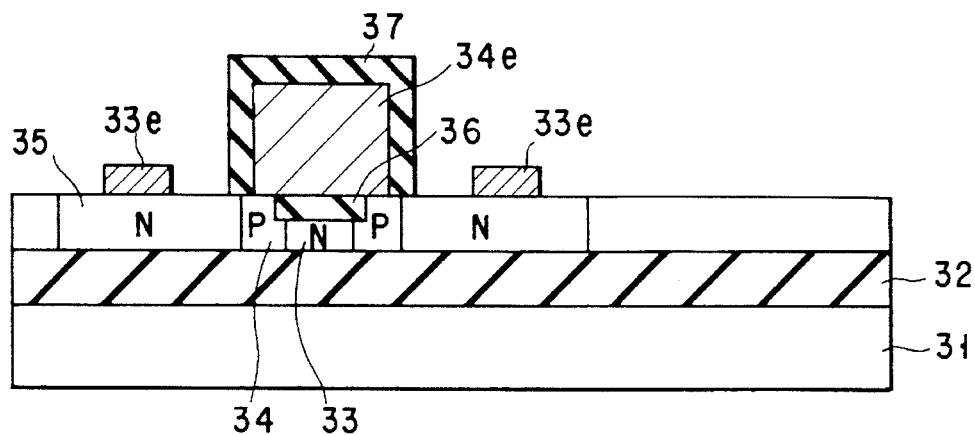

FIG. 10A is a plan view showing a semiconductor device according to the fourth embodiment of the present invention, and FIGS. 10B and 10C are sectional views taken along the lines XB—XB and XC—XC, respectively, of FIG. 10A. The basic structure of this embodiment is the same as that of the third embodiment except that recessed portions are formed in part of an emitter 33 and part of a base 34.

In this embodiment, the effective electron mobility is increased not only in a surface parallel to the SOI substrate, but also in a direction perpendicular to the SOI substrate while decreasing the junction capacitance between the emitter 33 and the base 34, due to the recessed portions.

Embodiment 5

Figure 11A:
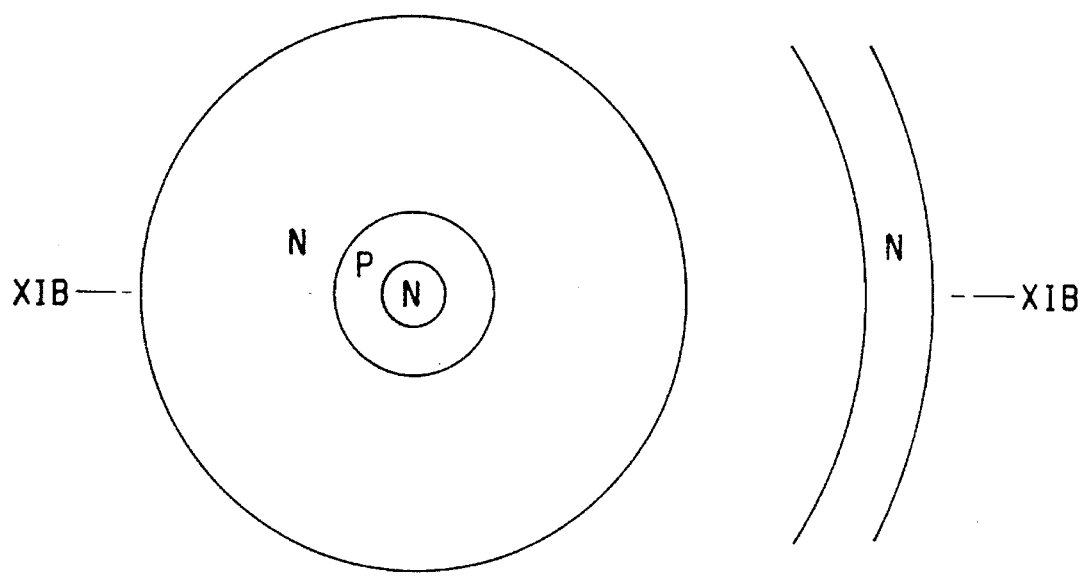
FIG. 11A is a plan view showing a bipolar transistor according to the fifth embodiment of the present invention.
Figure 11B:
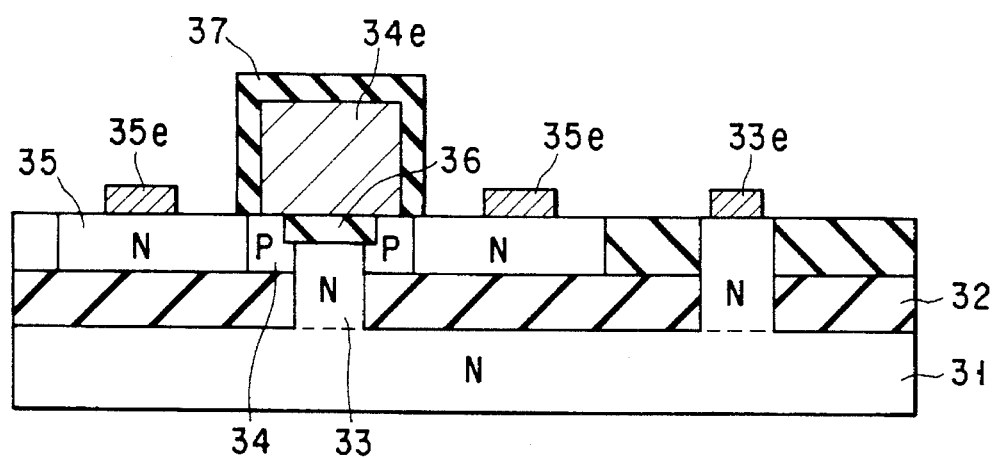
FIG. 11B is a sectional view taken along the line XIB—XIB of FIG. 11A.

FIG. 11A is a plan view showing a semiconductor device according to the fifth embodiment of the present invention, and FIG. 11B is a sectional view taken along the line XIB—XIB of FIG. 11A. The basic structure of this embodiment is the same as that of the fourth embodiment except that an electrode of an emitter 33 is connected from under an insulating film 32. More specifically, a silicon substrate 31 is made of heavily doped n-silicon, and an opening is formed in the insulting film 32 to cause the emitter 33 and the substrate 31 to directly contact with each other.

With this structure, the emitter electrode can be easily connected from the central portion of the element.

Embodiment 6

Figure 12A:
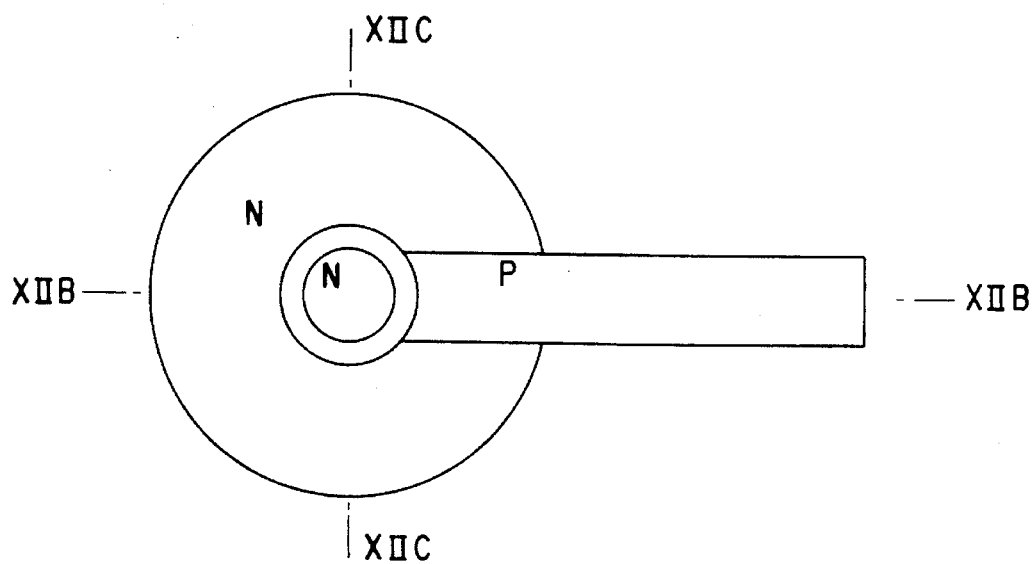
FIG. 12A is a plan view showing a bipolar transistor according to the sixth embodiment of the present invention.
Figure 12B:
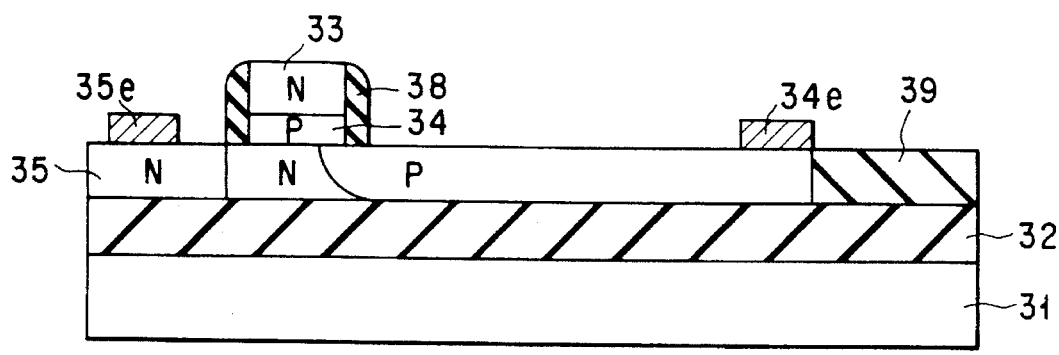
FIGS. 12B and 12C are sectional views taken along the lines XIIB—XIIB and XIIC—XIIC, respectively, of FIG. 12A.
Figure 12C:
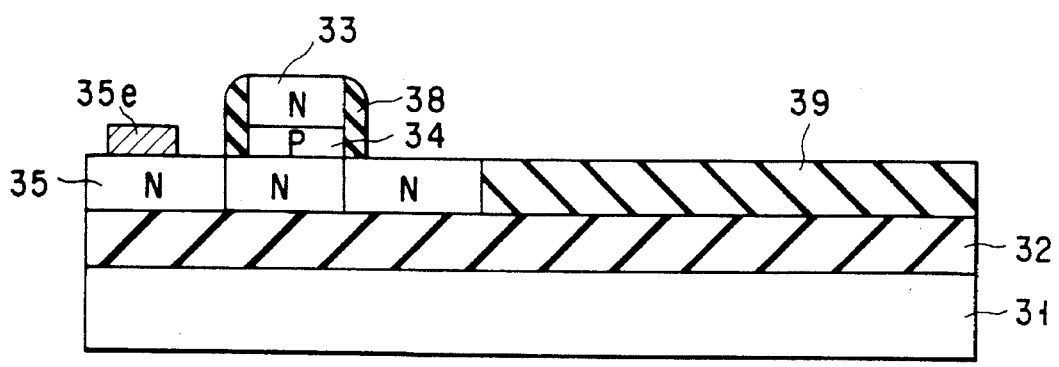

FIG. 12A is a plan view of a semiconductor device according to the sixth embodiment of the present invention, and FIGS. 12B and 12C are sectional views taken along the lines XIIB—XIIB and XIIC—XIIC, respectively, of FIG. 12A. Unlike the third to fifth embodiments, in this embodiment, an emitter 33 and a base 34 are stacked on an SOI substrate to be perpendicular to the SOI substrate, and a base extraction electrode and a collector 35 are formed to be parallel to the SOI substrate. Reference numerals 38 and 39 denote insulating films.

Embodiment 7

According to this embodiment, an emitter, a base, and a collector are annularly formed, and a silicide film is formed on part of the emitter. FIGS. 13A to 13J are sectional views sequentially showing the manufacturing steps of a semiconductor device according to the seventh embodiment of the present invention, and FIGS. 14A to 14G are plan views sequentially showing these manufacturing steps.

Figure 14A:
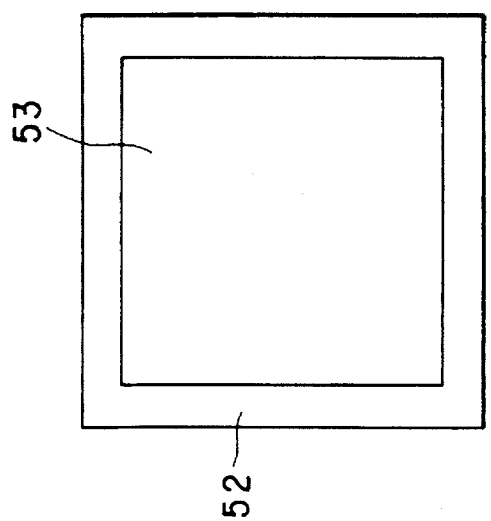
FIGS. 14A to 14G are plan views sequentially showing the manufacturing steps of the seventh embodiment.
Figure 13A:
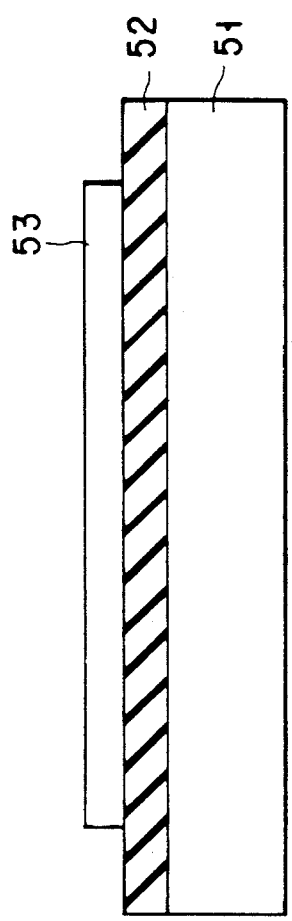
FIGS. 13A to 13J are sectional views sequentially showing the manufacturing steps of a bipolar transistor according to the seventh embodiment of the present invention.
Figure 13B:
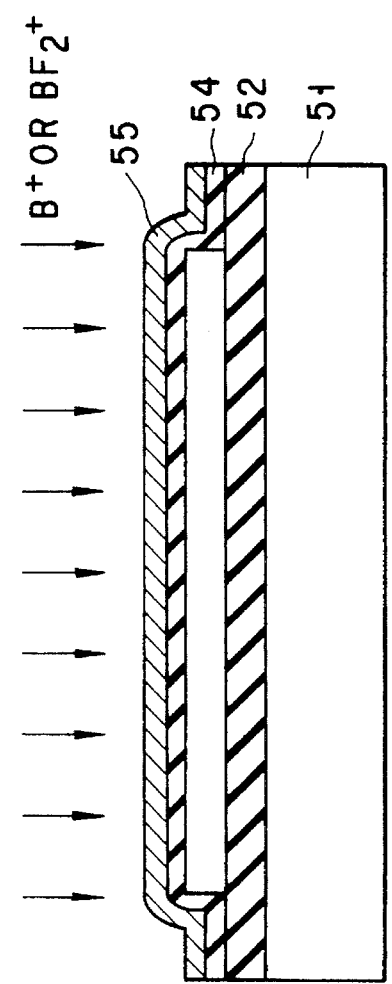

In this embodiment, as shown in FIGS. 13A and 14A, a silicon oxide film 52 and an n-monocrystalline silicon layer 53 are formed on a silicon substrate 51, thus forming an SOI substrate. The n-monocrystalline silicon layer 53 is patterned in accordance with photolithography and RIE. Thereafter, as shown in FIG. 13B, a silicon oxide film 54 and a polycrystalline silicon film 55 are deposited on the entire surface of the resultant structure, and boron is ion-implanted.

Figure 14B:
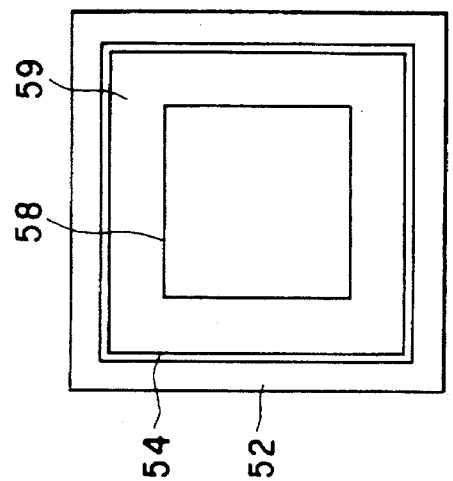
Figure 13C:
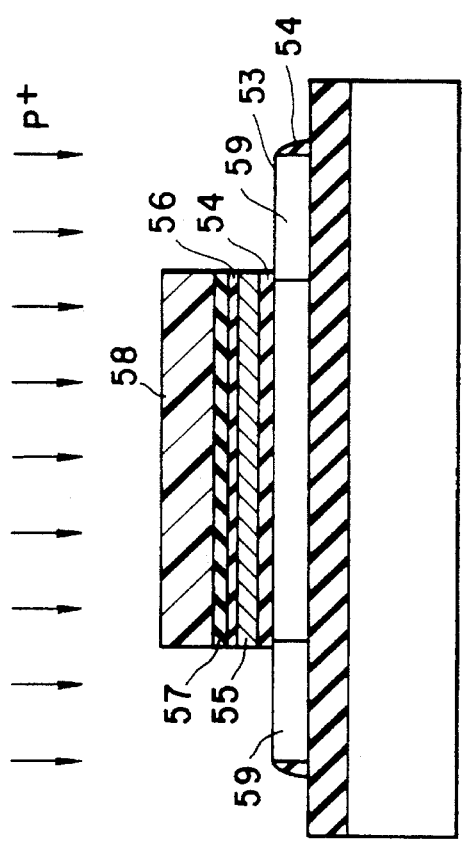
Figure 13D:
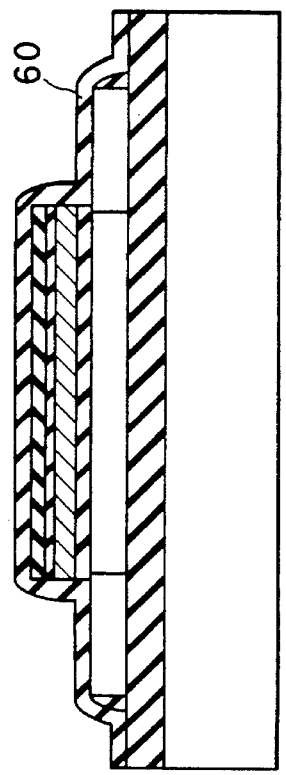

Subsequently, as shown in FIGS. 13C and 14B, a silicon oxide film 56 and a silicon nitride film 57 are deposited, and the silicon nitride film 57, the silicon oxide film 56, the $p^+$-silicon film 55, and the silicon oxide film 54 are patterned in accordance with photolithography and RIE. Thereafter, phosphorus is ion-implanted by using as a mask a photoresist layer 58 which was used for patterning, thereby forming an $n^+$-diffusion layer 59. Then, as shown in FIG. 13D, a silicon oxide film 60 is deposited on the entire structure, and annealing is performed.

Figure 14C:
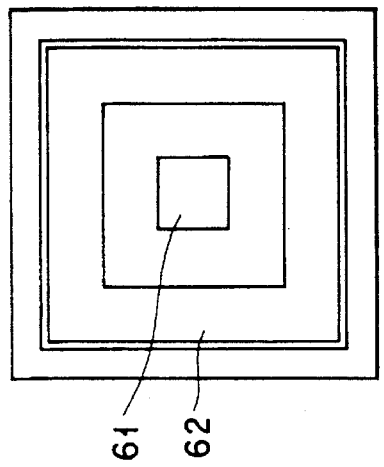
Figure 13E:
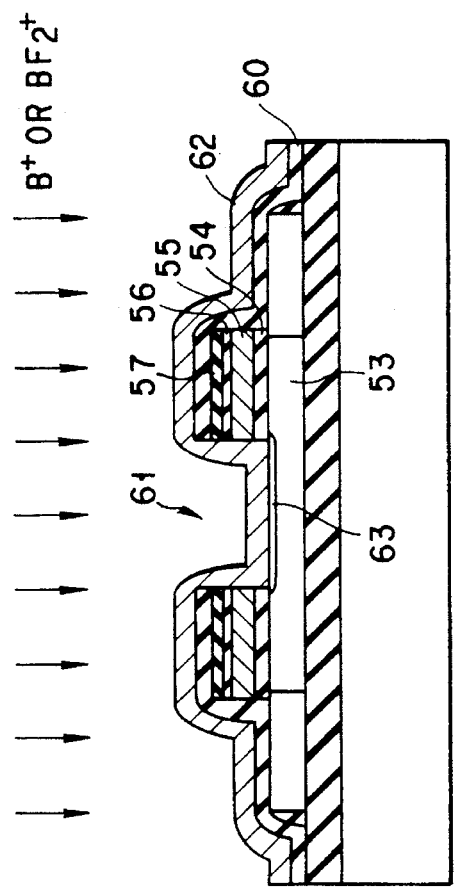

As shown in FIGS. 13E and 14C, an opening 61 is formed in accordance with photolithography and RIE in the silicon oxide film 60, the silicon nitride film 57, the silicon oxide film 56, the p$^+$-silicon film 55, and the silicon oxide film 54 that are deposited on the central portion of the n-monocrystalline silicon layer 53. A polycrystalline silicon film 62 is deposited on the entire surface, boron is ion-implanted, and annealing is performed, thereby converting the polycrystalline silicon film 62 to a p$^+$-silicon film and forming a p$^+$-diffusion layer 63.

Figure 14D:
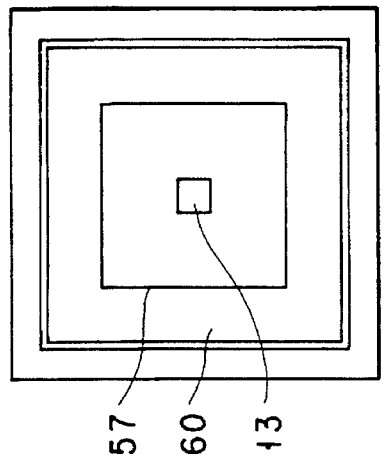
Figure 13F:
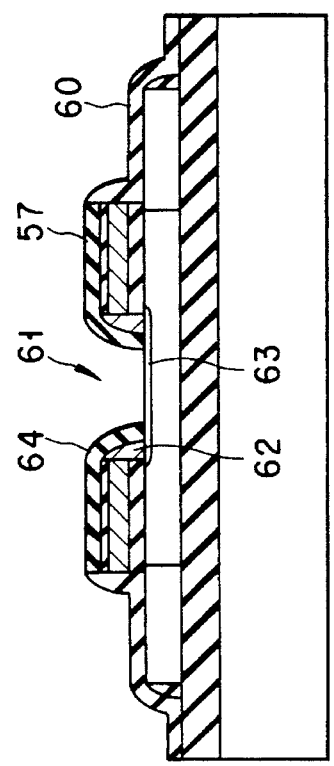

As shown in FIGS. 13F and 14D, the p$^+$-silicon film 62 is etched back by means of RIE to remain on the inner side of the opening 61 as a side wall. Subsequently, a silicon nitride film 64 is deposited on the entire surface and etched back by means of RIE, thereby forming a side wall of the silicon nitride film 64 to cover the p$^+$-silicon film 62 in the opening 61.

Figure 13G:
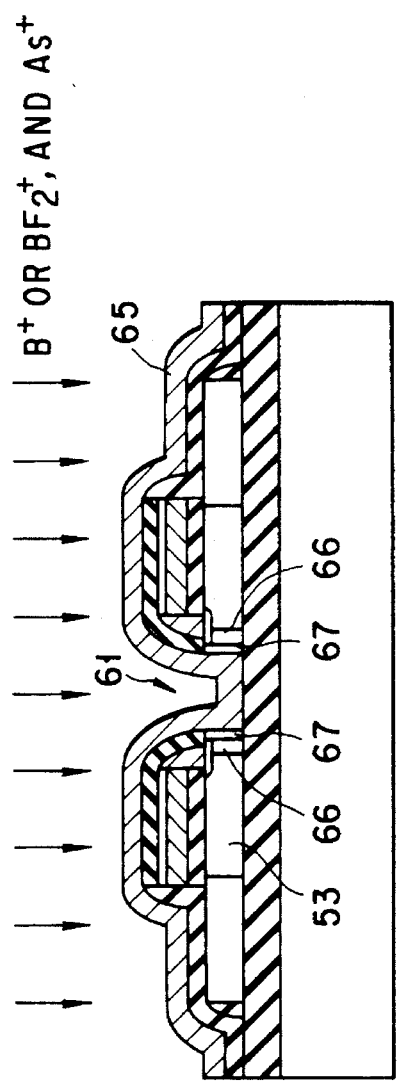

As shown in FIG. 13G, the silicon layer 53 exposed in the opening 61 is etched by means of RIE to form an opening, and a polycrystalline silicon film 65 is deposited on the entire surface. Boron is ion-implanted and annealing is performed to diffuse boron in the n-silicon layer 53, thereby forming a p-diffusion layer 66. Arsenic is ion-implanted and annealing is performed to diffuse arsenic in the silicon layer 53, thereby forming an n$^+$-diffusion layer 67.

Figure 14E:
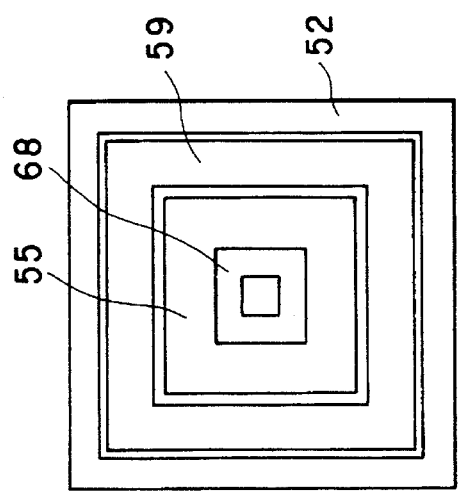
Figure 13H:
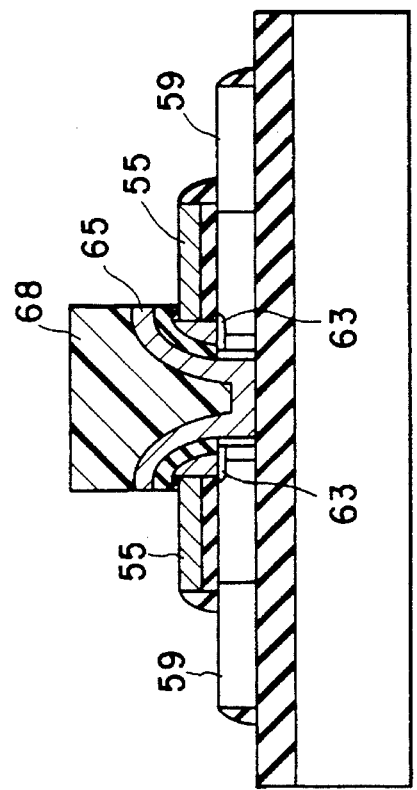

As shown in FIGS. 13H and 14E, a photoresist film 68 is formed in accordance with photolithography, and the n$^+$-silicon film 65, the silicon oxide film 60, the silicon nitride film 57, and the silicon oxide film 56 are etched by means of RIE to expose the p$^+$-silicon film 55 and the n$^+$-diffusion layer 59.

Figure 14F:
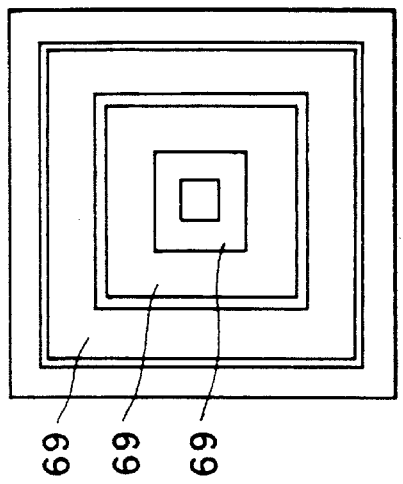
Figure 13I:
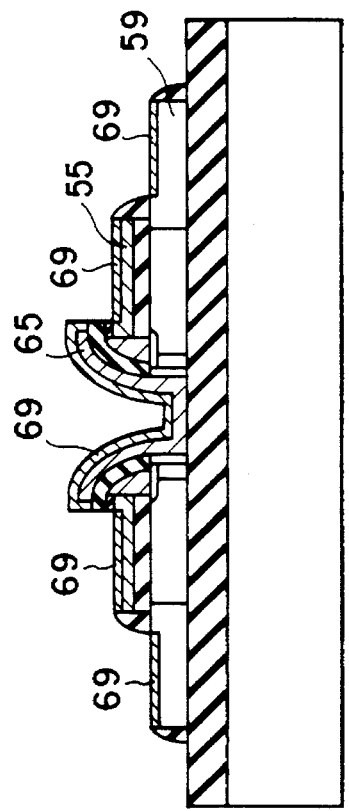

As shown in FIGS. 13I and 14F, the photoresist film 68 is removed, and a silicide film 69 is formed on the exposed surfaces of the n$^+$-silicon film 65, the p$^+$-silicon film 55, and the n$^+$-diffusion layer 59 in accordance with a salicide technique.

Figure 14G:
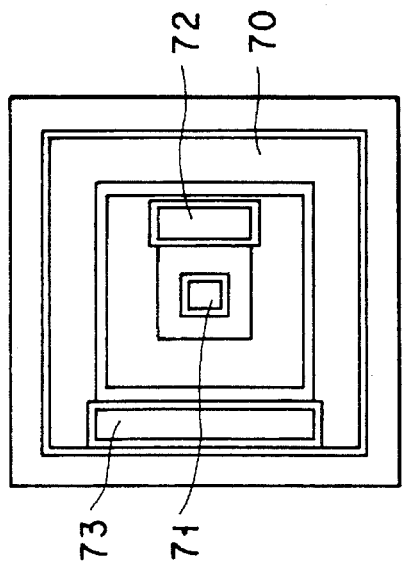
Figure 13J:
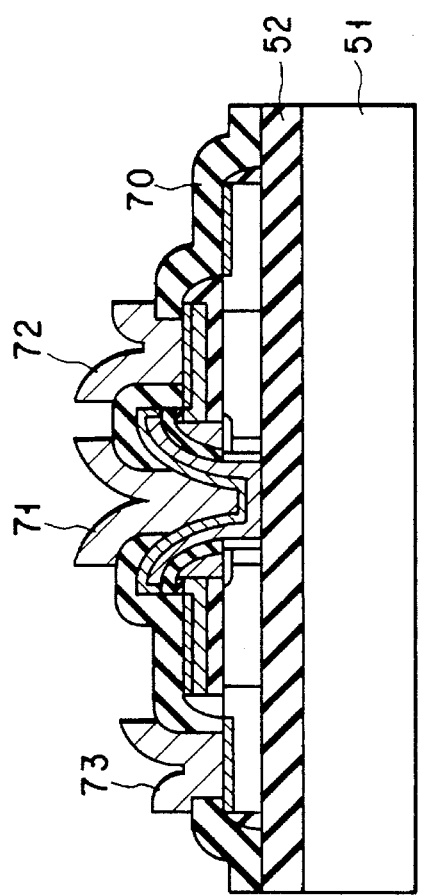

Finally, a silicon oxide film 70 is deposited on the entire surface as a passivation film. Contact holes of the emitter, the base, and the collector are formed in accordance with photolithography and RIE. An aluminum alloy is deposited in the contact holes and patterned to form an emitter electrode 71, a base electrode 72, and a collector electrode 73, thereby obtaining a bipolar transistor having a structure as shown in FIGS. 13J and 14G.

Embodiment 8

FIGS. 15A to 15H are sectional views sequentially showing the manufacturing steps of a semiconductor device according to the eighth embodiment of the present invention, and FIGS. 16A to 16D are plan views sequentially showing these manufacturing steps.

Figure 16A:
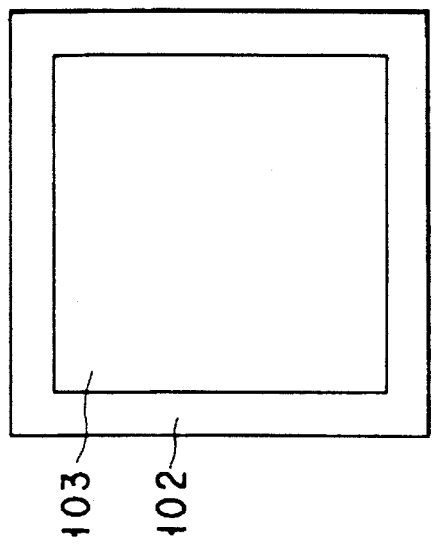
Figure 15A:
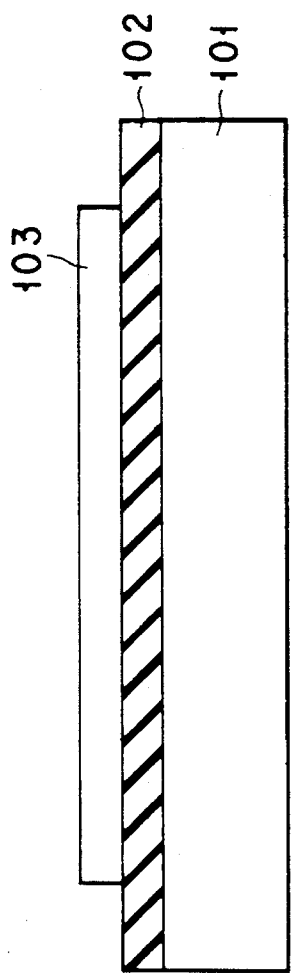

In this embodiment, first, as shown in FIGS. 15A and 16A, a silicon oxide film 102 and an n-monocrystalline silicon layer 103 are formed on a silicon substrate 101, thereby forming an SOI substrate, and the n-monocrystalline silicon layer 103 is patterned in accordance with photolithography and RIE, in the same manner as in the seventh embodiment.

Figure 15B:
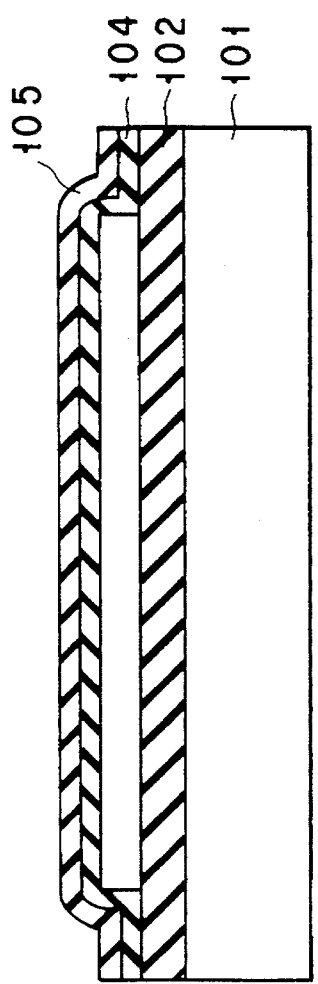

As shown in FIG. 15B, a silicon nitride film 104 and a silicon oxide film 105 are deposited on the entire surface. At this time, the silicon nitride film 104 is set to have a thickness equal to the thickness of the designed base layer or less.

Figure 16B:
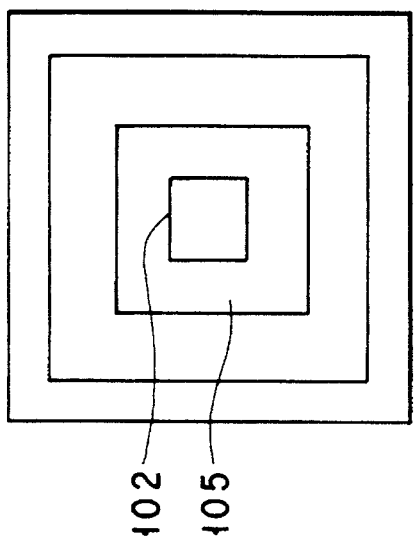
Figure 15C:
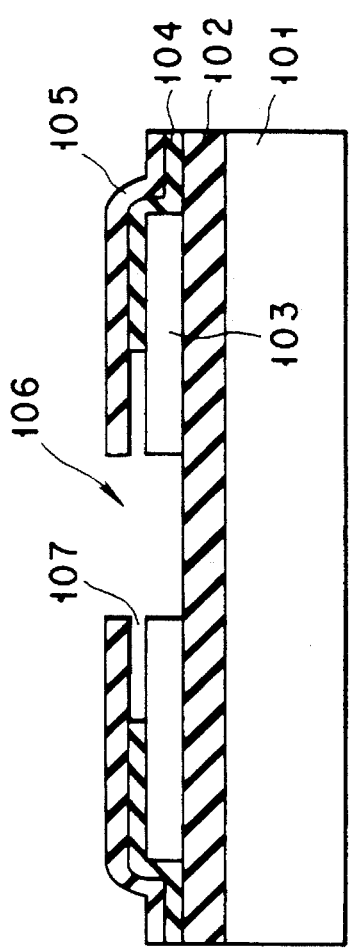

As shown in FIGS. 15C and 16B, the central portion of the n-silicon layer 103, and the silicon nitride film 104 and the silicon oxide film 105 deposited on this n-silicon layer 103 are patterned to form an opening 106. The silicon nitride film 104 is isotropically etched by using hot phosphate or the like, thereby forming a side-etched portion 107.

Figure 15D:
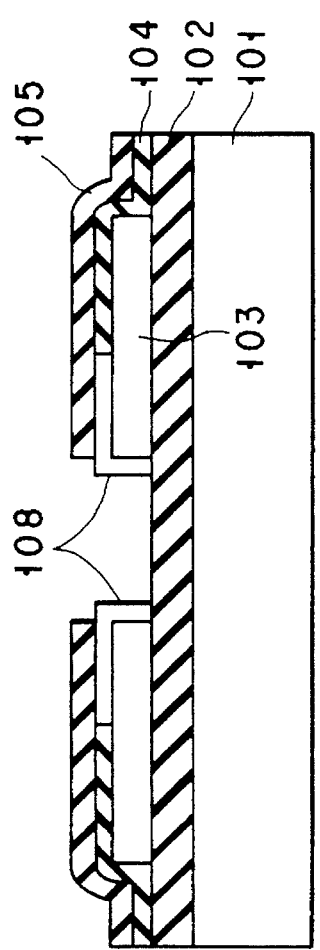

As shown in FIG. 15D, a p-monocrystalline silicon film 108 serving as a prospective base layer is formed on the exposed surface of the silicon layer 103 by using a selective epitaxial technique. At this time, since the thickness of the silicon film 108 is larger than that of the side-etched portion 107, the cavity of the side-etched portion 107 is completely filled.

As shown in FIGS. 15E and 16C, an arsenic-doped n$^+$-polycrystalline silicon film 109 is deposited, and a photoresist mask 110 is formed in accordance with photolithography. The silicon film 109 and the silicon oxide film 105 are patterned by means of RIE by using the photoresist mask 110 as a mask, and boron is ion-implanted, thereby forming a p$^+$-diffusion layer 111 on part of the silicon film 108.

As shown in FIGS. 15F and 16D, a photoresist mask 112 is formed in accordance with photolithography to cover the entire portions of the silicon film 109 and the silicon film 108 and part of the silicon nitride film 104, and the silicon nitride film 104 is patterned by RIE. Thereafter, phosphorus is ion-implanted to form an n$^+$-diffusion layer 113 around the silicon layer 103. Then, annealing is performed in order to activate the impurities and to diffuse arsenic from the n$^+$-silicon film 109 to the p-silicon film 108, thereby forming an emitter diffusion layer.

Figure 15G:
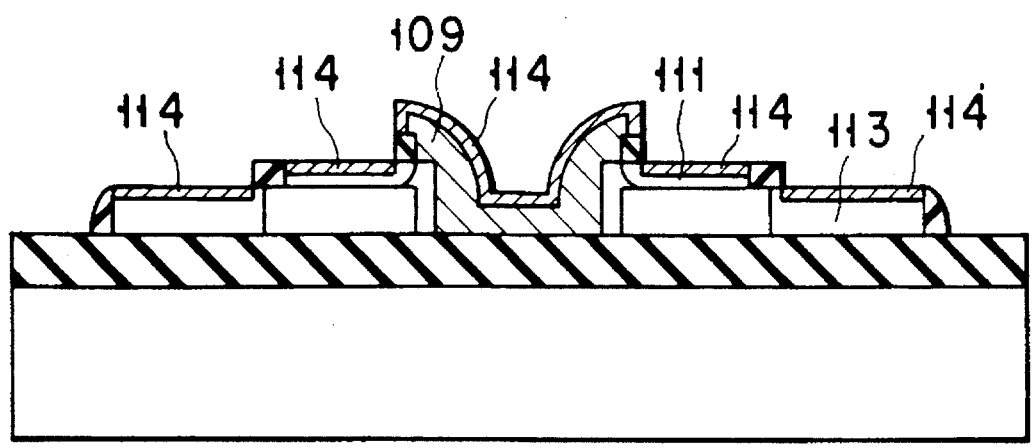

As shown in FIG. 15G, the photoresist is removed, and a silicide film 114 is formed on the exposed surfaces of the n$^+$-silicon film 109, the p$^+$-diffusion layer 111, and the n$^+$-diffusion layer 113 in accordance with the salicide technique.

Figure 15H:
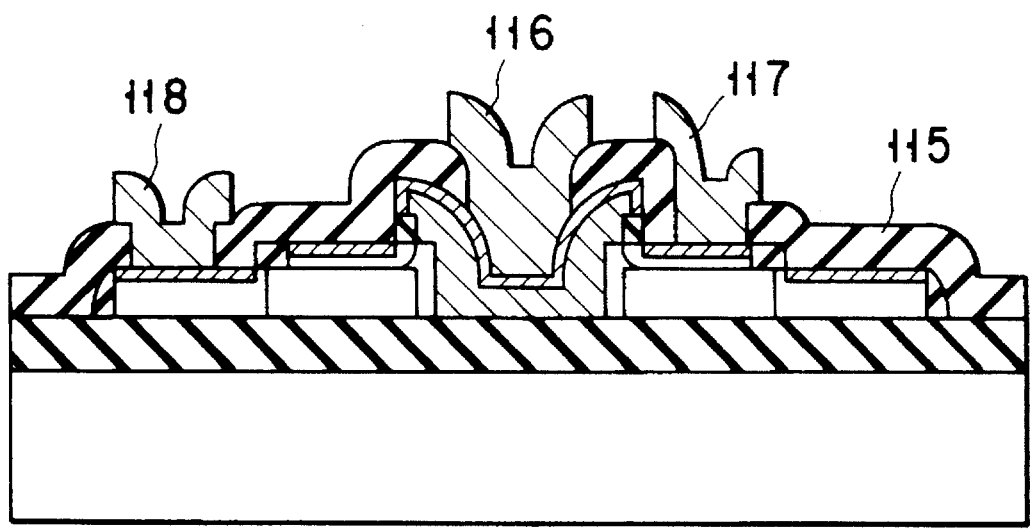

Finally, a silicon oxide film 115 is deposited on the entire surface as a passivation film. The contact holes of the emitter, base, and collector are formed in accordance with photolithography and RIE. An aluminum alloy is deposited in the contact holes and patterned to form an emitter electrode 116, a base electrode 117, and a collector electrode 118, thereby obtaining a bipolar transistor having a structure as shown in FIG. 15H.

In the seventh and eighth embodiments, polycrystalline silicon of the emitter electrode portion is formed square. The same effect can be obtained by forming this portion into an arbitrary polygon (e.g., a rectangle, a hexagon, or an octagon), a circle, or an ellipse.

The element of the seventh or eighth embodiment may be formed such that polycrystalline silicon of the emitter electrode portion becomes rectangular. After the silicide film in FIG. 13I or 15G is formed, a portion of the silicide film formed on the silicon oxide film 52 or 102 on the two sides including part of the n$^+$-polycrystalline silicon film 65 or 109 is patterned. Then, one element can be divided into two halves.

In the eighth embodiment, the emitter diffusion layer is formed by diffusion from the n$^+$-polycrystalline silicon film 109. However, when the p-monocrystalline silicon film 108 is formed by selective growth, the n$^+$-polycrystalline silicon film 109 can be formed continuously by epitaxial growth.

As described above, according to the seventh and eighth embodiments, since the emitter, base, and collector regions of the bipolar transistor are horizontally aligned with respect to the substrate surface in a one-dimensional manner, a heavily doped buried layer for connecting the collector becomes unnecessary. Then, not only the parasitic resistance and the parasitic capacitance of the element can be decreased, but also a complicated insulating region manufacturing technique for isolating the emitter and base regions from the collector electrode becomes unnecessary. Therefore, the manufacturing steps can be simplified, resulting in a decreased manufacturing cost. Since the emitter region is annularly formed, the element area is decreased for elements having the same emitter length, thus enabling a higher integration degree.

According to the viewpoint of the first to eighth embodiments of the present invention, there is provided a semiconductor device in which a bipolar transistor is formed on an insulating substrate, comprising a first projecting semiconductor region formed on part of the insulating substrate and serving as an emitter or collector, a second projecting semiconductor region formed to cover the first projecting semiconductor region and serving as a base, and a third projecting semiconductor region formed to cover the second projecting semiconductor region and serving as the collector or emitter.

The preferable aspects of the present invention in this viewpoint are as follows.

(1) The first and third projecting semiconductor regions are the emitter and the collector, respectively.

(2) The insulating substrate has a structure in which an insulating film is formed on a semiconductor substrate. The insulating substrate is an SOI substrate using the bonding technique of the semiconductor substrate, or an SOI substrate using an SIMOX technique.

(3) The first projecting semiconductor region has an electrode core made of a metal or metal silicide.

(4) The first projecting semiconductor region is not made of a semiconductor but is made of a metal or metal silicide.

(5) In a method of manufacturing the above semiconductor device, a semiconductor layer is formed on an insulating substrate, thereafter this semiconductor layer is selectively etched to form the first projecting semiconductor region, subsequently the second projecting semiconductor region is formed by deposition to cover the first projecting semiconductor region, and then the third projecting semiconductor region is formed by deposition to cover the second projecting semiconductor region.

(6) Before the first projecting semiconductor region is formed, a projecting region made of a metal or metal silicide is formed on the insulating substrate, and this projecting region is used as a core of a first projecting semiconductor region.

(7) The first to third projecting semiconductor regions are formed by epitaxial growth.

According to this viewpoint of the present invention, since the projecting semiconductor regions respectively serving as prospective emitter, base and collector are formed on the insulating substrate, the parasitic capacitance between the projecting semiconductor regions and the substrate does not pose a problem. More specifically, when an insulating substrate obtained by forming an insulating film on a semiconductor substrate is used, since the respective projecting semiconductor regions, and particularly the collector is completely isolated from the semiconductor substrate by the insulating film, the parasitic capacitance between the collector and the semiconductor substrate can be decreased by appropriately selecting the thickness of the insulating film. Since the collector electrode can be connected from above the collector, long wiring need not be connected to the collector, unlike in the conventional technique. Thus, the area of this portion can be sufficiently decreased, thereby greatly decreasing the parasitic resistance and the parasitic capacitance. As a result, the problem of a low switching speed of the bipolar transistor can be solved.

Embodiment 9

According to this embodiment, a lateral bipolar transistor is formed on an SOI substrate. FIGS. 17A to 17E are sectional views sequentially showing the manufacturing steps of an SOI lateral bipolar transistor according to the ninth embodiment of the present invention.

Figure 17A:
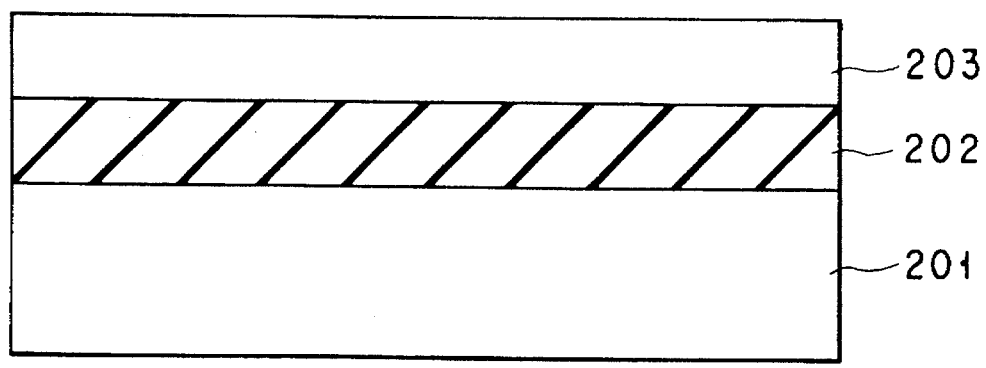

As shown in FIG. 17A, an n-silicon layer (active layer) 203 is formed on a silicon oxide film 202 on a support substrate 201, thereby preparing an SOI substrate. As the silicon layer 203 of this SOI substrate, a comparatively lightly doped (~1×10$^{16}$ cm$^{-3}$) n-type silicon layer is used. The silicon layer 203 has a (100) plane on its surface.

Figure 17B:
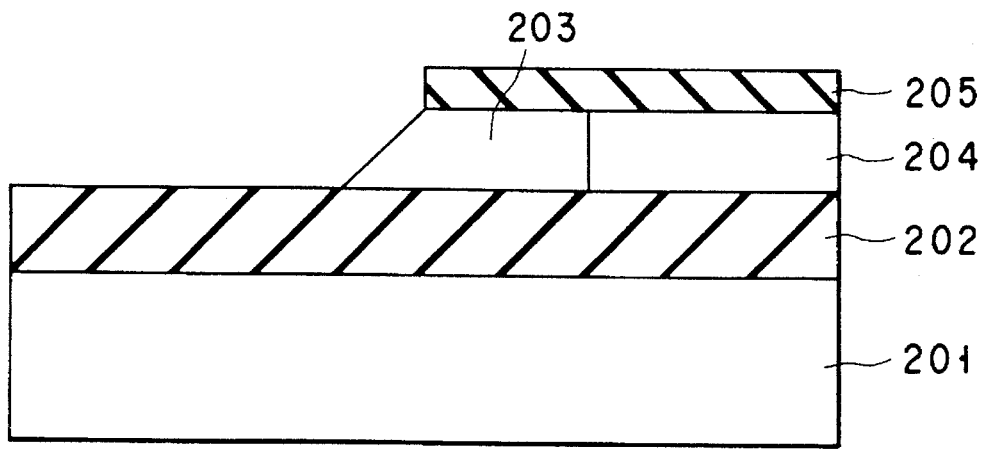

Subsequently, by using a resist mask, an impurity having a first conductivity type, e.g., antimony (Sb) is selectively added to the silicon layer 203 in accordance with ion implantation to form an n$^+$-external collector region 204 having a high impurity concentration of about 1×10$^{20}$ cm$^{-3}$. Subsequently, a CVD silicon oxide film 205 is formed as a second insulating film on the entire surface of the substrate to have a thickness of about 300 nm. Thereafter, the oxide film 205 is removed in accordance with photolithography and etching to remain only near the collector region. As shown in FIG. 17B, by using the remaining oxide film 205 as a mask, the silicon layer 203 is wet-etched with an alkali solution, e.g., an aqueous KOH solution, until the silicon oxide film 202 is exposed. With the aqueous KOH solution, the silicon etching rate is faster in the <111> direction, and a (111) plane of silicon is exposed after etching.

Figure 17C:
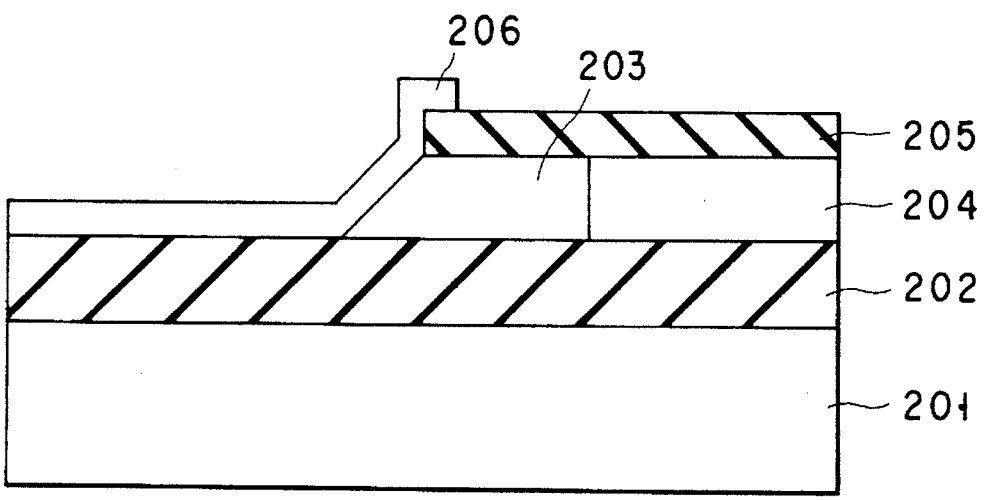

As shown in FIG. 17C, a p-Si layer 206 doped with boron (B) to about (~1×10$^{18}$ cm$^{-3}$) is formed as a semiconductor layer on the entire surface of the substrate to have a thickness of about 100 nm by epitaxial growth, thus forming a p-intrinsic base region 207. At this time, monocrystalline silicon grows on the silicon layer 203 having a (111) plane exposed on its surface, and polycrystalline silicon grows on the oxide films 202 and 205.

If the silicon layer 203 is etched perpendicularly to the (100) plane not with the aqueous KOH solution but in accordance with, e.g., RIE, a (110) plane is exposed in the vertical section of the layer 203. Epitaxial growth on the (110) plane is difficult, and polycrystalline silicon tends to form. Polycrystalline silicon has a higher resistance than monocrystalline silicon. Thus, the resistance of the obtained base layer is increased.

Boron is further ion-implanted at about (~1×10$^{16}$ cm$^{-2}$) in order to form a p$^+$-external base region 208 near the base electrode connecting portion. Subsequently, a portion of the epitaxial layer in the non-required region is removed in accordance with photolithography and etching.

As shown in FIG. 17D, an n$^+$-polycrystalline silicon layer 209 doped with arsenic (As) to about (~×10$^{20}$ cm$^{-3}$) is formed on the entire surface of the substrate to have a thickness of about 200 nm as a first conductor, thereby forming an emitter region 210.

As shown in FIG. 17E, polycrystalline silicon in the non-required region is removed in accordance with photolithography and etching. Contact holes are formed in the respective regions, and an aluminum film is formed on the entire surface of the substrate. The aluminum film is patterned by employing photolithography and etching to form electrode wiring 211, thereby completing a bipolar transistor.

In this embodiment, since the lateral bipolar transistor is formed on the SOI substrate, all the diffusion layers of the emitter, base, and collector can be formed on the uppermost surface layer of the substrate. Accordingly, heavily doped layers for connecting electrodes become unnecessary, so that a parasitic resistance and a parasitic capacitance generated by the electrode-connecting layers can be decreased. Due to the above effects, a high-speed, high-performance bipolar transistor integrated circuit can be obtained.

Embodiment 10

In this embodiment, a lateral bipolar transistor is formed on an SOI substrate as in the ninth embodiment. FIGS. 18A to 18F are sectional views sequentially showing the manufacturing steps of an SOI lateral bipolar transistor according to the tenth embodiment of the present invention.

As shown in FIG. 18A, a comparatively lightly doped ($\sim 1 \times 10^{16}$ cm$^{-3}$) n-type silicon layer is used as a second silicon layer (active layer) 303 of the SOI substrate. Reference numeral 301 denotes a support substrate serving as a first silicon layer; and 302, an oxide film serving as a first insulating film. The silicon layer 303 has a (100) plane on its surface.

By using a resist mask, an impurity having a first conductivity type, e.g., Sb is selectively added to the n-Si layer 303 by ion implantation, thereby forming an n$^+$-external collector region 304 having a high impurity concentration of about $1 \times 10^{30}$ cm$^{-3}$. Subsequently, a CVD silicon oxide film 305 is formed as a second insulating film on the entire surface of the substrate to a thickness of about 300 nm. Thereafter, the oxide film 305 is removed in accordance with photolithography and etching to remain only near the collector region. As shown in FIG. 18B, a p$^+$-polycrystalline silicon film 306 doped with boron to about ($\sim 1 \times 10^{20}$ cm$^{-3}$) is formed to have a thickness of about 200 nm.

As shown in FIG. 18C, the silicon film 306 is removed in accordance with photolithography and etching to cover the silicon oxide film 305. Thereafter, a CVD silicon oxide film 307 is formed as a third insulating film on the entire surface of the substrate to have a thickness of about 100 nm.

Figure 18D:
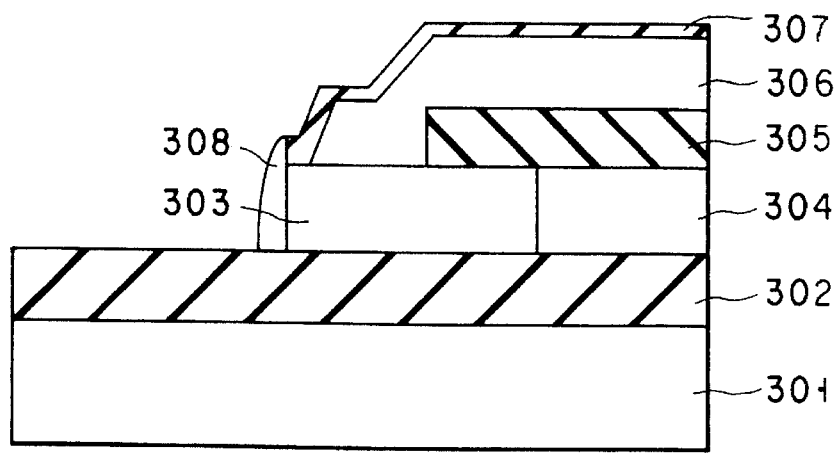

As shown in FIG. 18D, the silicon oxide film 307 and the silicon layer 303 are removed in accordance with photolithography and etching to leave a portion covering the silicon film 306. In this embodiment, the exposed end face of the silicon layer 303 substantially forms a right angle with respect to the upper surface of the insulating film 302. Subsequently, a p-polycrystalline silicon film 308 doped with boron (B) to about ($\sim 1 \times 10^{18}$ cm$^{-3}$) is formed as a second conductor of the substrate to have a thickness of about 100 nm. Thereafter, the silicon film 308 is etched by reactive ion etching to remain only on the exposed end faces of the CVD silicon oxide film 307 and the second silicon layer 303, thereby forming the side wall of the p-polycrystalline silicon film 308.

Figure 18E:
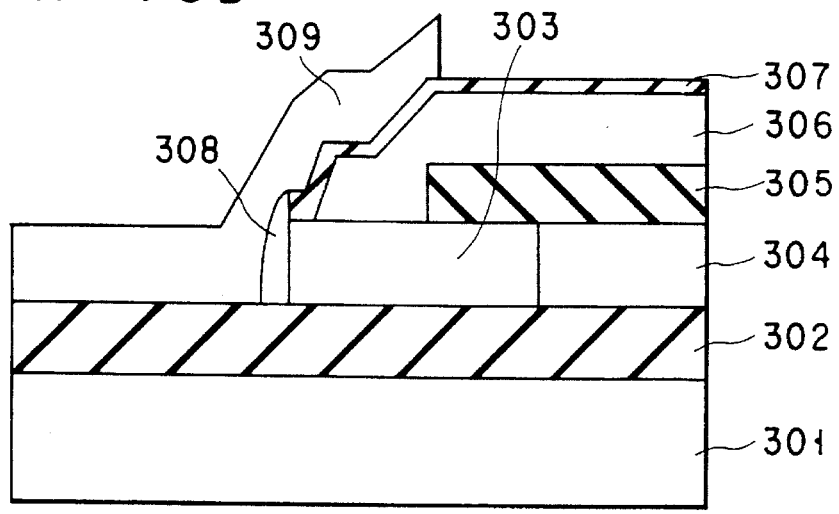

As shown in FIG. 18E, an n$^+$-polycrystalline silicon film 309 doped with arsenic (As) to about ($\sim 1 \times 20^{20}$ cm$^{-3}$) is formed on the entire surface of the substrate to have a thickness of about 200 nm. Subsequently, a portion of the n$^+$-polycrystalline silicon film 309 in a non-required region is removed by employing photolithography and etching.

Figure 18F:
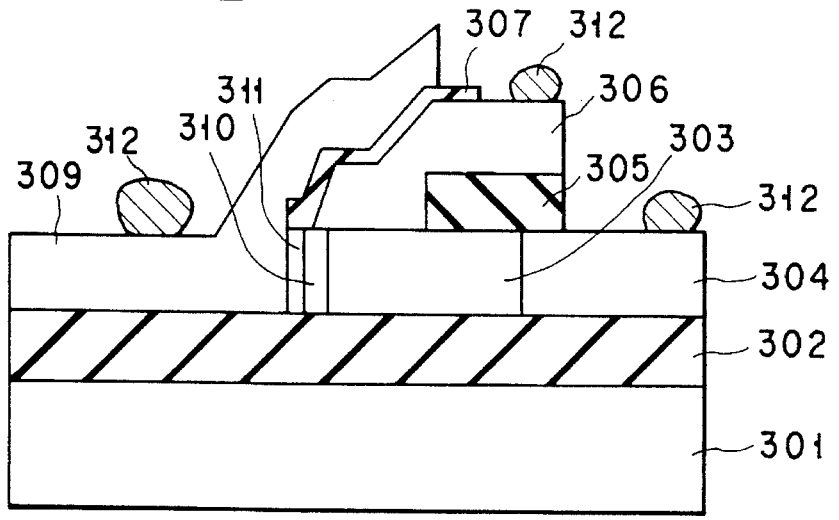

Lamp annealing at 1,000° C. for about 20 seconds, or the like is performed to diffuse boron and arsenic from the silicon films 308 and 309, respectively, to the silicon layer 303, thereby forming a p-intrinsic base region 310 and an n-intrinsic emitter region 311 in the silicon layer 303, as shown in FIG. 18F. Thereafter, contact holes are formed in the respective regions, and an aluminum film is formed on the entire surface of the substrate. The aluminum film is patterned by using photolithography and etching to form electrode wiring 312, thereby completing a bipolar transistor.

In the above steps, B and As are diffused into the silicon layer 303 simultaneously by one annealing operation by using two solid-phase diffusion sources 308 and 309. In place of this, it is also possible to diffuse B and As in the silicon layer 303 by using one solid-phase diffusion source covering the end face of the silicon layer 303. More specifically, B is caused to be contained in a single solid-phase diffusion source, and is diffused into the silicon layer 303 by first annealing, and then, As is caused to be contained in this solid-phase diffusion source, and is diffused into the silicon layer 303 by second annealing.

In this manner, according to this embodiment, since the lateral bipolar transistor is formed on the SOI substrate, all the diffusion layers of the emitter, base, and collector can be formed on the uppermost surface layer of the substrate. Accordingly, heavily doped layers for connecting electrodes become unnecessary, and parasitic resistance and parasitic capacitance generated by the electrode-connecting diffusion layers can be decreased. Since the emitter and base regions are formed by impurity diffusion from the respective polycrystalline silicon films, they can be formed as regions of almost the same small thickness as those of a vertical transistor. Furthermore, the emitter and base regions have substantially uniform impurity concentrations in a direction parallel to the end face of the silicon layer 303. Due to the above effects, a high-speed, high-performance bipolar integrated circuit can be obtained.

Embodiment 11

According to this embodiment, a lateral bipolar transistor is formed on a conventional SOI substrate, and a base is formed by selective growth of doped silicon, so that the transistor is formed while maintaining a base width equal to or less than that of a vertical bipolar transistor.

Figure 19D:
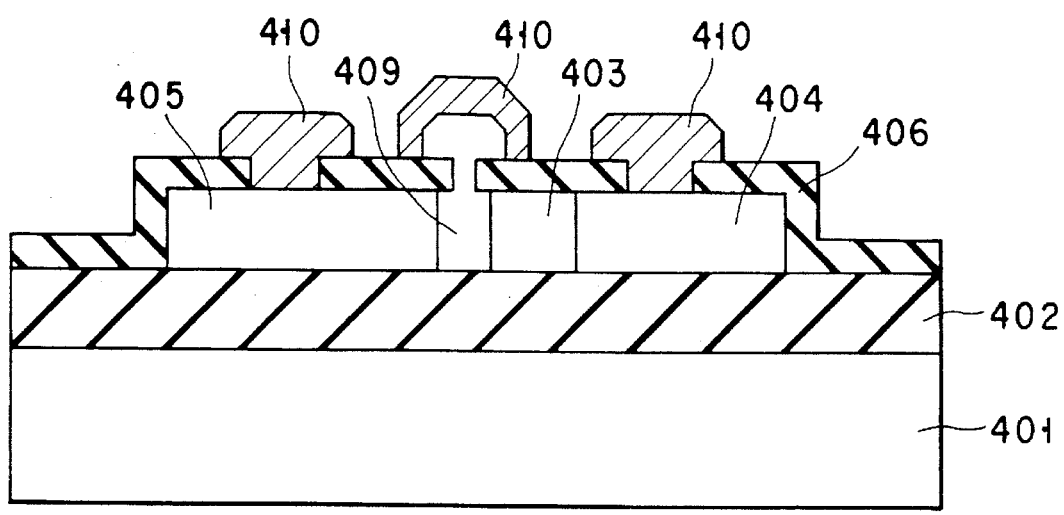
Figure 19E:
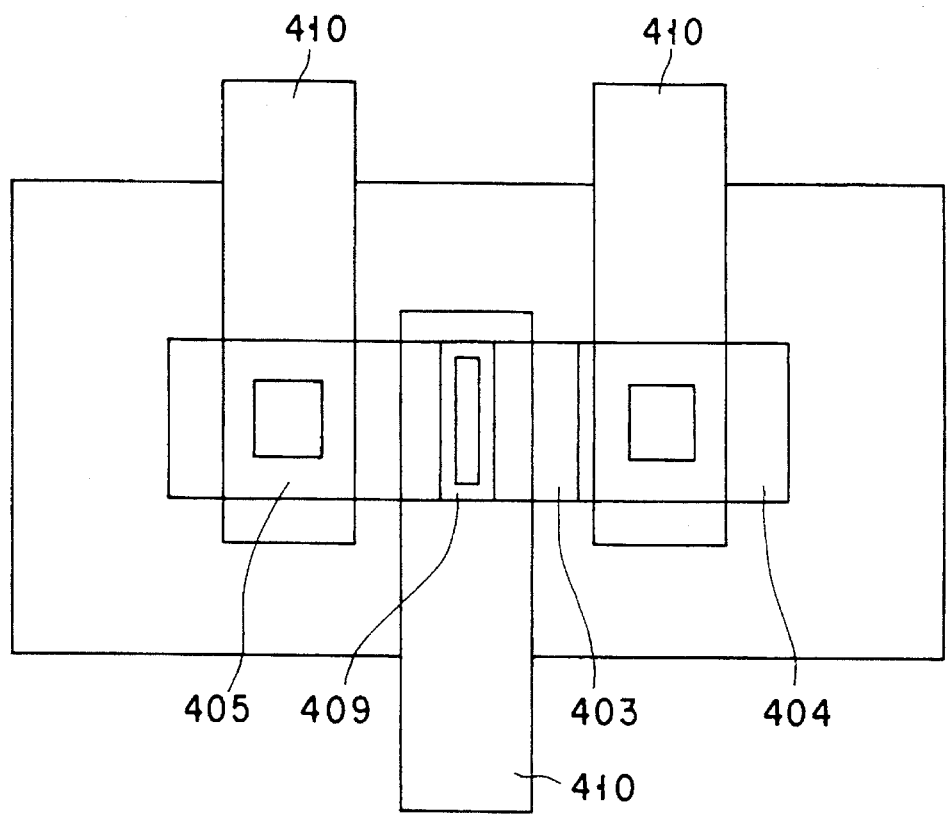
FIG. 19E is a plan view showing the step corresponding to that shown in FIG. 19D.

FIGS. 19A to 19D are sectional views sequentially showing the manufacturing steps of an SOI lateral bipolar transistor according to the eleventh embodiment of the present invention, and FIG. 19E is a plan view corresponding to FIG. 19D.

As shown in FIG. 19A, a comparatively lightly doped ($\sim 1 \times 10^{16}$ cm$^{-3}$) n-type silicon layer is used as a second silicon layer (active layer) 403 of the SOI substrate. Reference numeral 401 denotes a support substrate serving as a first silicon layer; and 402, an oxide film serving as a first insulating film. The Si layer 403 has a (100) plane on its surface.

Subsequently, by using a resist mask, an impurity having a first conductivity type, e.g., Sb, is selectively added to the n-Si layer 403 by ion implantation to form an n$^+$-external collector region 404 and an n$^+$-emitter region 405 having a high impurity concentration of about $1 \times 10^{20}$ cm$^{-3}$. A portion of the Si layer 403 on a region other than the prospective transistor region is removed in accordance with photolithography and reactive ion etching. Thereafter, as shown in FIG. 19B, a CVD silicon oxide film 406 is formed on the entire surface of the substrate as a second insulating film to have a thickness of about 200 nm.

As shown in FIG. 19C, the silicon oxide film 406 is partly removed by employing photolithography and reactive ion etching. The Si layer 403 is etched to slightly leave a thin film 403a, thus forming a trench 408. The depth of the trench 408 is at least ¾ the thickness of the Si layer 403. In this embodiment, while the thickness of the Si layer 403 is 100 to 200 nm, the thickness of the thin film 403a is about 10 nm. The side surface of the trench 408 substantially forms a right angle with respect to the upper surface of the insulating film 402.

If the Si layer 403 is completely etched not to leave a thin film 403a, next selective epitaxial growth is performed on the vertical section of the Si layer 403, i.e., on a (110) plane, which is difficult. Hence, in order to leave the (100) plane as the nucleus of epitaxial growth in the next step, the silicon thin film 403a is slightly left through etching at this step.

A p-monocrystalline silicon film doped with boron to about ($\sim 1 \times 10^{18}$ cm$^{-3}$) is selectively formed as a semiconductor layer only in the trench 408. This silicon film is formed until it projects upward from the trench 408. By lamp annealing, e.g., at 1000° C. for about 20 seconds, boron is diffused from the silicon film in the trench 408 into the Si layer 403 on the two sides, thereby forming a p-base region 409. Thereafter, as shown in FIG. 19D, contact holes are formed in the emitter and collector regions, and an aluminum film is formed on the entire surface of the substrate. The aluminum film is patterned by using photolithography and etching to form electrode wiring 410, thereby completing a bipolar transistor.

Figure 20A:
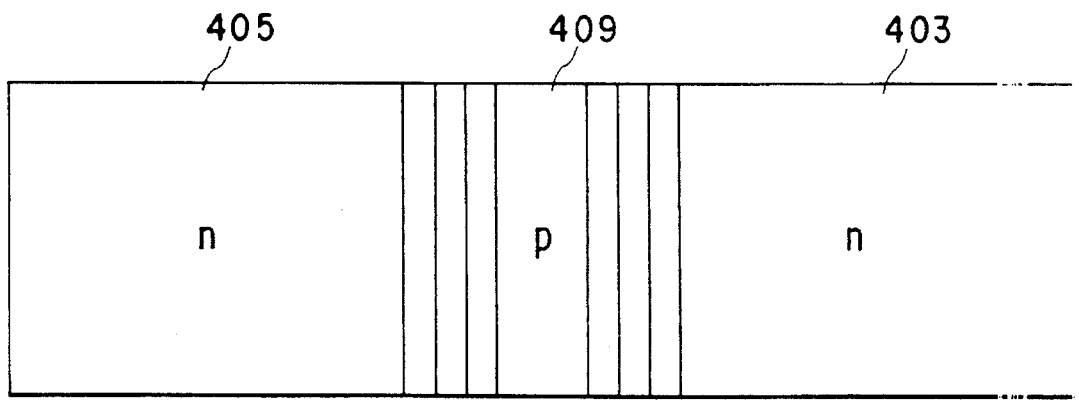
FIGS. 20A and 20B are views showing the equi-concentration lines of the impurity concentration in the base of the transistor according to the eleventh embodiment and in the base of a conventional transistor, respectively.
Figure 20B:
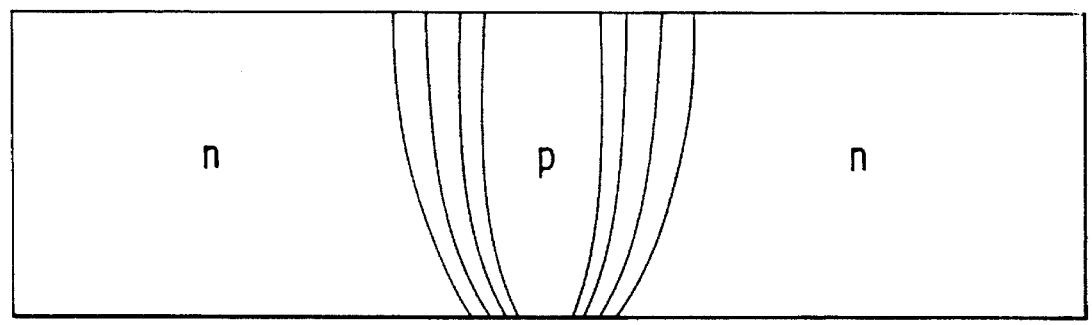

In this embodiment, since the bipolar transistor is horizontally formed on the SOI substrate, all the diffusion layers of the emitter, base, and collector can be formed on the uppermost surface layer of the substrate. Hence, heavily doped layers for connecting electrodes become unnecessary, and parasitic resistance and parasitic capacitance generated by the heavily doped layers can be decreased. Since the base region is formed by selective growth of silicon, it can be formed as a region having a small thickness which is about the same as that of the vertical transistor. Furthermore, as shown in FIG. 20A, the equi-concentration lines of the impurity concentration in the base region 409 extend linearly to be parallel to the pn junction. In other words, the thickness of the base layer in a direction perpendicular to the pn junction becomes uniform. This is because the base region 409 is formed by diffusing boron from the silicon film filled in the trench 408 into the Si layer 403 in the two directions. From the above effects, a high-speed, high-performance bipolar integrated circuit can be obtained.

Embodiment 12

According to this embodiment, a base electrode is formed only on a side wall film not to be present on a collector layer, thereby realizing an ideal lateral bipolar transistor structure having a small parasitic capacitance. FIGS. 21A to 21O are sectional views showing the manufacturing steps of a bipolar transistor according to the twelfth embodiment of the present invention.

As shown in FIG. 21A, a substrate wherein an oxide film 503 is formed on a silicon substrate 501 doped with an n-type impurity, e.g., phosphorus, to about $2 \times 10^{16}$ /cm$^3$, to have a thickness of about 1 μm by thermal oxidation or the like, and a substrate wherein an oxide film 504 is formed on a silicon substrate 502 are prepared.

As shown in FIG. 21B, these two substrates are adhered and annealed in a nitrogen atmosphere at 1,200° C. for about 300 minutes. Subsequently, the silicon substrate 501 is polished by, e.g., a polishing machine to a thickness of several hundred nm, thereby completing an SOI substrate.

As shown in FIG. 21C, portions of the SOI substrate other than the prospective element region are removed in accordance with known photolithography and anisotropic dry etching using chlorine gas or the like.

Figure 21D:
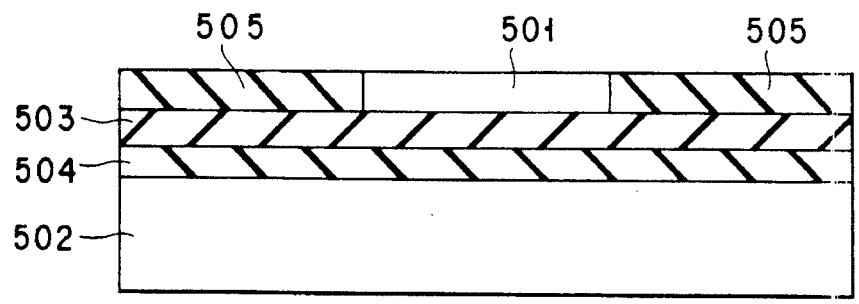
FIGS. 21A to 21O are sectional views sequentially showing the manufacturing steps of a bipolar transistor according to the twelfth embodiment of the present invention.

As shown in FIG. 21D, an oxide film 505 is formed on the entire surface by, e.g., chemical vapor deposition, and planarization.

Figure 21E:
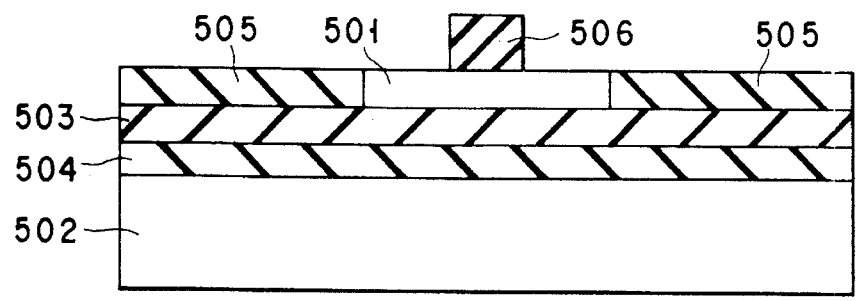
Figure 22A:
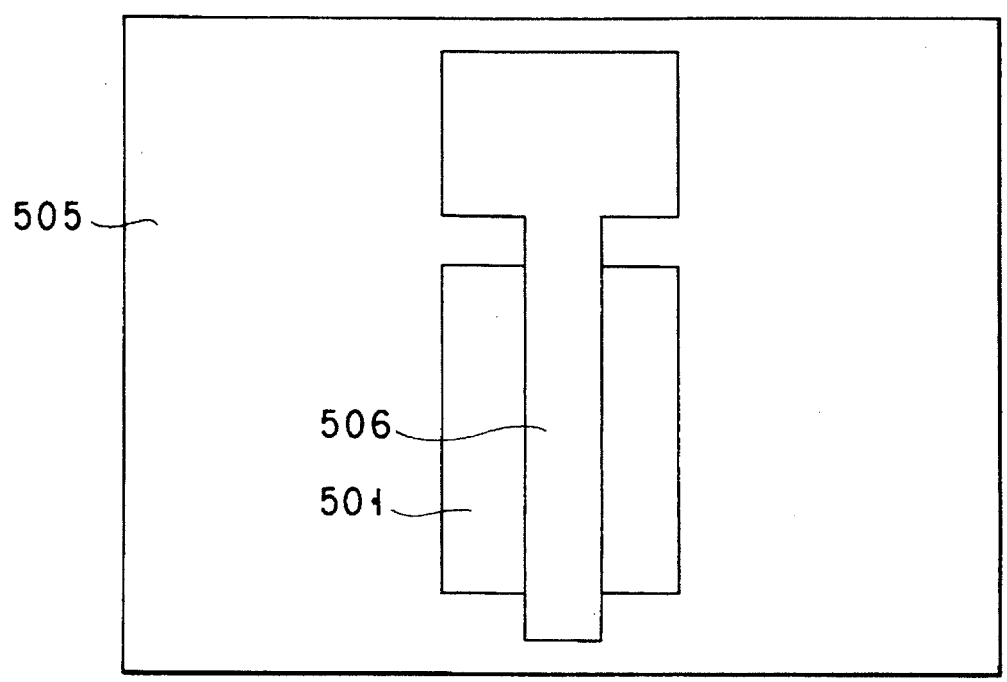
FIGS. 22A to 22E are plan views sequentially showing the manufacturing steps of the twelfth embodiment.

As shown in FIG. 21E, an oxide film 506 is formed on a desired region by employing known chemical vapor deposition, photolithography, and anisotropic dry etching. At this time, the field film 506 has a layout as shown in FIG. 22A in order to obtain wiring metal contact with a base electrode.

Figure 21F:
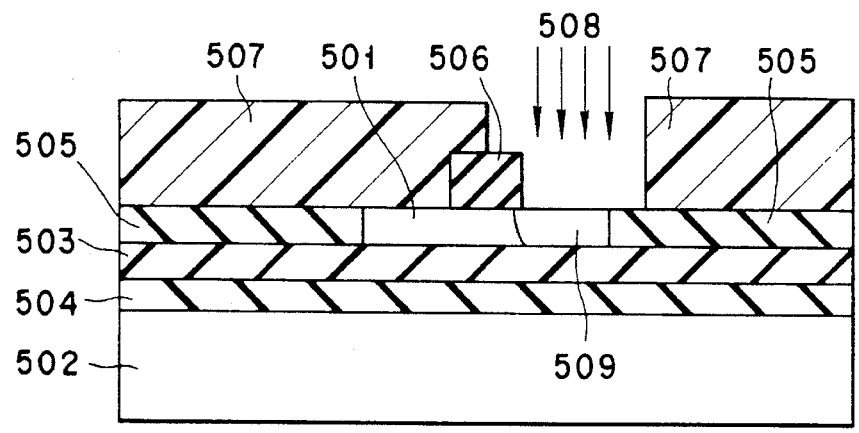
Figure 21G:
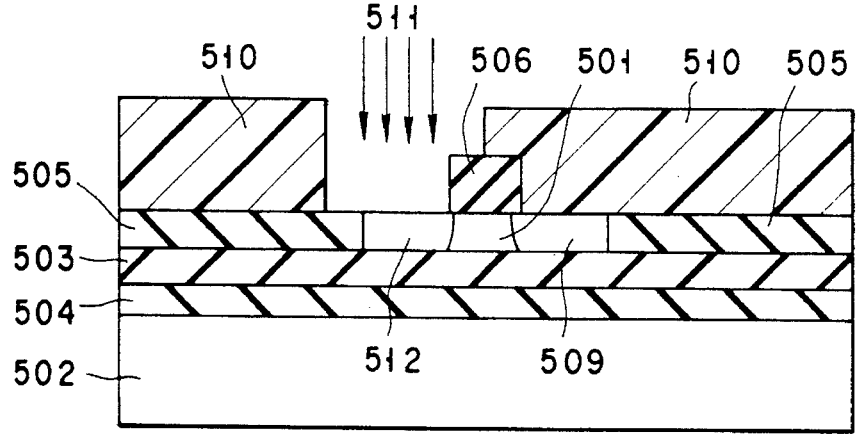

As shown in FIG. 21F, masking is performed with a resist 507, and n-type impurity 508, e.g., phosphorus or arsenic, is implanted by ion implantation, thereby forming an n$^+$-diffusion layer 509. Similarly, as shown in FIG. 21G, masking is performed with a resist 510, and a p-type impurity 511, e.g., boron, is implanted by ion implantation, thereby forming a base diffusion layer 512.

Figure 21H:
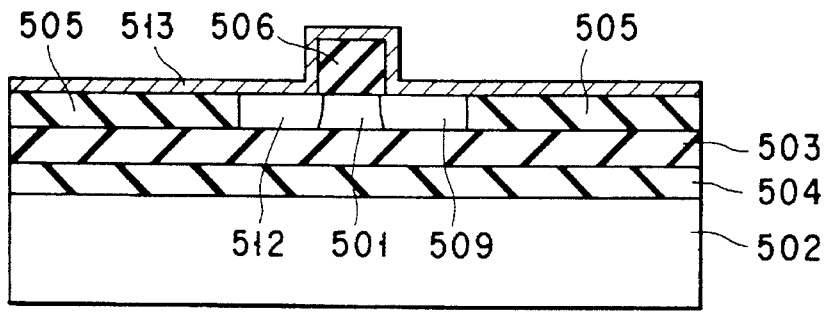
Figure 21I:
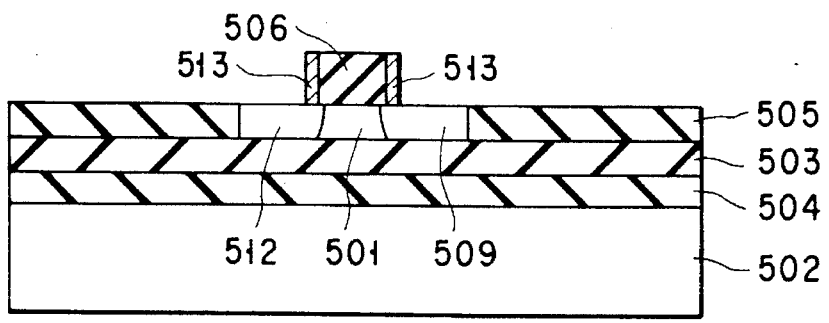
Figure 22B:
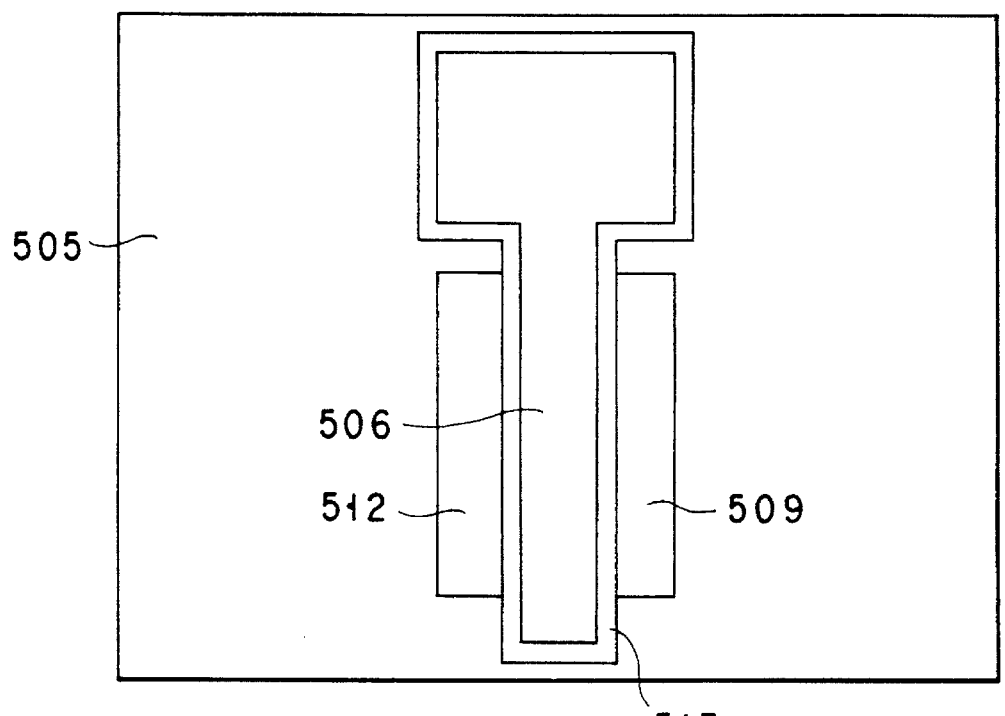

As shown in FIG. 21H, a metal (e.g., W or Ti) or metal silicide (e.g., TiSi$_2$) layer 513 is formed on the entire surface to have a thickness of about 50 nm by sputtering. Subsequently, as shown in FIG. 21I, anisotropic dry etching is preformed to leave the electrode 513 only on the side surface of the oxide film 506. FIG. 22B shows a plan view of this structure.

Figure 21J:
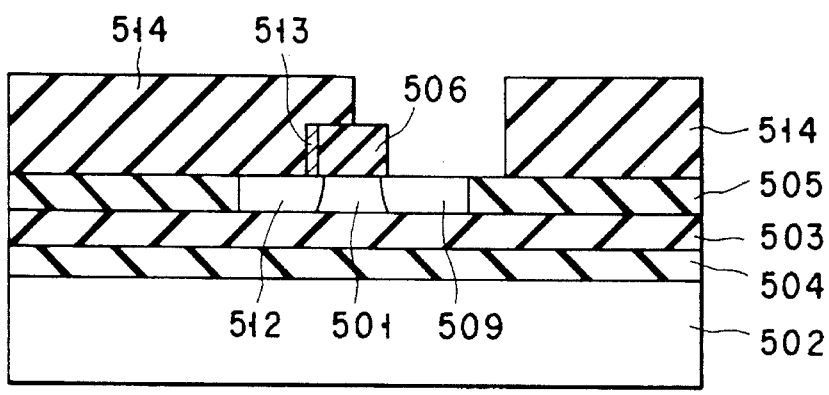
Figure 21K:
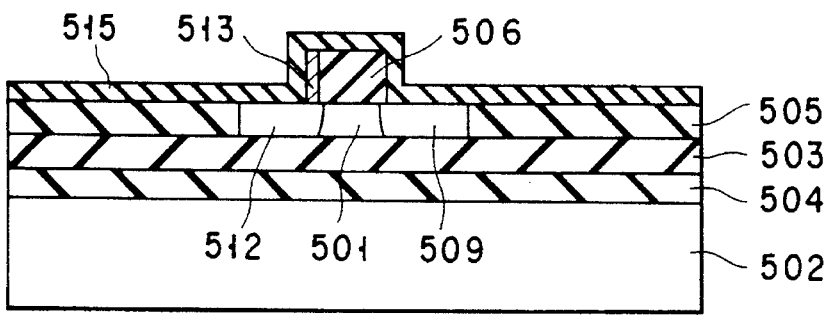
Figure 21L:
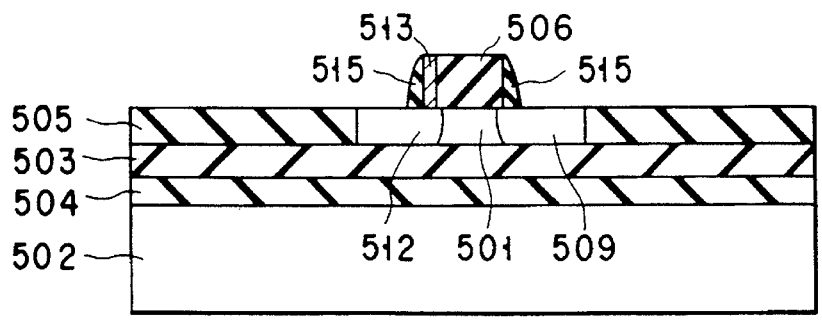
Figure 22C:
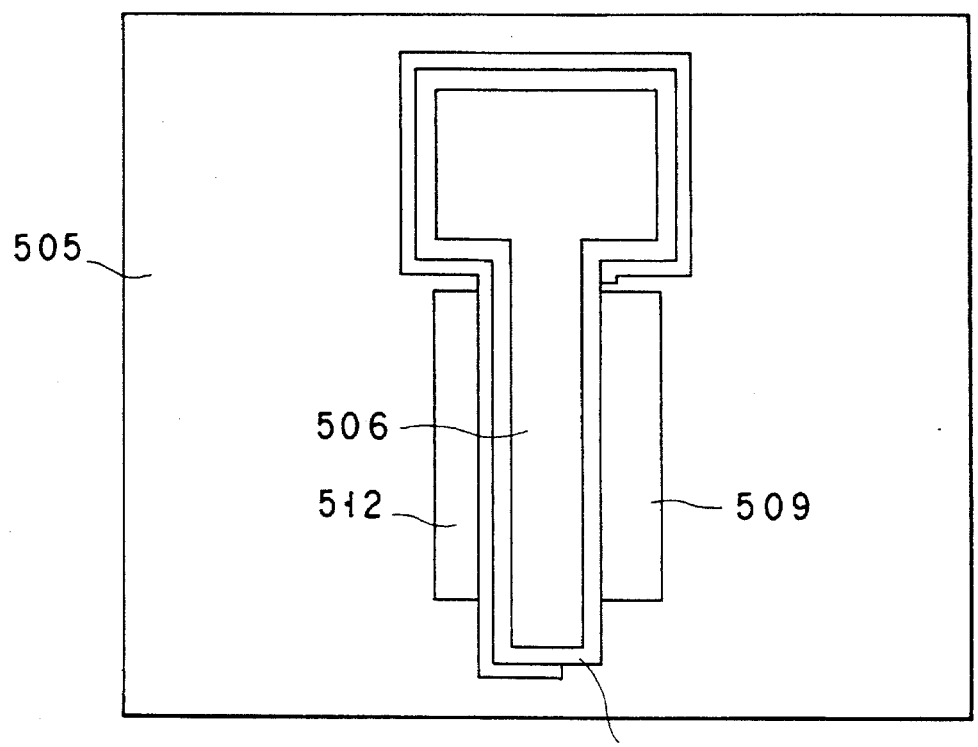

As shown in FIG. 21J, the side wall electrode 513 on the n$^+$-diffusion layer 509 is removed by using a mask member 514 constituted by, e.g., an oxide film. Furthermore, as shown in FIG. 21K, an insulating film 515 constituted by an oxide film or the like is formed on the entire surface, and anisotropic dry etching is performed, thereby leaving the side wall film 515, as shown in FIG. 21L. FIG. 22C shows a plan view of this structure.

Figure 21M:
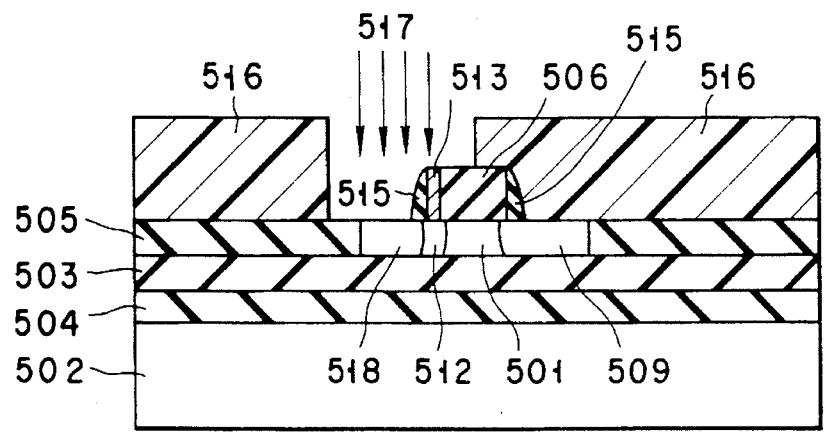
Figure 21N:
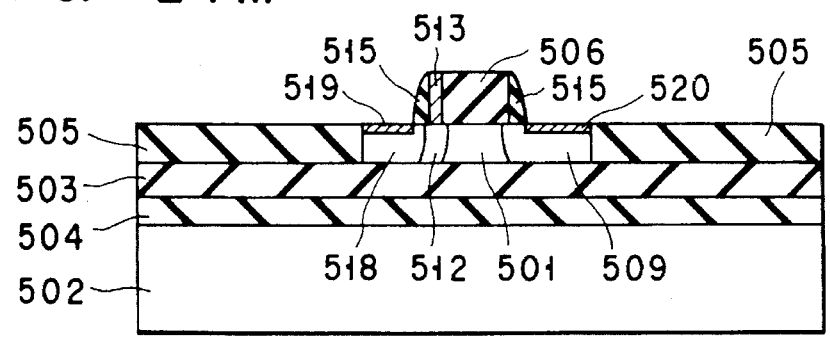
Figure 21O:
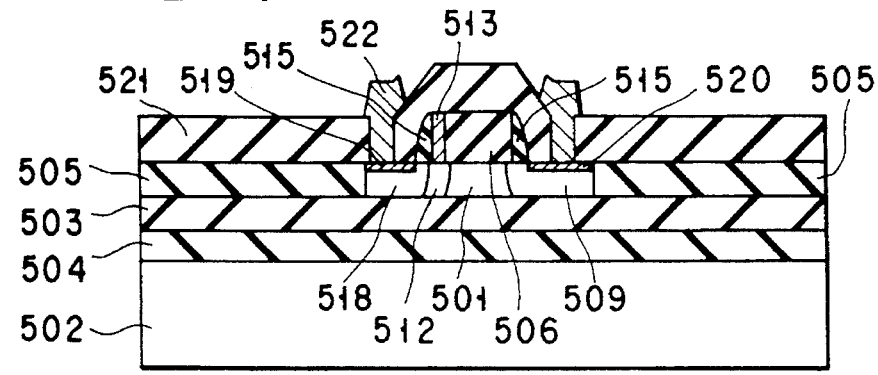
Figure 22D:
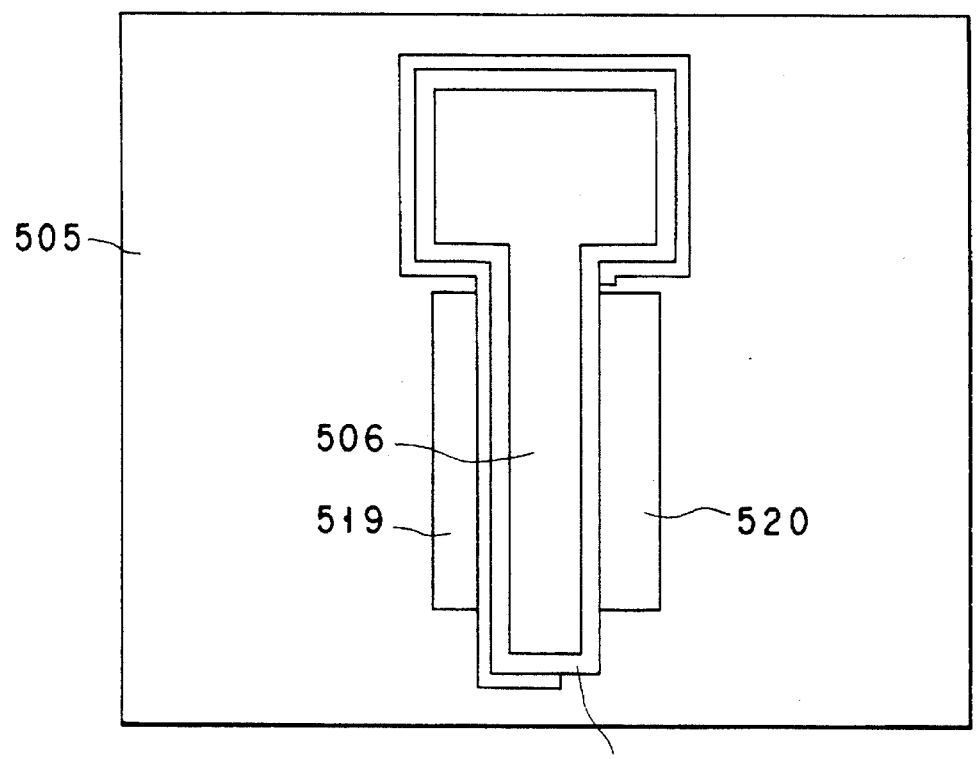
Figure 22E:
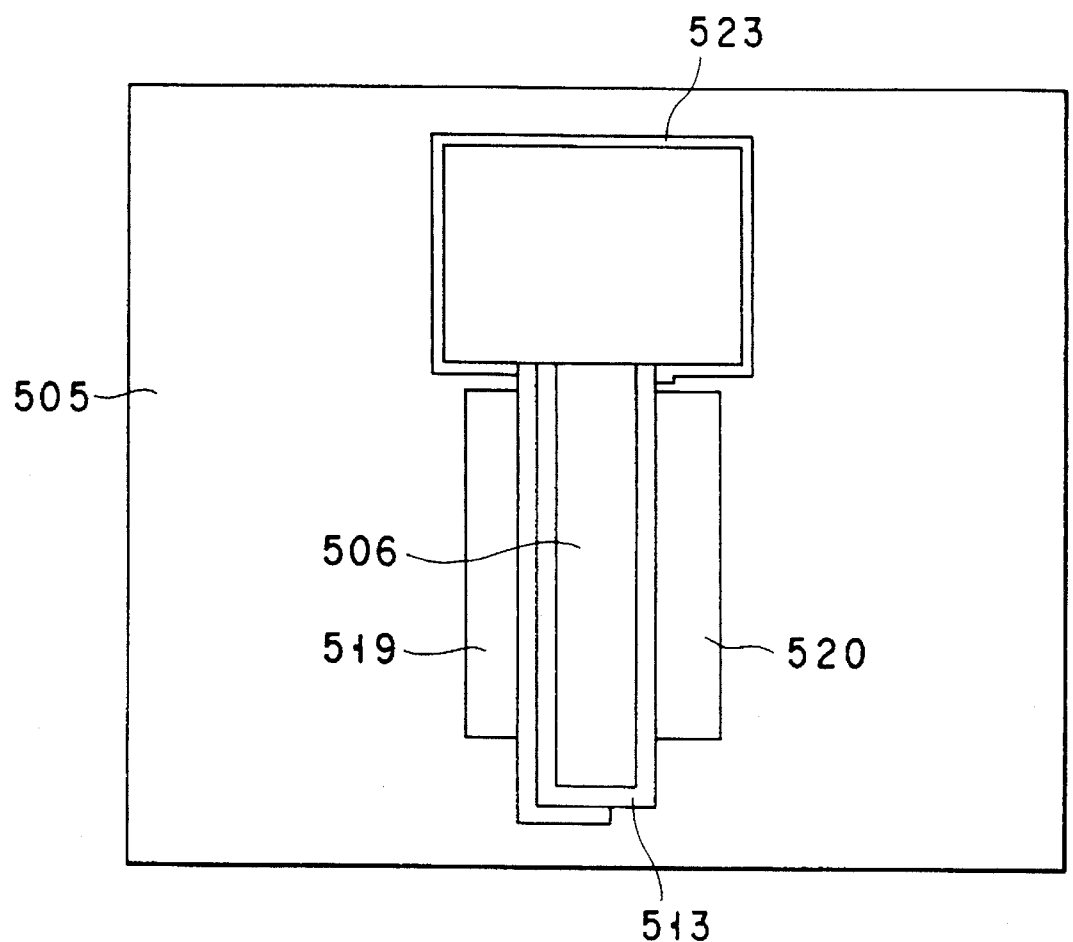

As shown in FIG. 21M, an impurity 517, e.g., arsenic, is added by ion implantation by using a resist 516 as a mask, thus forming an emitter diffusion layer 518. Then, as shown in FIG. 21N, silicide films 519 and 520 made of, e.g., NiSi or TiSi$_2$, are formed by a known salicide technique. FIG. 22D shows a plan view of this structure. As shown in FIG. 22E, a metal or metal silicide film 523 is selectively formed on a region where a contact of a base electrode and a wiring metal is to be formed.

Finally, as shown in FIG. 21O, an insulating film 521 is formed, contact holes are formed in the insulating film 521, and a wiring metal 522 is formed by patterning, thereby completing the structure.

Figure 23A:
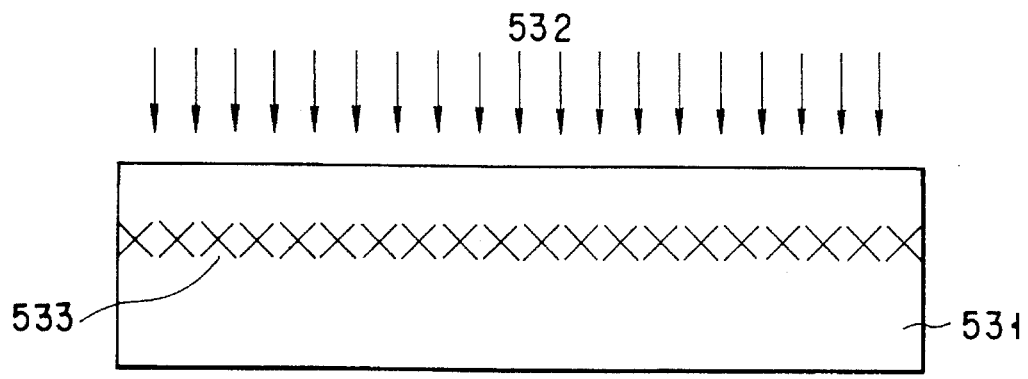
FIGS. 23A to 23D are sectional views sequentially showing a modification of the manufacturing steps of the twelfth embodiment.
Figure 23B:
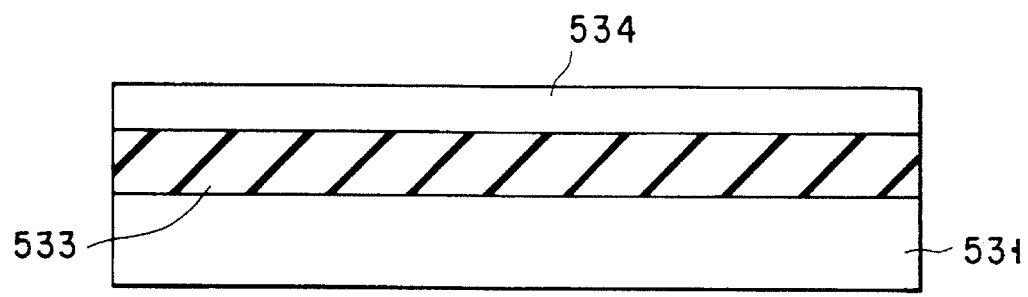
Figure 23C:
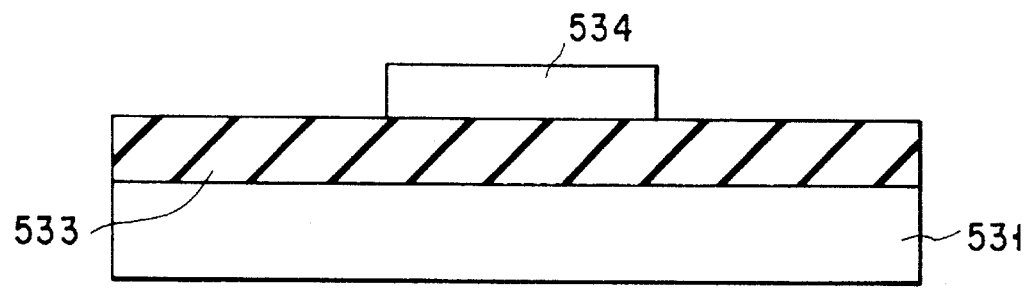
Figure 23D:
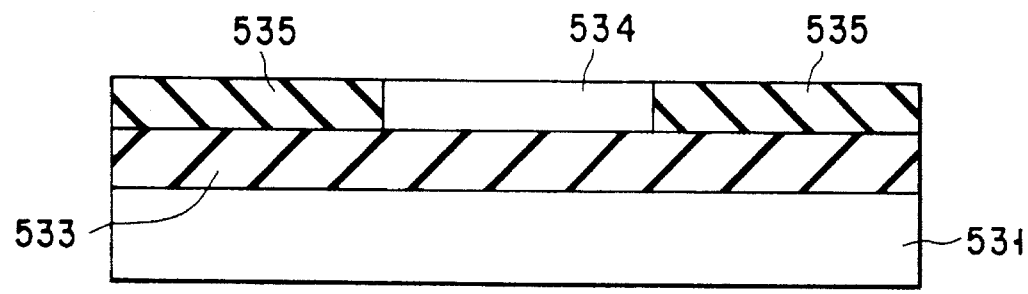

The method of forming the SOI structure shown in FIG. 21B is not limited to this embodiment. For example, as shown in FIGS. 23A to 23D, oxygen 532 may be ion-implanted in a silicon substrate 531 to form a layer 533 containing oxygen and silicon. The substrate may then be annealed at a high temperature of 1,200° C., thereby forming the silicon oxide film 533. Referring to FIG. 23D, reference numerals 534 and 535 denote a silicon layer and a silicon oxide film, respectively.

Alternatively, as shown in FIGS. 24A to 24D, an insulating film 542 may be formed on a silicon substrate 541. An opening may be formed in part of the insulating film 542. An amorphous silicon layer 543 may be formed on the insulating film 542 and solid-phase epitaxy may be performed by electron beam annealing, thereby obtaining a monocrystalline silicon layer 543a. Referring to FIG. 24D, reference numeral 544 denotes a silicon oxide film.

According to this embodiment, the parasitic capacitance between the base electrode and the collector layer can be greatly decreased, thereby realizing a high-speed, high-integration bipolar transistor.

Embodiment 13

FIGS. 25 to 27 are sectional views showing the schematic arrangement of a bipolar transistor according to the thirteenth embodiment of the present invention.

Conventionally, when an upper structure of an element having a vertical structure is formed on an SOI substrate, the electric field is shielded by a p-layer formed between the emitter and the collector. Then, the electric field does not reach the p-base layer, and thus a high-speed element cannot be formed. When the p-layer formed between the emitter and the collector is removed, the electric field acts only on the collector side of the p-base layer to decrease the punch-through breakdown voltage. Hence, an electric field must act on the p-base layer from below without forming a $p^+$-layer. In this embodiment, this problem is solved by forming an n-offset layer, a p-base layer, and an n-emitter layer by epitaxial growth.

As shown in FIG. 25, an oxide film 602 is formed on a silicon substrate 601, and an n-silicon layer 603 is formed on the oxide film 602. An n-layer 604, a p-base layer 605, and an n-emitter layer 606 are selectively formed on the surface of the n-silicon (offset) layer 603 by epitaxial growth. An $n^+$-collector layer 607 is formed from the surface of the n-silicon layer 603. A $p^+$-layer 608 is formed by oblique implantation from the upper left so as to contact the p-base layer 605. The remaining portion of the n-layer 604 serves as an offset layer 609. An emitter electrode 610, a base electrode 611, and a collector electrode 612 are formed to be respectively connected to the n-emitter layer 606, the $p^+$-layer 608, and the $n^+$-collector layer 607.

In this embodiment, since the element portion and the substrate are insulated by the oxide film, the parasitic capacitance can be greatly decreased. Since the p-base layer 605 is formed by epitaxial growth, it can be formed thin, thereby providing a high-speed element.

FIG. 26 is a view showing a modification of this embodiment. In this modification, a p-base layer 661 and an n-emitter layer 662 are formed by diffusion in place of by epitaxial growth. An insulating film 663 is formed between the emitter electrode and the collector electrode by LOCOS not to reach the oxide film on the lower surface of the substrate, so that punch-through in the p-base is prevented. Then, the same effect as the above embodiment can be expected by performing diffusion in place of by epitaxial growth.

FIG. 27 is a view showing another modification. In this modification, in addition to the modification of FIG. 26, an insulating film 664 is formed between the emitter electrode and the base electrode by LOCOS. Then, the parasitic capacitance between the emitter electrode and the p-layer 608 can be decreased, thereby providing a high-speed element.

In this manner, according to this embodiment, the parasitic capacitance can be decreased, and a high-speed bipolar transistor can be provided.

Embodiment 14

This embodiment relates to a complimentary vertical bipolar transistor. In this transistor, in addition to conventional lateral insulating film isolation obtained by trench element isolation, the transistor elements and the substrate are also isolated by insulating films and by using an SOI substrate. FIGS. 28A to 28F are sectional views sequentially showing the manufacturing steps of a complimentary vertical bipolar transistor according to the fourteenth embodiment of the present invention.

Figure 28A:
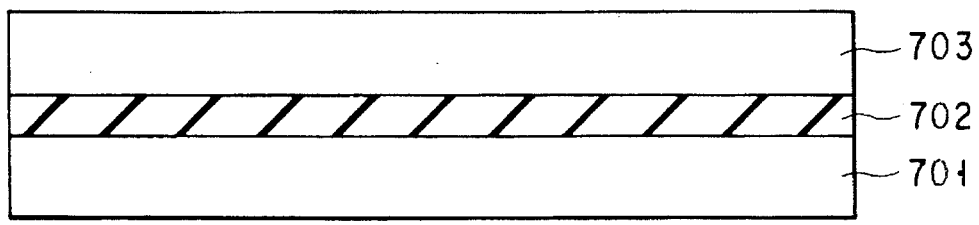
Figure 28B:
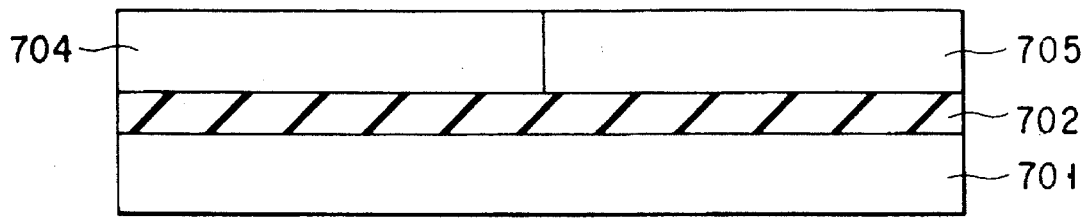

As shown in FIG. 28A, an n-type Si layer 703 is used as the SOI substrate. Reference numeral 701 denotes a support substrate; and 702, an oxide film. As shown in FIG. 28B, an $n^+$ buried layer 704 and a $p^+$ buried layer 705 are formed in npn and pnp transistor regions, respectively. The specific resistances of the respective layers 704 and 705 are set to 50 Ω·cm or less.

Figure 28C:
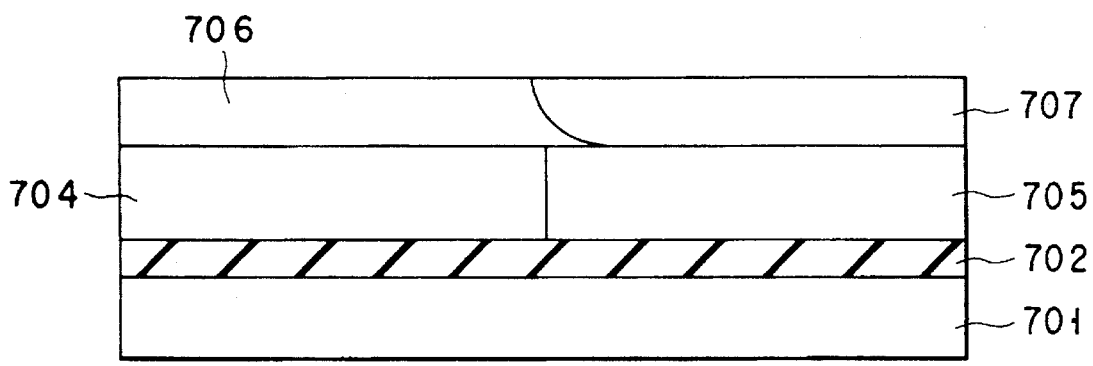

As shown in FIG. 28C, an epitaxial layer 706 as an n-type comparatively lightly doped layer (~$1\times10^{16}$ cm$^{-3}$) is formed by vapor deposition to have a thickness of about 1.0 µm. Subsequently, boron (B) is ion-implanted in the pnp transistor region, and annealing is performed, thereby inverting part of the n-layer 706 to a p-layer 707 (~$5\times10^{16}$ cm$^{-3}$).

Figure 28D:
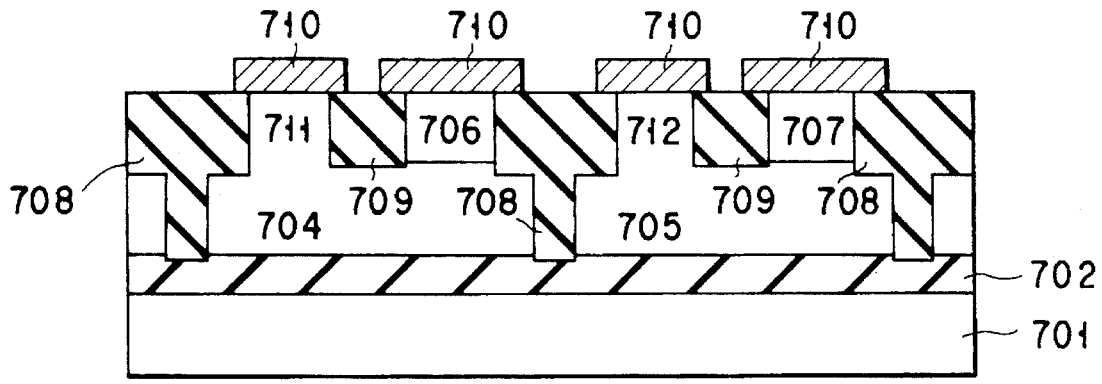

As shown in FIG. 28D, a trench region 708 is formed as an element isolation region by using a trench technique and an oxide film selective burying technique, and an insulating oxide film 709 is formed in an interelectrode isolation region that isolates an intrinsic element region and a collector contact portion. Subsequently, a polycrystalline silicon film 710 is formed as a first conductor on the entire surface of the substrate to have a thickness of about 300 nm and is left on the collector contact portion and the intrinsic element region. Thereafter, phosphorus and boron are ion-implanted in the collector contact portions of the npn and pnp transistors, respectively, thereby forming heavily doped collector contact regions 711 and 712.

As shown in FIG. 28E, boron and arsenic are ion-implanted in the npn and pnp transistor portions, respectively, of the silicon film 710 both at 50 keV to about $1\times10^{16}$ cm$^{-2}$. Subsequently, a CVD silicon oxide film 713 is formed as a second insulating film on the entire surface to have a thickness of about 300 nm. Thereafter, the first CVD oxide film and the first conductor film on the intrinsic regions of the npn and pnp transistors, respectively, are removed by using photolithography and etching until the substrate is exposed, thereby forming openings 714 and 715 having an opening width of about 1 µm.

Subsequently, an oxide film 716 is formed as a third insulating film on portions of the substrate exposed in the openings and on the first conductors by hydrogen burning oxidation at about 850° C. Simultaneously, boron and arsenic doped in the first conductors are diffused into the substrate, thus forming external base layers 717 and 718 of the npn and pnp transistors, respectively.

As shown in FIG. 28F, boron and arsenic are implanted in the npn and pnp regions, respectively, to form intrinsic base layers 721 and 722 each having an impurity concentration of $3\times10^{18}$ cm$^{-3}$ and a thickness of about 100 nm. Oxide films each having a thickness of about 200 nm are left as fourth insulating films in the openings to form side walls 719 and 720 while exposing silicon in the openings. Thereafter, a polysilicon film 723 is formed as a second conductor on the entire surface to have a thickness of about 300 nm. Boron and arsenic are heavily doped respectively in the pnp and npn transistor regions. Required annealing is performed to diffuse arsenic and boron doped in polysilicon serving as the second conductor into the epitaxial layer to form emitter regions 724 and 725.

Thereafter, an aluminum film is formed on the entire surface of the substrate, and electrode wiring is formed by using photolithography and etching, thus completing a bipolar transistor.

As described above, according to this embodiment, since the substrate and the transistor elements are isolated through the insulating films by using the SOI substrate, in a complimentary vertical bipolar transistor, diffusion layers which are necessary in conventional pn isolation to isolate the collector and the substrate become unnecessary, and the parasitic capacitance can be accordingly decreased. Since the isolation scheme is shifted from conventional depletion layer isolation to insulating film isolation achieved by the oxide films, when the thickness of the oxide films is set to 1.0 μm or more, the collector-substrate capacitance in the npn and pnp transistor regions can be set to half or less the conventional value. Since isolation is obtained in both the lateral and vertical directions by the insulating films, a completely latch-up free circuit can be constituted unlike in the case of a pn junction. From the above effects, a high-speed, high-performance bipolar integrated circuit can be obtained.

Embodiment 15

This embodiment relates to a semiconductor device in which bipolar and MOS transistors coexist.

FIG. 29A is a sectional view showing the schematic arrangement of a semiconductor device according to the fifteenth embodiment of the present invention. FIG. 29B is a conceptional view of this embodiment. As shown in FIG. 29B, first conductivity type regions 821 and 823 having two different impurity concentrations sandwich a region 822 which has a conductivity type different from that of the first conductivity type regions 821 and 823. When this transistor is to operate as a bipolar transistor, the region 822 functions as a base region. When this transistor is to operate as a MOS transistor, the region 822 functions as a channel region.

Therefore, one element has functions of an npn bipolar transistor and an NMOS transistor, or functions of a pnp bipolar transistor and a PMOS transistor. A bipolar operation and a MOS operation can be selectively performed as required. Referring to FIG. 29B, reference symbol E denotes an emitter electrode; B, a base electrode; C, a collector electrode; S, a source electrode; G, a gate electrode; and D, a drain electrode.

Figure 30A:
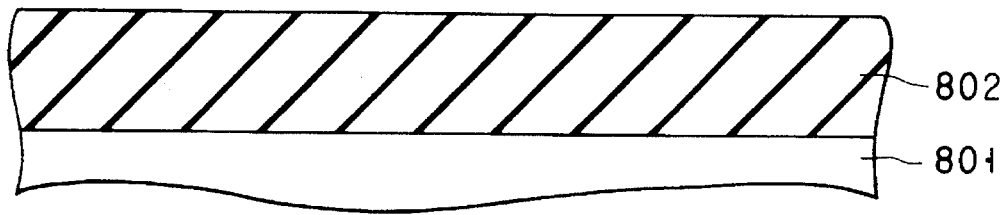
FIGS. 30A to 30G are sectional views sequentially showing the manufacturing steps of the fifteenth embodiment.
Figure 30B:
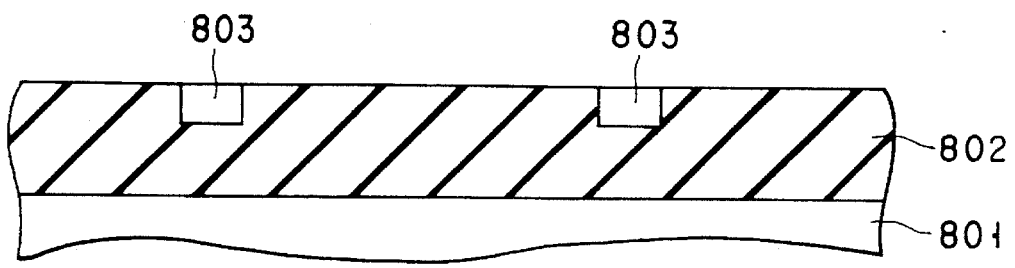

The manufacturing steps of the semiconductor device according to this embodiment will be described with reference to FIGS. 30A to 30G. As shown in FIG. 30A, a thick oxide film 802 is formed on a silicon substrate 801. As shown in FIG. 30B, predetermined patterning is performed to form grooves in the oxide film 802. Polycrystalline silicon films 803 are buried in the grooves, and planarization is performed. The buried polycrystalline silicon films 803 serve as the base electrodes. Accordingly, in the case of an npn bipolar transistor, doping is performed with a p-type impurity, and in the case of a pnp bipolar transistor, doping is performed with an n-type impurity.

Figure 30C:
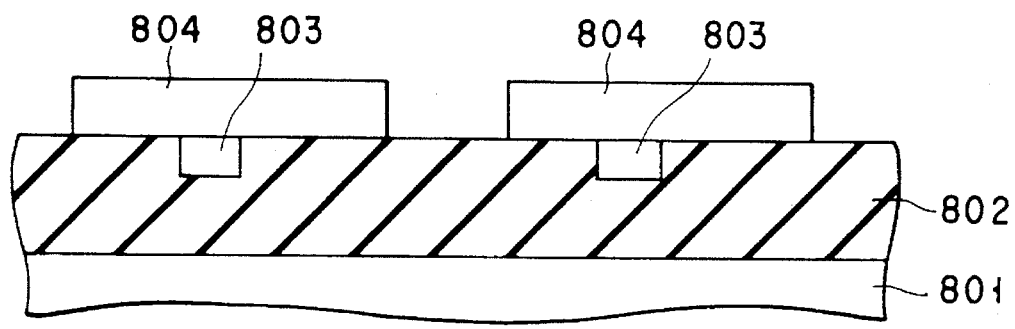

Subsequently, as shown in FIG. 30C, a monocrystalline silicon film 804 having a predetermined thickness is formed on the entire surface in accordance with an SOI technique and patterned to have necessary transistor shapes. At this time, part of the base electrodes must be located under the patterned transistors.

Figure 30D:
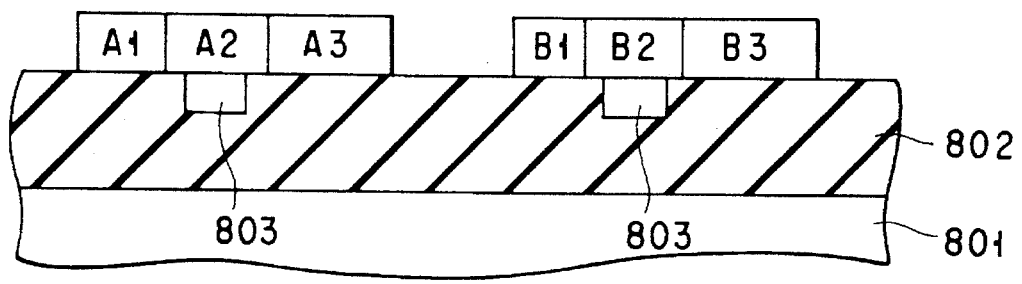

As shown in FIG. 30D, assuming that an element A is an npn bipolar transistor and an element B is a pnp bipolar transistor, doping is performed with n- and p-type impurities as required to form bipolar transistors shown in FIG. 30D.

An example of the impurity doping method will be described. An n-type impurity is ion-implanted in the entire surface to about $1\times10^{17}$ cm$^{-3}$. Thereafter, a p-type impurity is ion-implanted to about $1\times10^{18}$ cm$^{-3}$ by masking regions A3 and B2. Thereafter, an n-type impurity is ion-implanted only in a region A1 to about $1\times10^{20}$ cm$^{-3}$. In this manner, two elements are formed as npn and pnp bipolar transistors.

Figure 30E:
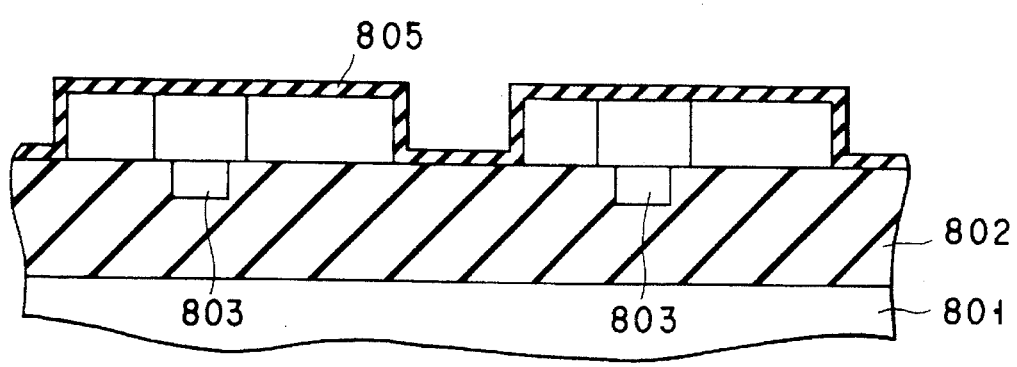
Figure 30F:
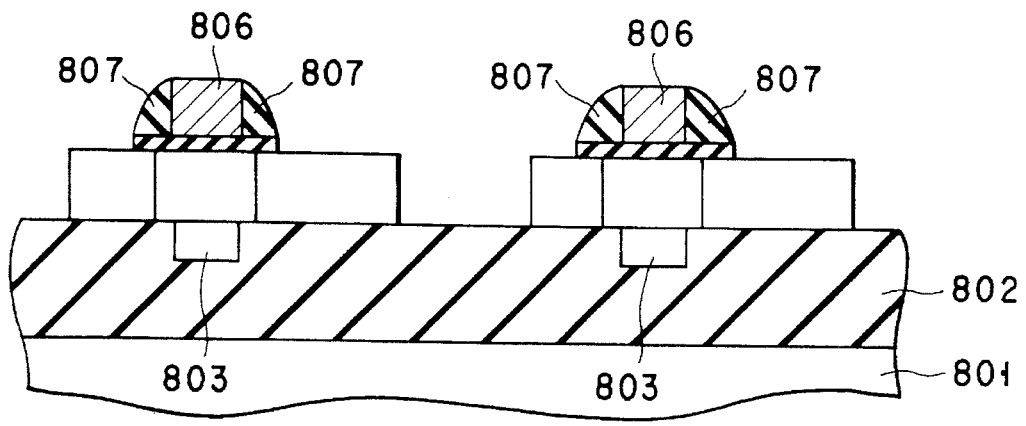

As shown in FIG. 30E, the entire surface is oxidized for a predetermined thickness to form an oxide film 805. This oxide film 805 serves as a prospective gate oxide film. As shown in FIG. 30F, a polycrystalline silicon film 806 is formed on the entire surface and set to an n-type film by diffusing, e.g., phosphorus. Alternatively, n-type polycrystalline silicon may be deposited, as a matter of course. Thereafter, patterning is performed to leave polycrystalline silicon on only the base regions of the bipolar transistors, i.e., on the p-region of the element A and the n-region of the element B. These polycrystalline silicon films serve as prospective gate electrodes. Subsequently, a nitride film 807 is formed on the entire surface and anisotropic etching is performed, thereby forming side walls on the side wall portions of the gate electrodes.

Figure 30G:
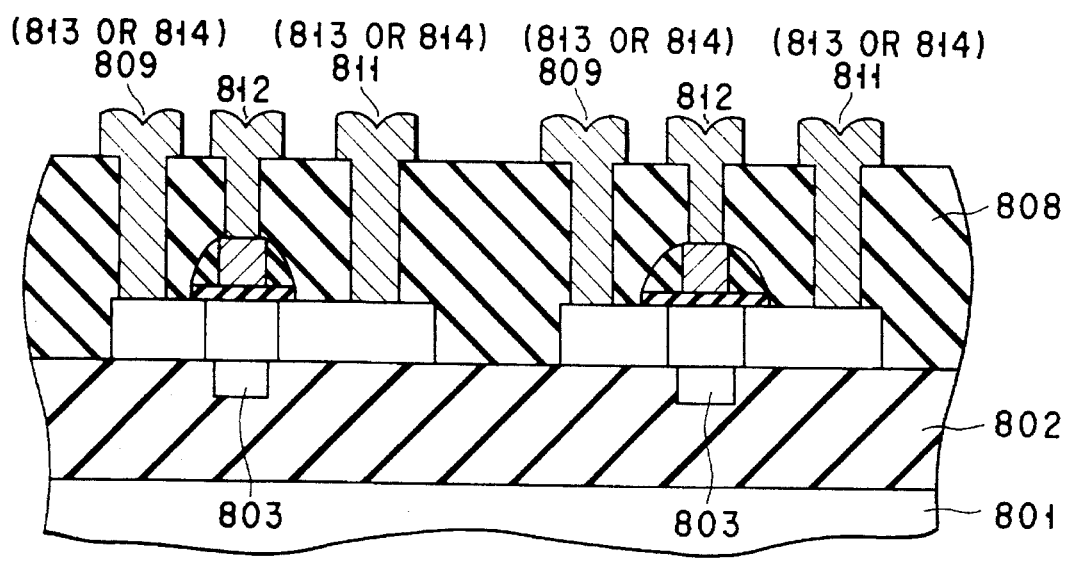

As shown in FIG. 30G, an interlayer insulating film 808 is deposited in accordance with the conventional technique, contact holes are formed, and metal electrodes are formed, thereby forming emitter electrodes 809, base electrodes 810 (refer to FIG. 31), collector electrodes 811, and gate electrodes 812 of the bipolar transistors. As is apparent from FIG. 30G, when these elements are to perform a MOS operation, the emitter electrodes 809 and the collector electrodes 811 correspond to source electrodes 813 or drain electrodes 814.

FIG. 31 shows a plan view of the last step. FIGS. 32A and 32B show inverter circuits using this embodiment.

According to this embodiment described above, the complexity in the manufacturing steps that poses a problem in a conventional BiCMOS or C-BiCMOS transistor in which a bipolar transistor and a MOS transistor coexist can be improved, and the number of manufacturing steps can be decreased. As a result, cost reduction and an improvement in reliability are enabled. Since one element can be used selectively to perform bipolar and MOS operations, the degree of freedom in circuit design is increased.

Embodiment 16

This embodiment provides, in a lateral bipolar transistor formed on an SOI substrate, a means for solving a problem that reverse injection of minority carriers from the base into the emitter largely interferes with an RF operation.

In the lateral bipolar transistor formed on the SOI substrate, oxygen or nitrogen is added to a portion of the emitter region that contacts the base region. Since the forbidden band of the emitter portion doped with oxygen or nitrogen becomes larger than the forbidden band of the base, reverse injection of minority carriers from the base to the emitter is suppressed to reduce the emitter accumulation time. As a result, RF characteristics are improved.

FIGS. 33A to 33H are sectional views sequentially showing the manufacturing steps of a bipolar transistor according to the sixteenth embodiment of the present invention. As shown in FIG. 33A, an n-Si layer 902 on an SiO$_2$ layer 901 is isolated in accordance with LOCOS, a p-polysilicon film 904 serving as a base electrode is formed on an SiO$_2$ film 903 on the n-Si layer 902, and the base electrode is patterned.

As shown in FIG. 33B, the SiO$_2$ film 903 contacting one side surface of the electrode is removed by etching by using a photoresist film 906 and the polysilicon film 904 as masks. As shown in FIG. 33C, a p-polysilicon film is deposited on the entire surface of the wafer and etched back by RIE, thereby forming p-polysilicon side walls 907 and 908 contacting the n-Si layer 902. Then, as shown in FIG. 33D, boron is added to the Si layer by ion implantation to form a p-region 909.

As shown in FIG. 33E, an SiO$_2$ film is deposited on the entire surface of the wafer by CVD and etched back by RIE, thereby forming SiO$_2$ side walls 910 and 911. At this time, portions of the SiO$_2$ film 903 not corresponding to the base-connecting polysilicon film 904 and the side walls 908 and 911 are also removed by etching.

As shown in FIG. 33F, arsenic is added by ion implantation by using the polysilicon films 904, 907, and 908, and the SiO$_2$ films 910 and 911 as masks, thereby forming an n-region 912 serving as an emitter and an n-region 913 serving as a collector. At this time, since the free path and the diffusion constant of boron are larger than those of arsenic, the thin p-region 909 remains next to the n-region 912. A typical p-region 909 has a thickness of about 60 nm. The width of the polysilicon film 904 serving as a base electrode is set to about 0.5 μm.

As shown in FIG. 33G, portions of the substrate other than the emitter/base junction are covered with a photoresist film 933, and nitrogen is implanted in a region 934 having a thickness of about 0.15 μm on the emitter side of the emitter/base junction to about $1 \times 10^{21}$ cm$^{-3}$. The resultant structure is annealed at 1,000° C. for 10 seconds.

As shown in FIG. 33H, the entire surface of the substrate is covered with an insulating film 917, contact holes are formed in the insulating film 917, and electrodes 914 and 916 are connected to the emitter and collector regions 912 and 913, respectively. In the lateral transistor formed in this manner, the emitter accumulation time is effectively decreased, and the cut-off frequency is increased to 65 GHz, thereby largely improving the performance of the bipolar transistor formed on the SOI substrate.

Figure 34:
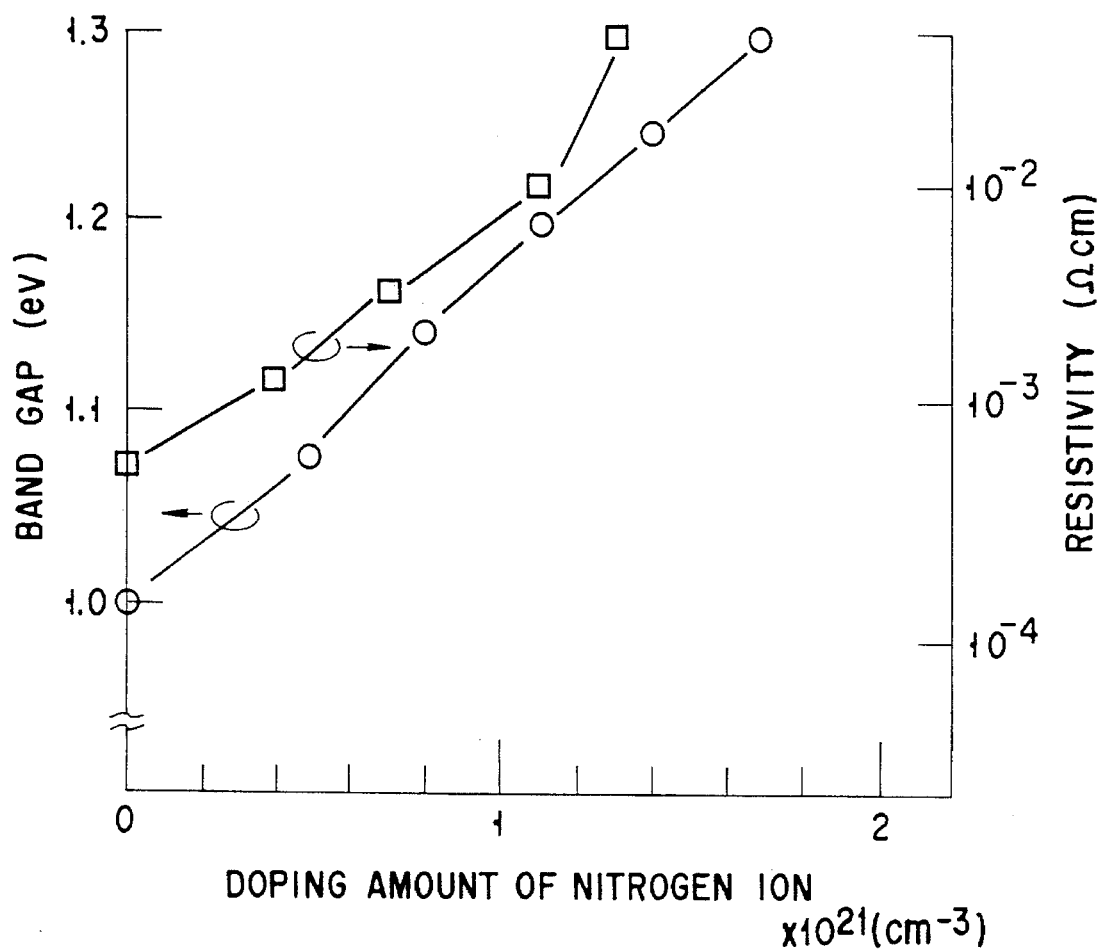
FIG. 34 is a graph showing the characteristics of the sixteenth embodiment.

FIG. 34 shows the relationship among the doping amount of nitrogen, the forbidden band width or band gap of silicon, and the resistivity of a wafer processed in the same manner as described above. Since silicon not containing nitrogen contains arsenic at a high concentration, the band gap is 1.0 eV due to the band gap narrowing effect. This band gap narrowing effect of the emitter is a factor that promotes reverse injection of minority carriers into the emitter in the conventional technique.

When nitrogen is added, the band gap increases, and reaches 1.2 eV at a doping amount of $1 \times 10^{21}$ cm$^{-3}$. At this time, the resistivity also increases, and becomes 0.01 Ω·cm at a nitrogen concentration of $1 \times 10^{21}$ cm$^{-3}$. Due to the broadening of the band gap, the reverse injection amount of minority carriers into the emitter becomes about 1/2,000 that obtained when nitrogen doping is not performed, and thus the emitter accumulation time is decreased to a negligible level. Since nitrogen is added only to the region 934 in the vicinity of the emitter/base interface, adverse effects such as an increase in emitter contact resistance and emitter resistance can be avoided.

According to this embodiment, the emitter accumulation time which limits the RF characteristics of the lateral bipolar transistor on the SOI substrate is decreased to a substantially negligible level, thus greatly contributing to improvement of the performance. Since this embodiment can be achieved only by adding one ion implantation step, an increase in cost can be minimized. This embodiment exemplifies a case wherein the band gap is broadened by adding nitrogen to silicon. However, the effect of the present invention can similarly be obtained if a dopant, e.g., oxygen, having a similar function is used.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A bipolar transistor comprising:

a substrate having an insulating main surface;

a semiconductor layer arranged on said main surface and having an end face which forms an angle with respect to said main surface;

a side contact layer arranged on said end face;

a first region of a first conductivity type which is formed in said semiconductor layer;

a second region of a second conductivity type which is formed by diffusing a first impurity into said semiconductor layer through said end face from said side contact layer used as a solid-phase diffusion source of said first impurity, said second region contacting said first region, being unexposed to said end face, and having an impurity concentration which is substantially uniform in a direction parallel to said end face;

a third region of the first conductivity type which is formed by diffusing second impurity into said semiconductor layer through said end face from said side contact layer used as a solid phase diffusion source of said second impurity, said third region being in contact with said second region, being exposed to said end face, and having an impurity concentration which is substantially uniform in a direction parallel to said end face; and first, second, and third electrodes respectively connected to said first and second regions, and to said third region through said side contact layer.

2. The transistor according to claim 1, wherein said substrate comprises a semiconductor layer and an insulating layer arranged thereon, said main surface being defined by said insulating layer.

3. The transistor according to claim 2, wherein said contact layer comprises a first portion formed on said end face and a second portion formed on said first portion, said first and second portions being used as said solid-phase diffusion sources of said first and second impurities, respectively.

4. The transistor according to claim 1, further comprising a contact region of the first conductivity type which is formed in said semiconductor layer to contact said first region, and an upper contact layer consisting of a semiconductor of the second conductivity type which is formed on said semiconductor layer to contact said second region, said first and second regions being respectively connected to said first and second electrodes through said contact region and said upper contact layer, wherein said side contact layer comprises a semiconductor layer of the first conductivity type which is formed on said main surface.

5. The transistor according to claim 1, wherein said end face substantially forms a right angle with respect to said main surface.

6. The transistor according to claim 1, wherein said first, second, and third regions respectively constitute a collector, a base, and an emitter of said transistor.

* * * * *